US008101479B2

(12) United States Patent
Parker et al.

(10) Patent No.: US 8,101,479 B2

(45) Date of Patent: Jan. 24, 2012

(54) FABRICATION OF ASYMMETRIC FIELD-EFFECT TRANSISTORS USING L-SHAPED SPACERS

(75) Inventors: D. Courtney Parker, Topsham, ME (US); Donald M. Archer, Santa Clara, CA (US); Sandeep R. Bahl, Palo Alto, CA (US); Constantin Bulucea, Sunnyvale, CA (US); William D. French, San Jose, CA (US); Peter B. Johnson, Sunnyvale, CA (US); Jeng-Jiun Yang, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 237 days.

(21) Appl. No.: 12/382,977

(22) Filed: Mar. 27, 2009

(65) Prior Publication Data

US 2010/0244106 A1 Sep. 30, 2010

(51) Int. Cl.
*H01L 21/336* (2006.01)

(52) U.S. Cl. .. 438/231; 438/286; 438/305; 257/E21.435

(58) Field of Classification Search .................. 438/197, 438/199, 230, 231, 286, 303, 305, 301; 257/E21.409, E21.435
See application file for complete search history.

(56) References Cited

U.S. PATENT DOCUMENTS 5,780,912 A 7/1998 Burr et al.
5,817,562 A 10/1998 Chang et al.
6,078,082 A 6/2000 Bulucea
6,127,700 A 10/2000 Bulucea
6,440,875 B1 8/2002 Chan et al.
6,548,842 B1 4/2003 Bulucea et al.
6,566,204 B1 5/2003 Wang et al.
6,664,156 B1 * 12/2003 Ang et al. ..................... 438/229
6,762,085 B2 7/2004 Zheng et al.
6,815,355 B2 11/2004 Quek
6,881,616 B1 * 4/2005 Hellig et al. ................. 438/181
6,924,180 B2 8/2005 Quek
7,145,203 B2 12/2006 Wang
7,220,650 B2 5/2007 Kao et al.
7,315,067 B2 1/2008 Wang
7,364,957 B2 * 4/2008 Thei et al. ..................... 438/197
7,397,084 B2 7/2008 Loechelt et al.
7,419,863 B1 9/2008 Bulucea (Continued)

OTHER PUBLICATIONS

Augendre et al., "Thin L-shaped spacers for CMOS", 33rd Eur. Solid-State Dev. Rsch. Conf., Sep. 16-18, 2003, pp. 219-222.

(Continued)

*Primary Examiner* — Tuan N. Quach
(74) *Attorney, Agent, or Firm* — Ronald J. Meetin

(57) ABSTRACT

A gate electrode (302) of a field-effect transistor (102) is defined above, and vertically separated by a gate dielectric layer (300) from, a channel-zone portion (284) of body material of a semiconductor body. Semiconductor dopant is introduced into the body material to define a more heavily doped pocket portion (290) using the gate electrode as a dopant-blocking shield. A spacer (304T) having a dielectric portion situated along the gate electrode, a dielectric portion situated along the body, and a filler portion (SC) largely occupying the space between the other two spacer portions is provided. Semiconductor dopant is introduced into the body to define a pair of source/drain portions (280M and 282M) using the gate electrode and spacer as a dopant-blocking shield. The filler spacer portion is removed to convert the spacer to an L shape (304). Electrical contacts (310 and 312) are formed respectively to the source/drain portions.

44 Claims, 28 Drawing Sheets

U.S. PATENT DOCUMENTS

| | | | | |
|---|---|---|---|---|
| 7,573,095 | B2 * | 8/2009 | Lee et al. | 257/326 |
| 7,642,574 | B2 | 1/2010 | Bulucea | |
| 7,936,042 | B2 * | 5/2011 | Kumar | 257/487 |
| 2007/0187795 | A1 | 8/2007 | Langguth et al. | |
| 2008/0308878 | A1 | 12/2008 | Bulucea | |
| 2008/0311717 | A1 | 12/2008 | Bulucea | |
| 2010/0244147 | A1 * | 9/2010 | Yang et al. | 257/408 |

OTHER PUBLICATIONS

Brisbin et al., "Hot-Carrier Reliability and Design of N-LDMOS Transistor Arrays", *2001 IEEE Intg. Reliability Workshop Final Report*, Oct. 15-18, 2001, pp. 44-48.

Brown et al., "Trends in Advanced Process Technology—Submicrometer CMOS Device Design and Process Requirements", *Procs. IEEE*, Dec. 1986, pp. 1678-1702.

Buti et al., "Asymmetrical Halo Source GOLD drain (HS-GOLD) Deep Sub-half n-Micron MOSFET Design for Reliability and Performance", *IEDM Tech. Dig.*, Dec. 3-6, 1989, pp. 26.2.1-26.2.4.

Chai et al., "A Cost-Effective 0.25 μm $L_{eff}$ BiCMOS Technology Featuring Graded-Channel CMOS (GCMOS) and a Quasi-Self Aligned (QSA) NPN for RF Wireless Applications", *Procs. 2000 Bipolar/BiCMOS Circs. and Tech. Meeting*, Sep. 24-26, 2000, pp. 110-113.

Choi et al., "Design and analysis of a new self-aligned asymmetric structure for deep sub-micrometer MOSFET", *Solid-State Electronics*, vol. 45, 2001, pp. 1673-1678.

Ma et al., "Graded-Channel MOSFET (GCMOSFET) for High Performance, Low Voltage DSP Applications", *IEEE Trans. VLSI Systs. Dig.*, Dec. 1997, pp. 352-358.

Rung et al., "A Retrograde p-Well for Higher Density CMOS", *IEEE Trans. Elec. Devs.*, Oct. 1981, pp. 1115-1119.

Smayling et al., "A Modular Merged Technology Process including Submicron CMOS Logic, Nonvolatile Memories, Linear Functions, and Power Components", *Procs. IEEE 1993 Custom Integrated Circuits Conf.*, May 9-12, 1993, pp. 24.5.1-24.5.4.

Su et al., "A High-Performance Scalable Submicron MOSFET for Mixed Analog/Digital Applications", *IEDM Tech. Dig.*, Dec. 1991, pp. 367-370.

Thompson et al., "MOS Scaling: Transistor Challenges for the 21st Century", *Intel Technology J.*, Q398, 1998, pp. 1-19.

Tsui et al., "A Versatile Half-Micron Complementary BiCMOS Technology for Microprocessor-Based Smart Power Applications", *IEEE Trans. Elec. Devs.*, Mar. 1995, pp. 564-570.

Wang et al., "Effect of Layout Orientation on the Performance and Reliability of High Voltage N-LDMOS in Standard Submicron Logic STI CMOS Process", *Procs. IEEE 43rd Ann. 2005 Int'l Reliability Phys. Symp.*, Apr. 17-21, 2005, pp. 654-655.

* cited by examiner

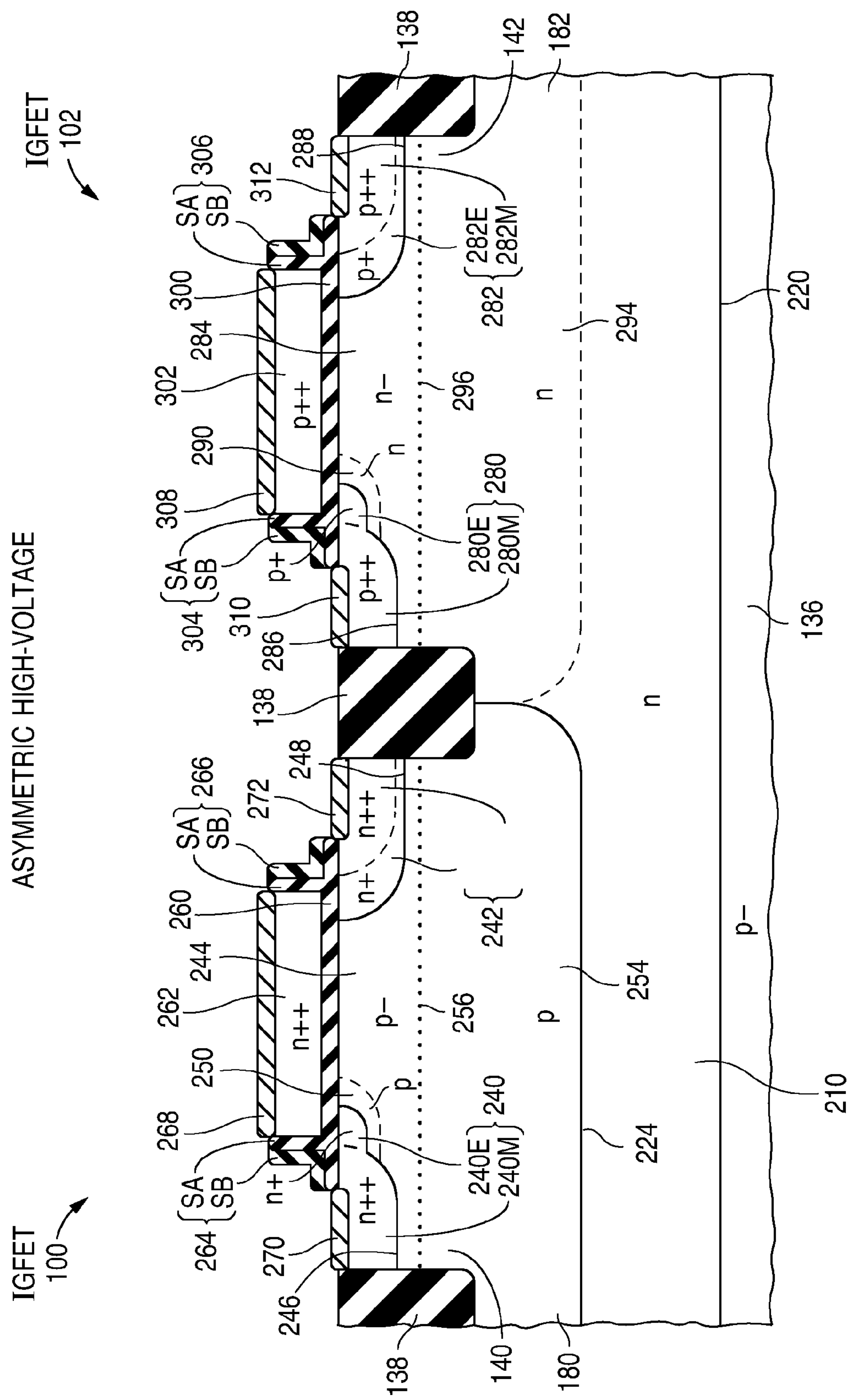
Fig. 11.1

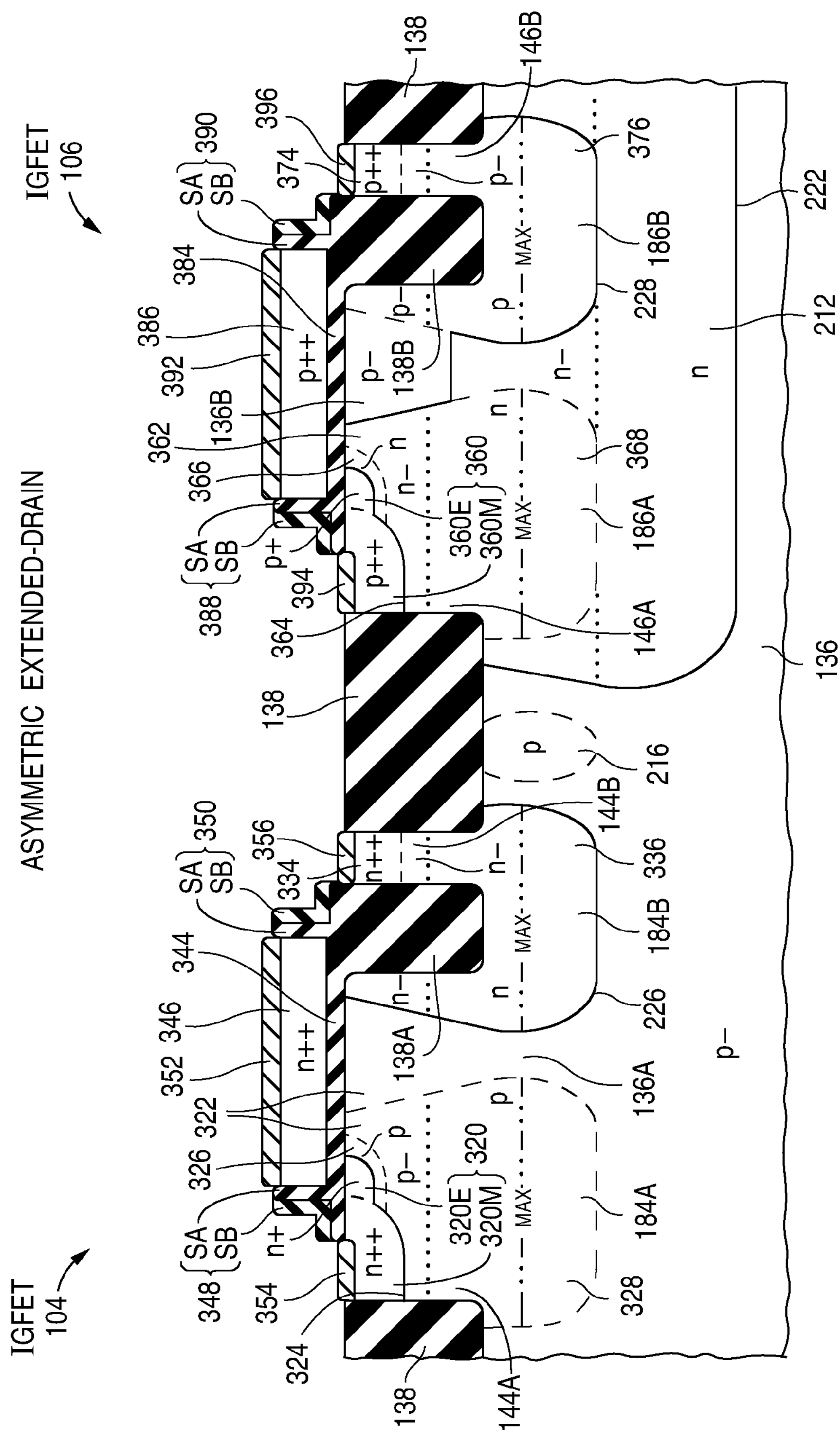
Fig. 11.2

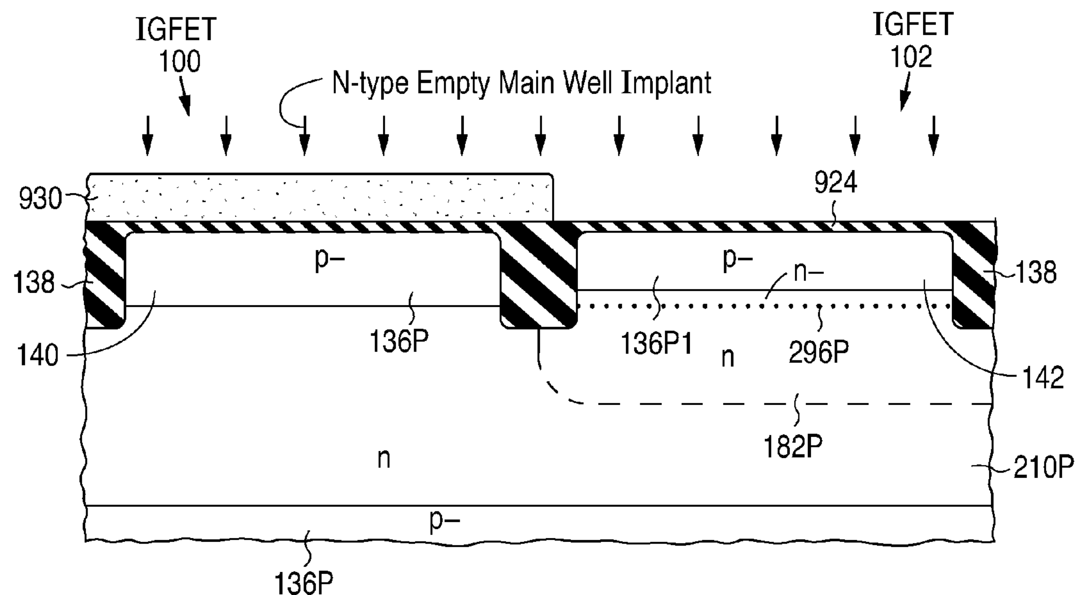
Fig. 14d.1
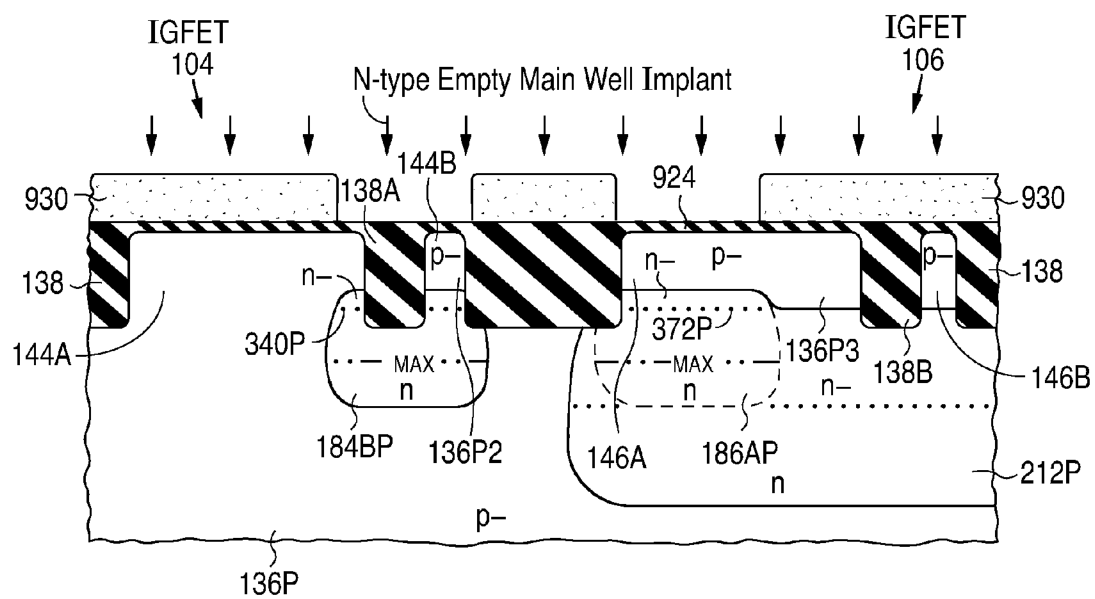
Fig. 14d.2

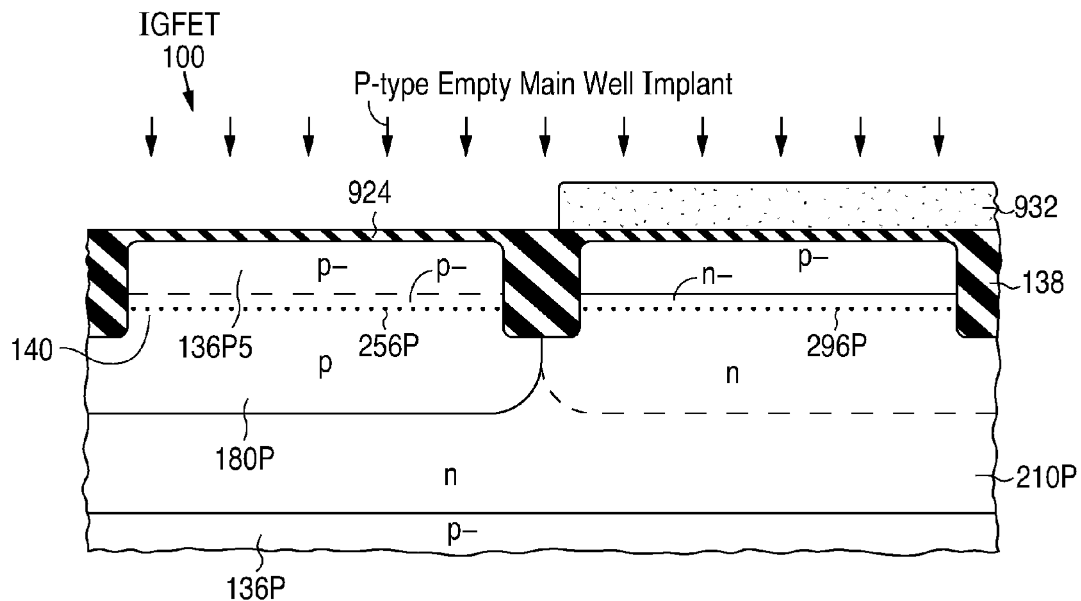
Fig. 14e.1
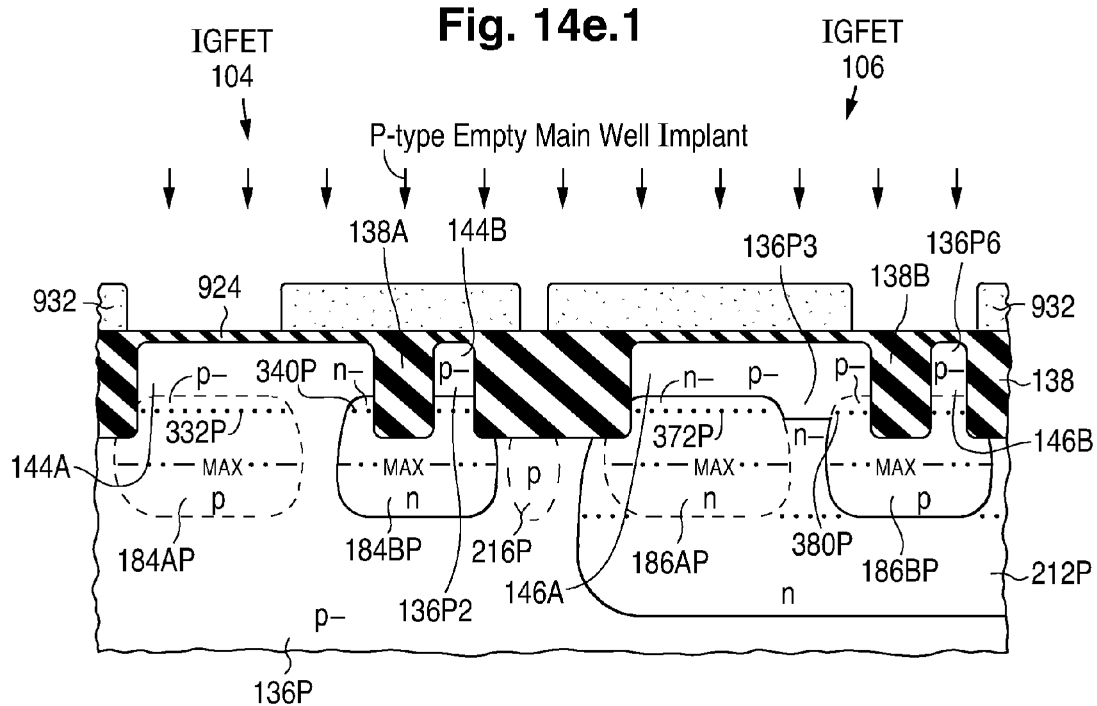
Fig. 14e.2

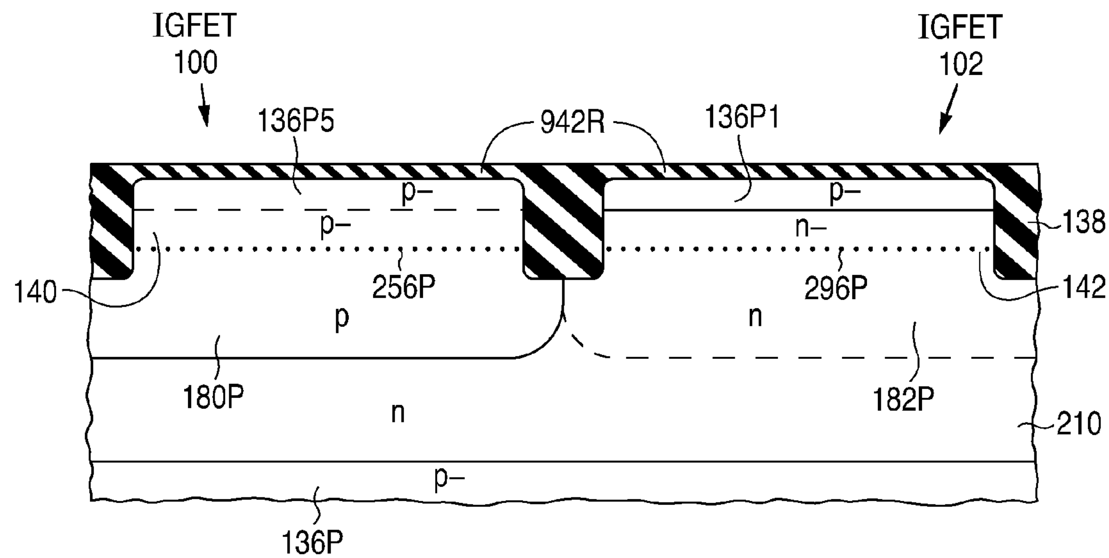
Fig. 14f.1
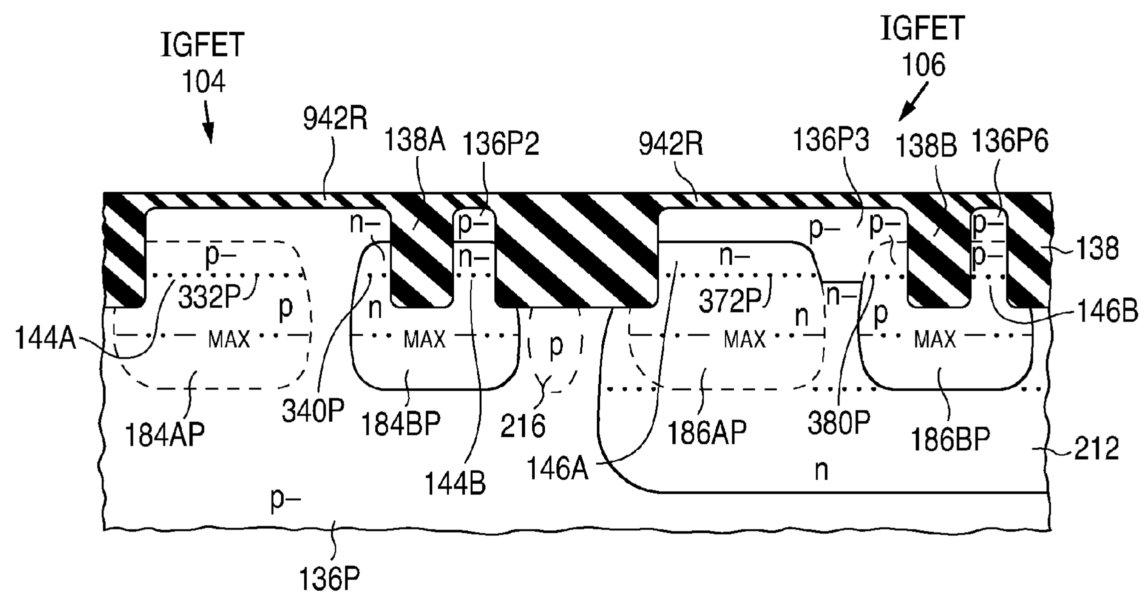
Fig. 14f.2

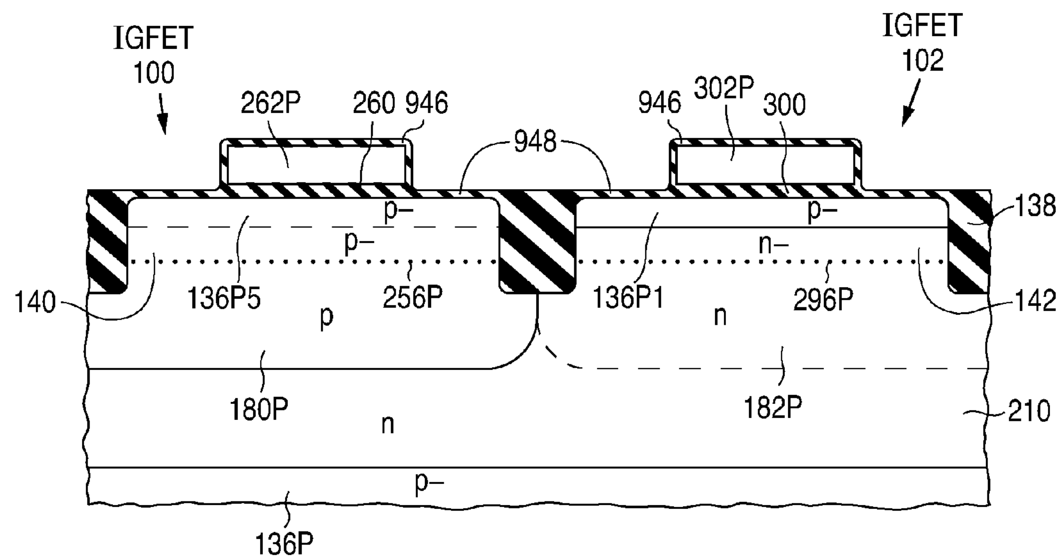
Fig. 14g.1
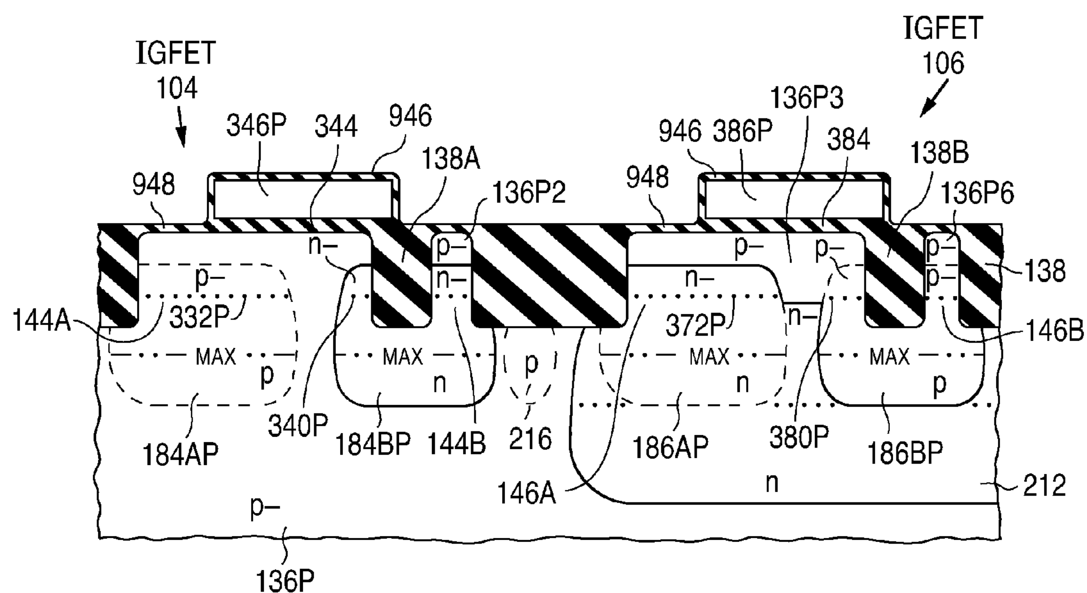
Fig. 14g.2

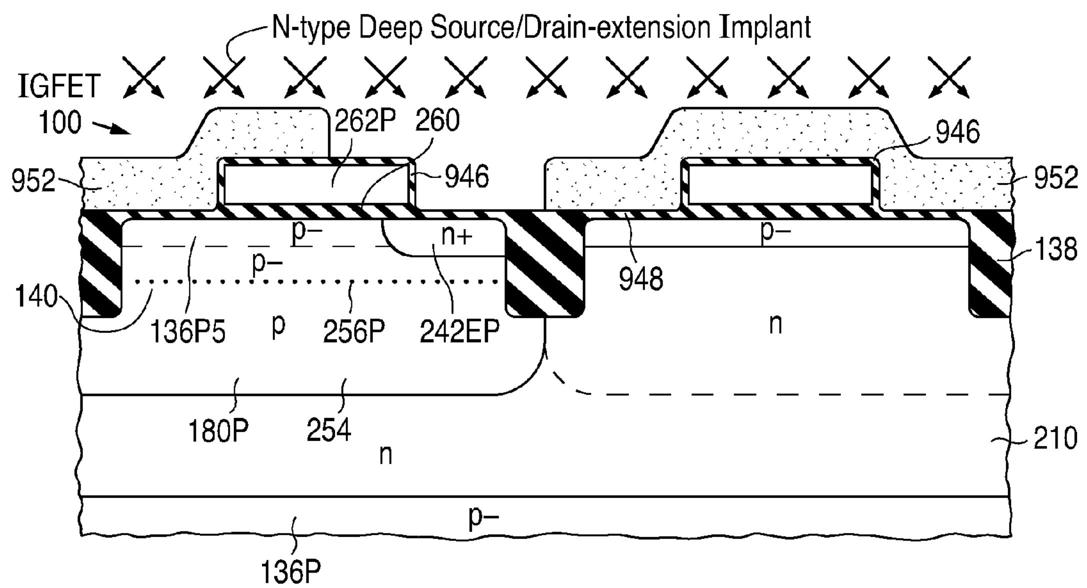
Fig. 14h.1
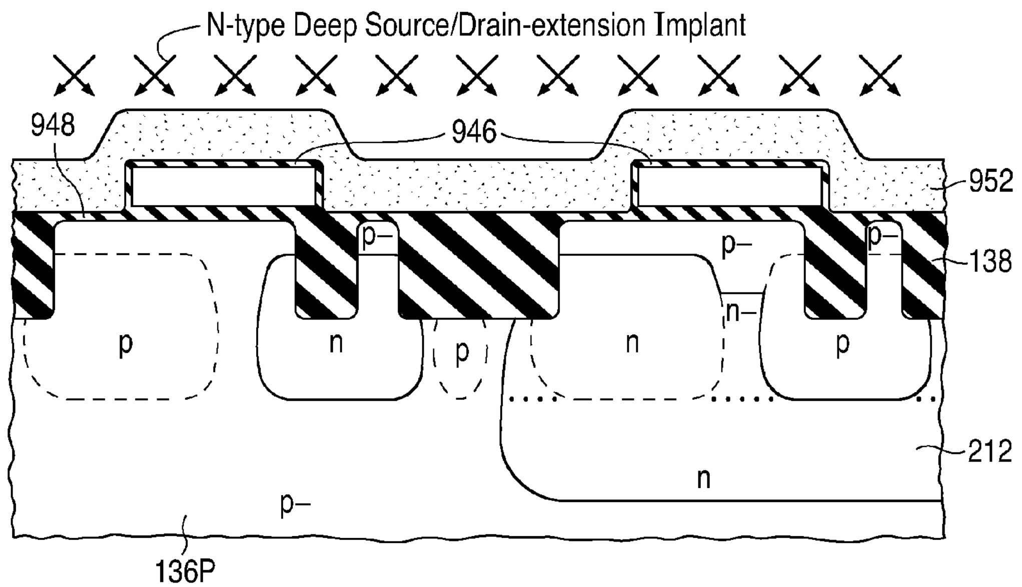
Fig. 14h.2

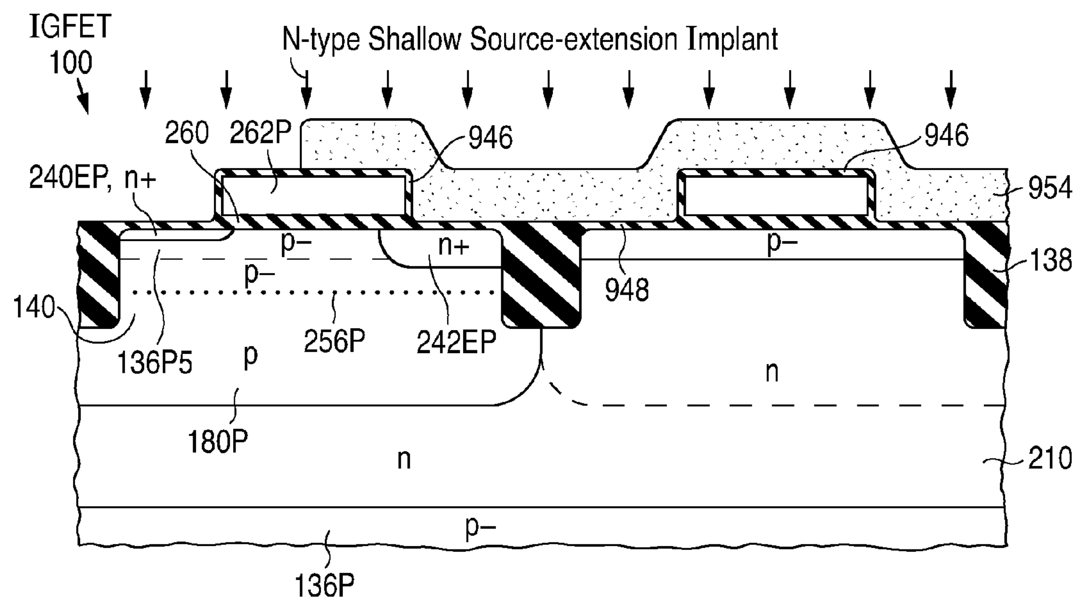
Fig. 14i.1
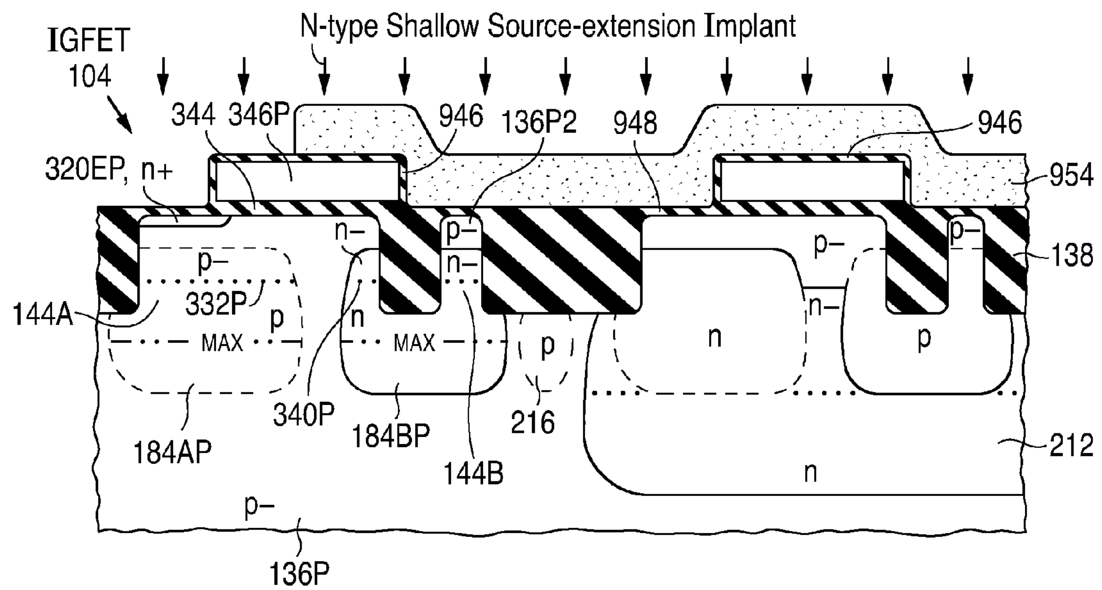
Fig. 14i.2

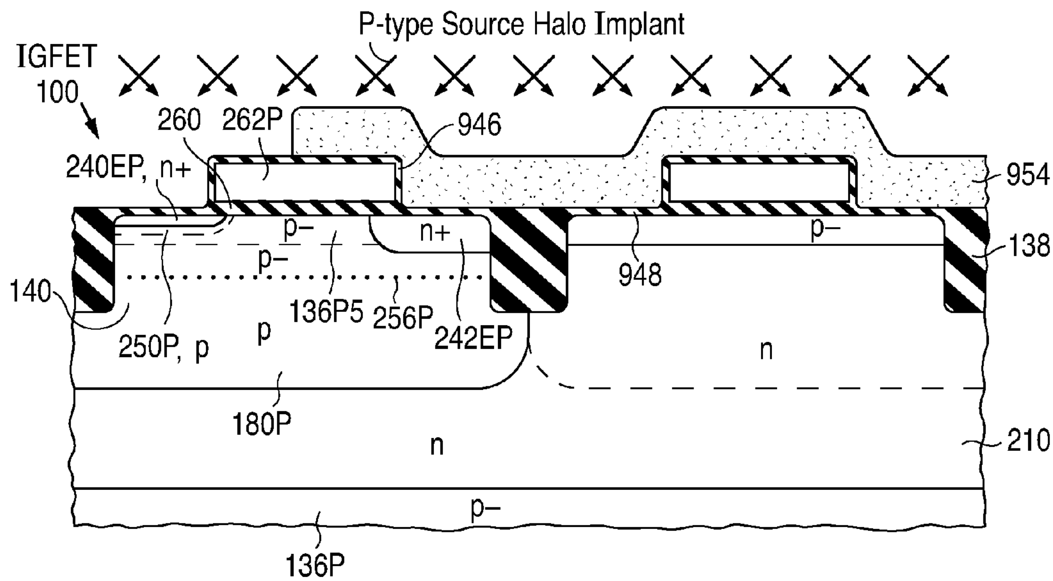
Fig. 14j.1
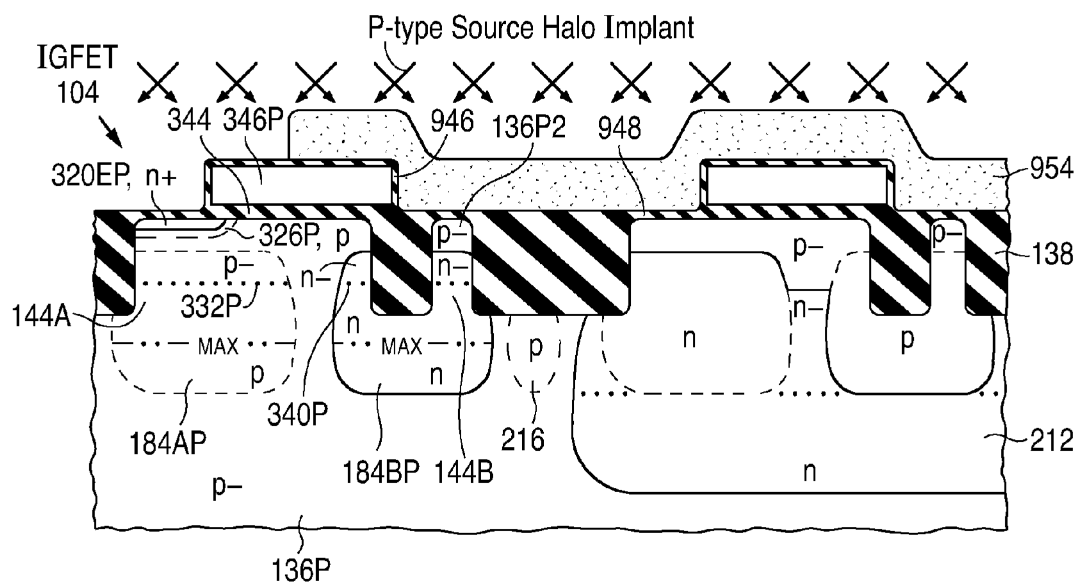
Fig. 14j.2

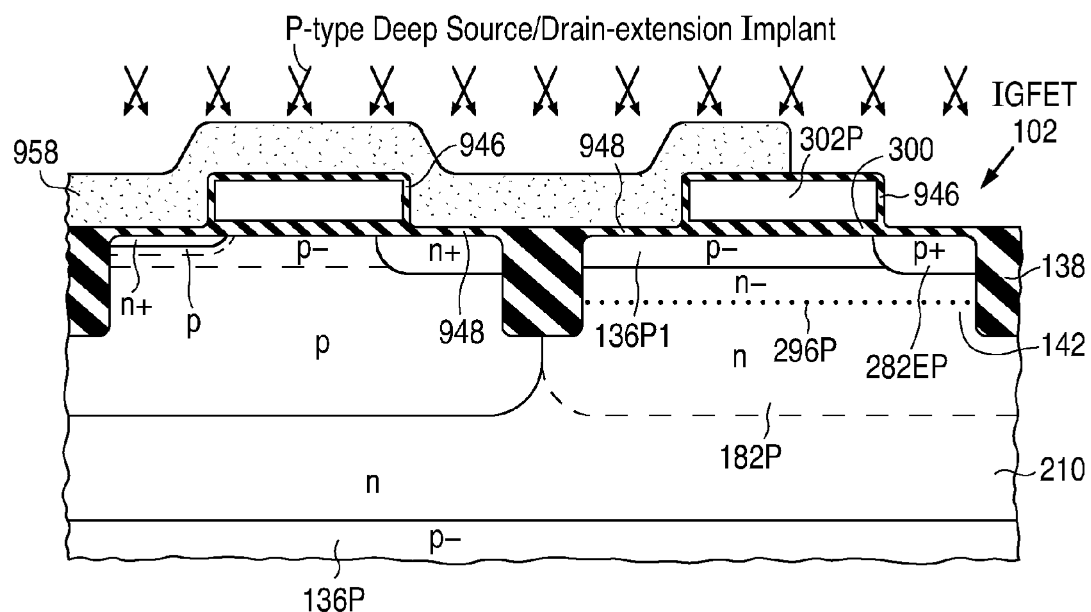
Fig. 14k.1
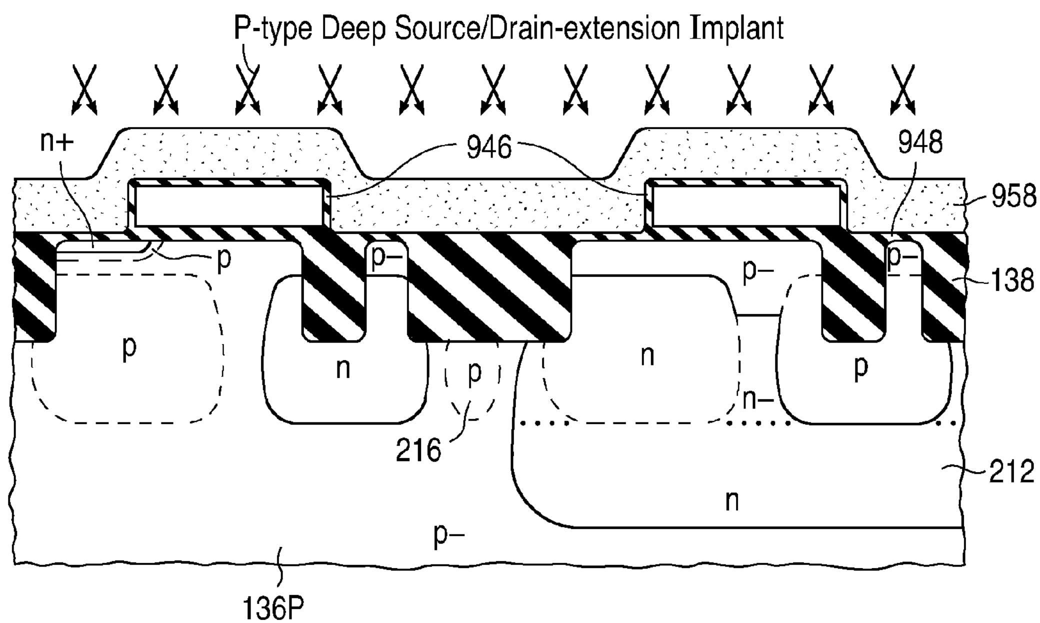
Fig. 14k.2

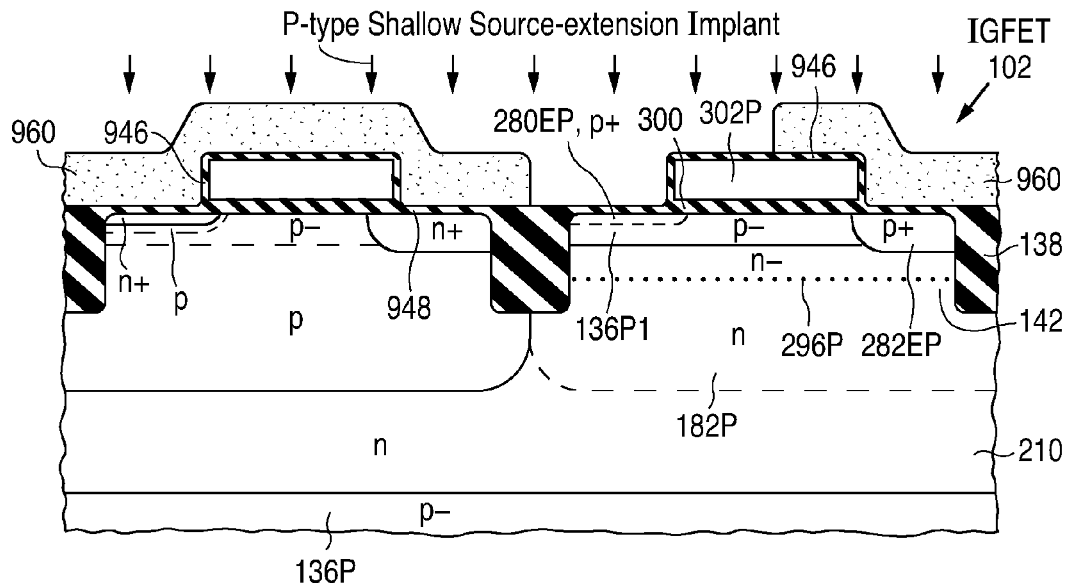
Fig. 14I.1
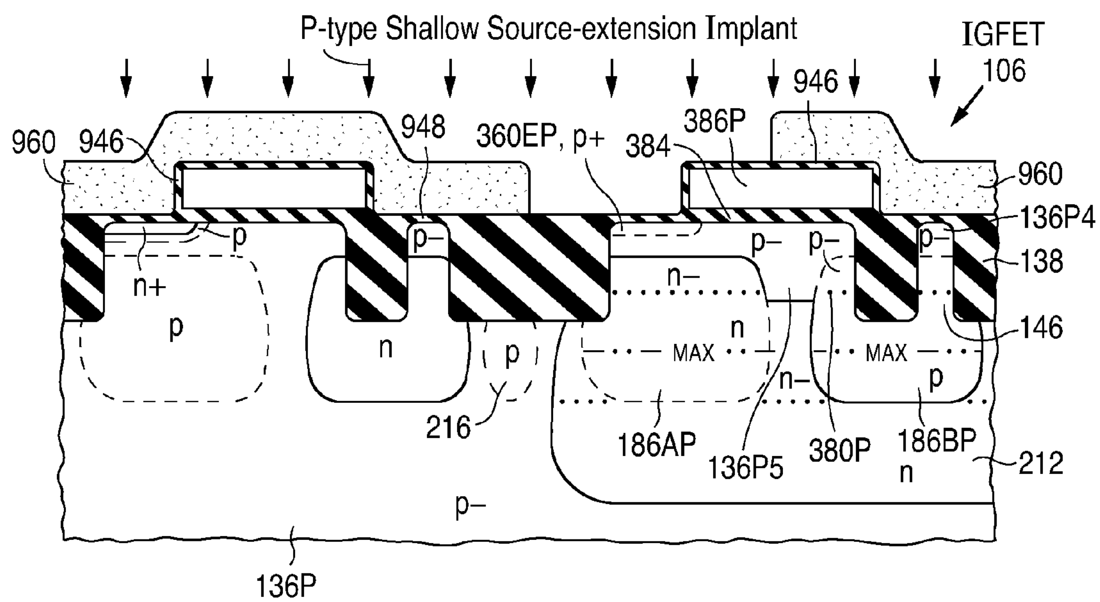
Fig. 14I.2

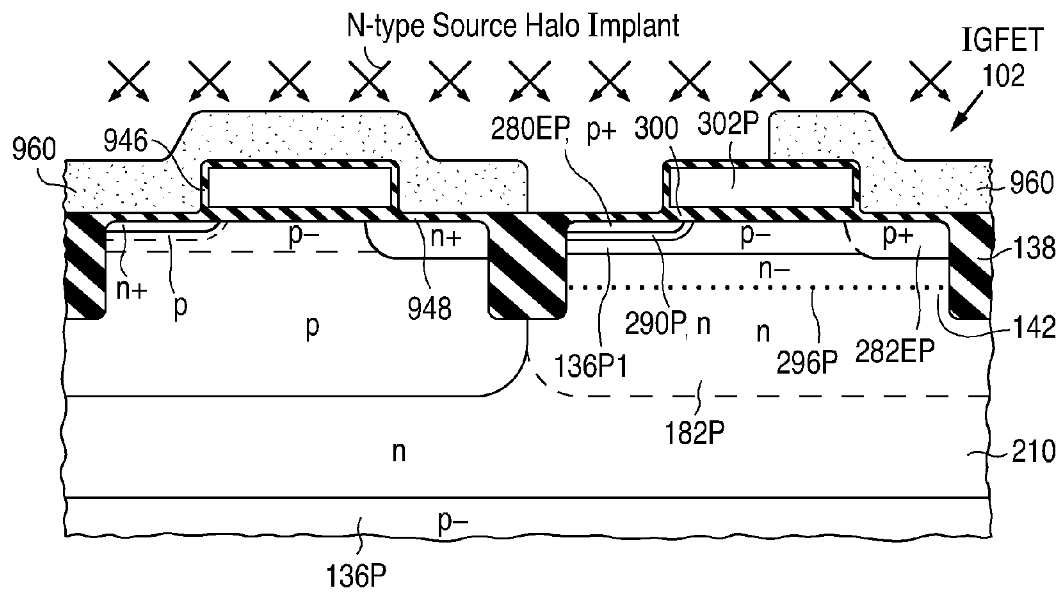
Fig. 14m.1
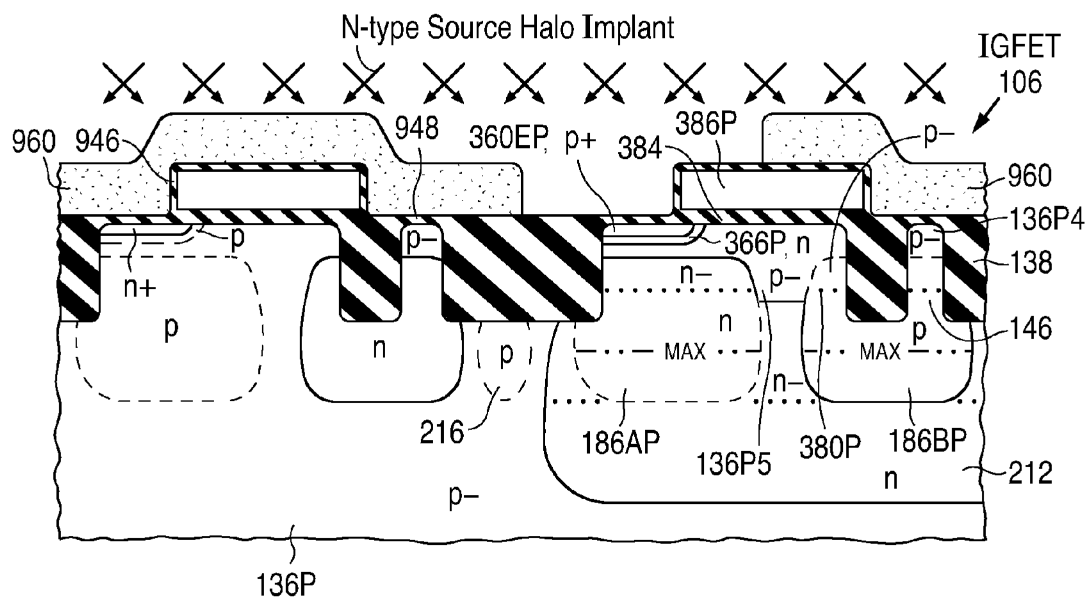
Fig. 14m.2

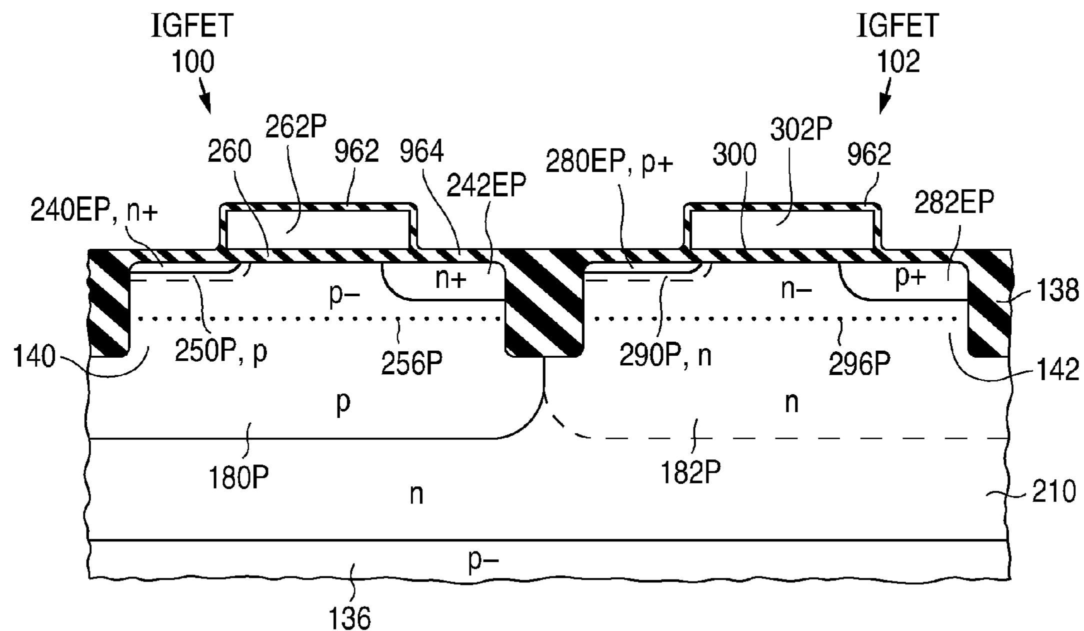
Fig. 14n.1
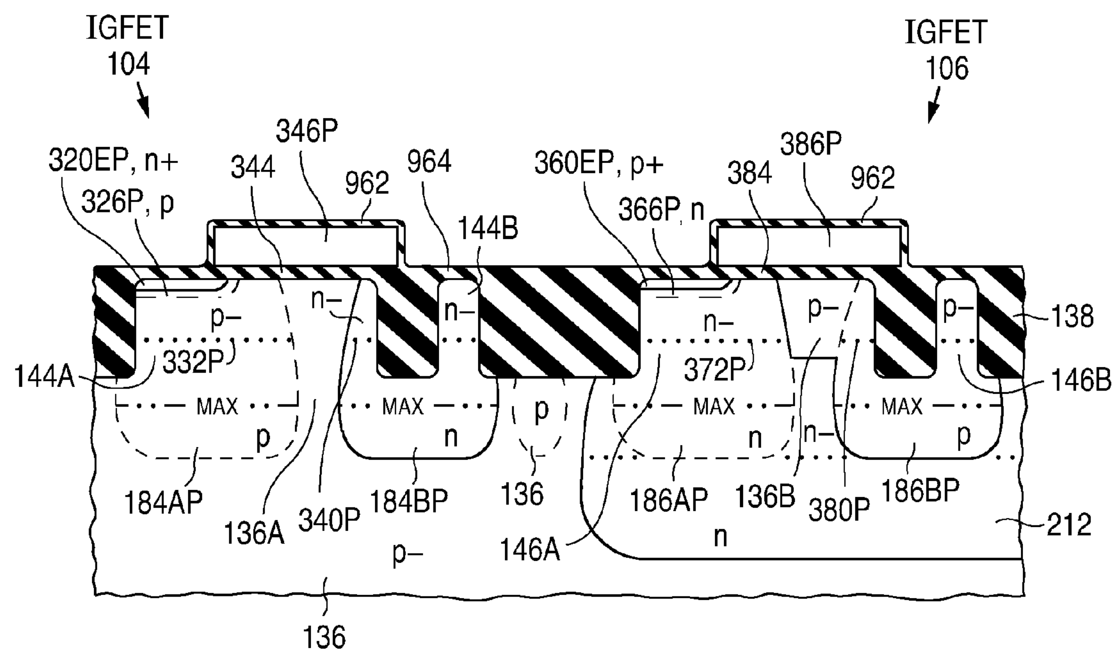
Fig. 14n.2

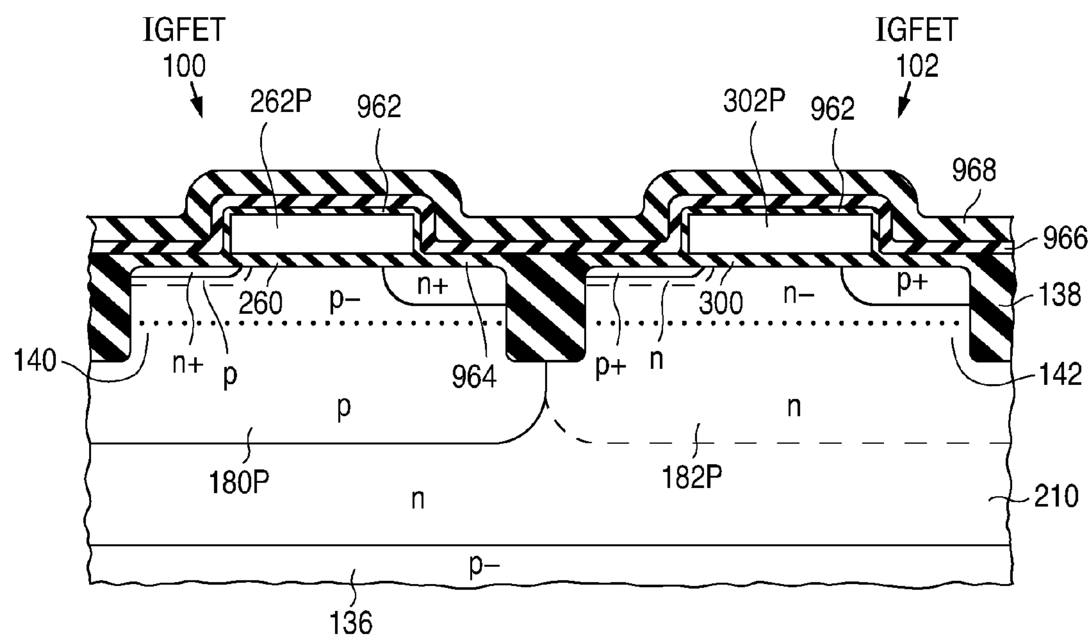
Fig. 14o.1
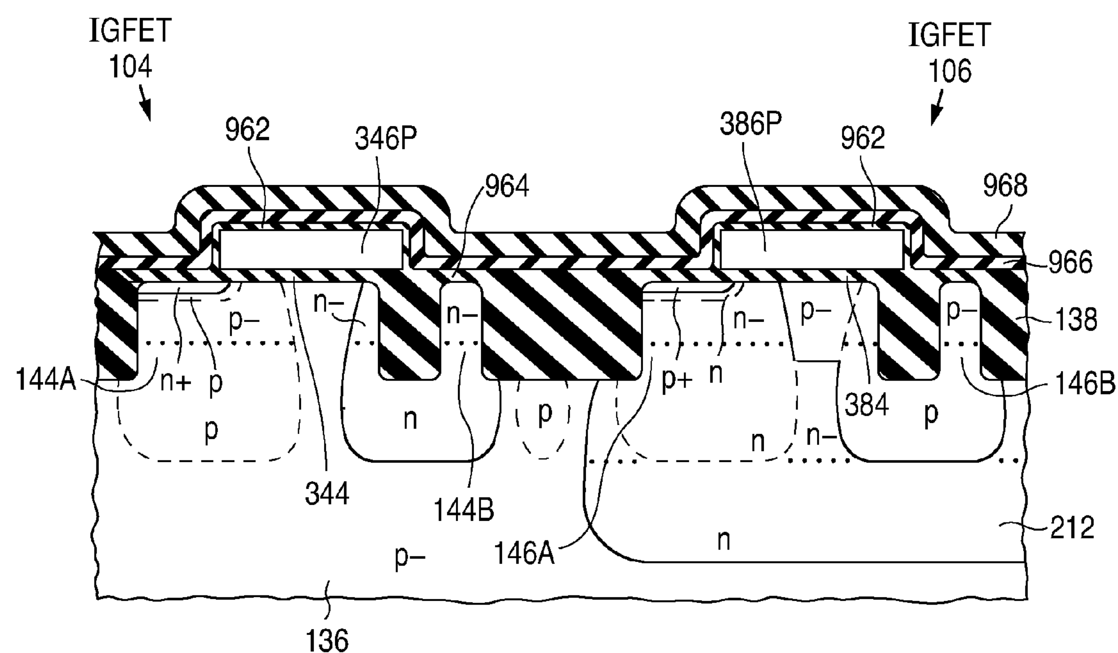
Fig. 14o.2

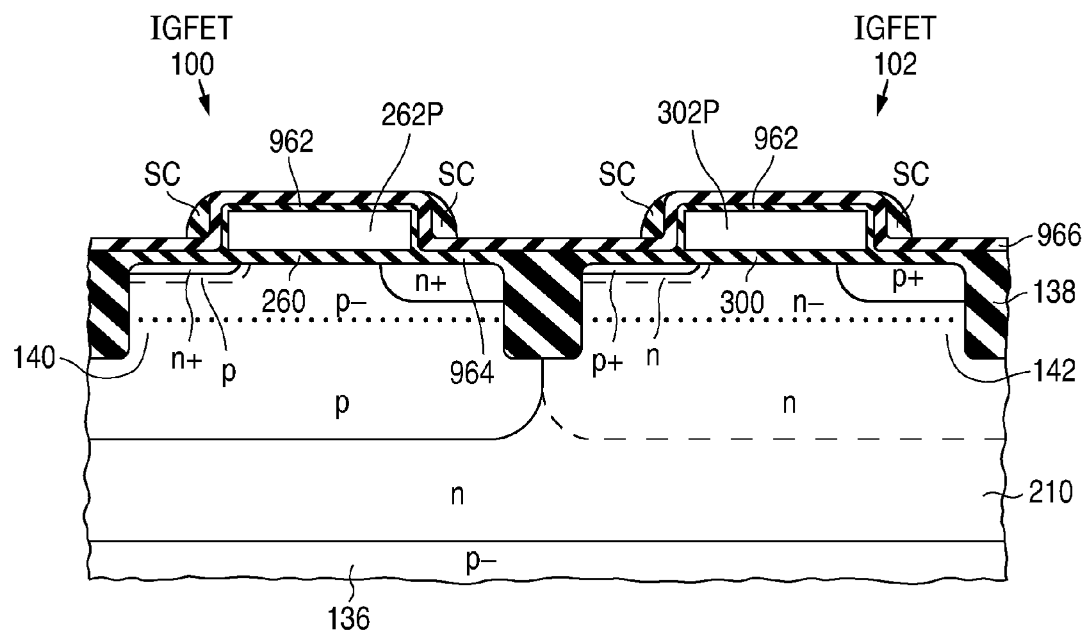
Fig. 14p.1
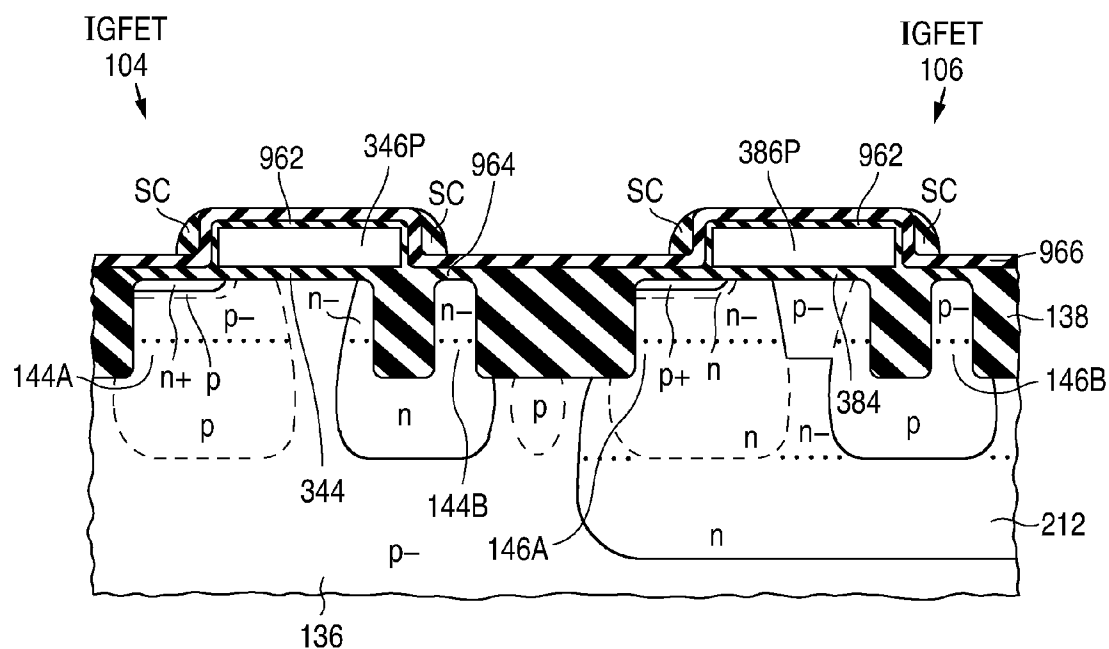
Fig. 14p.2

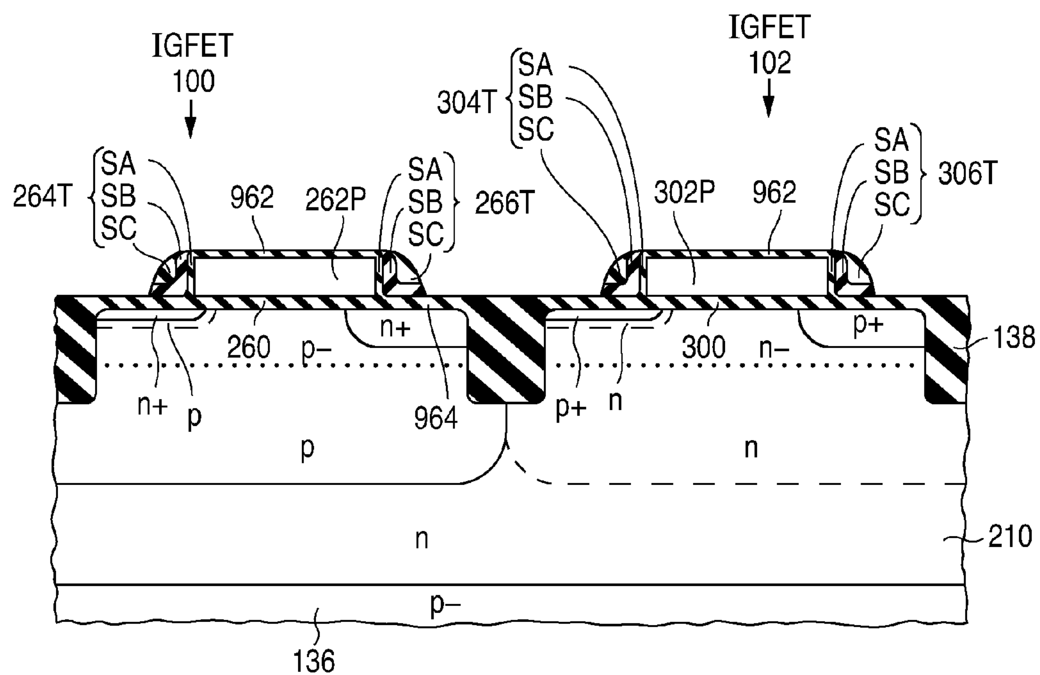
Fig. 14q.1
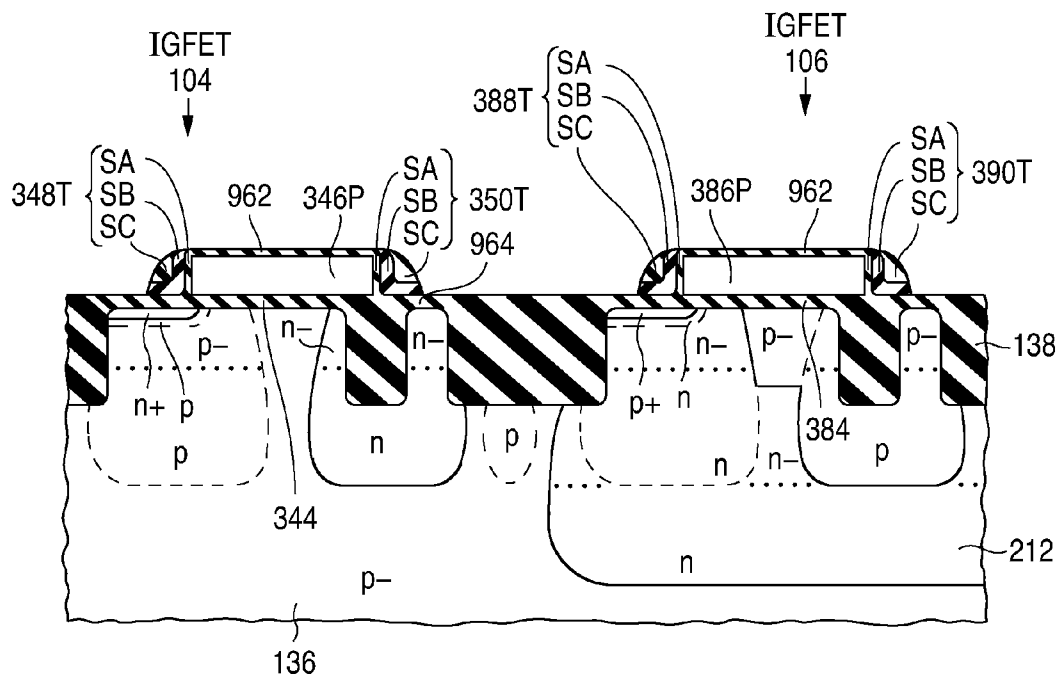
Fig. 14q.2

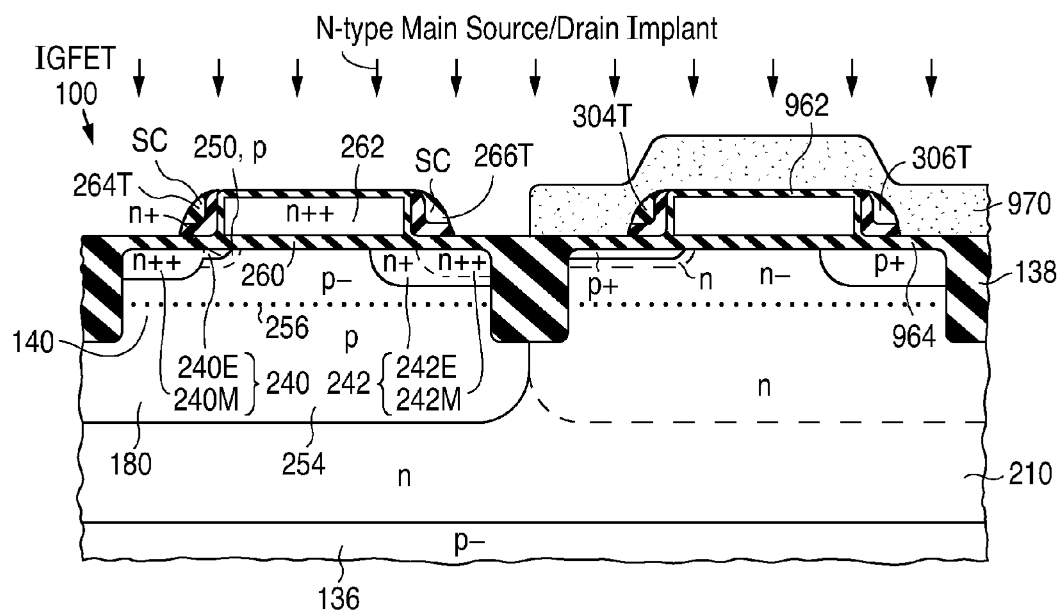
Fig. 14r.1
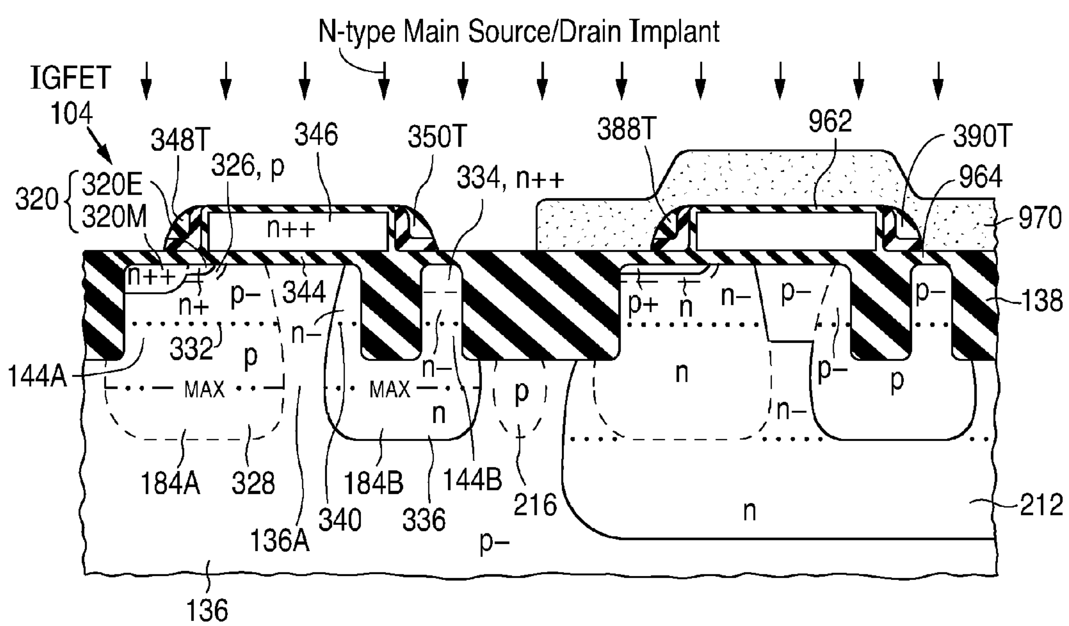
Fig. 14r.2

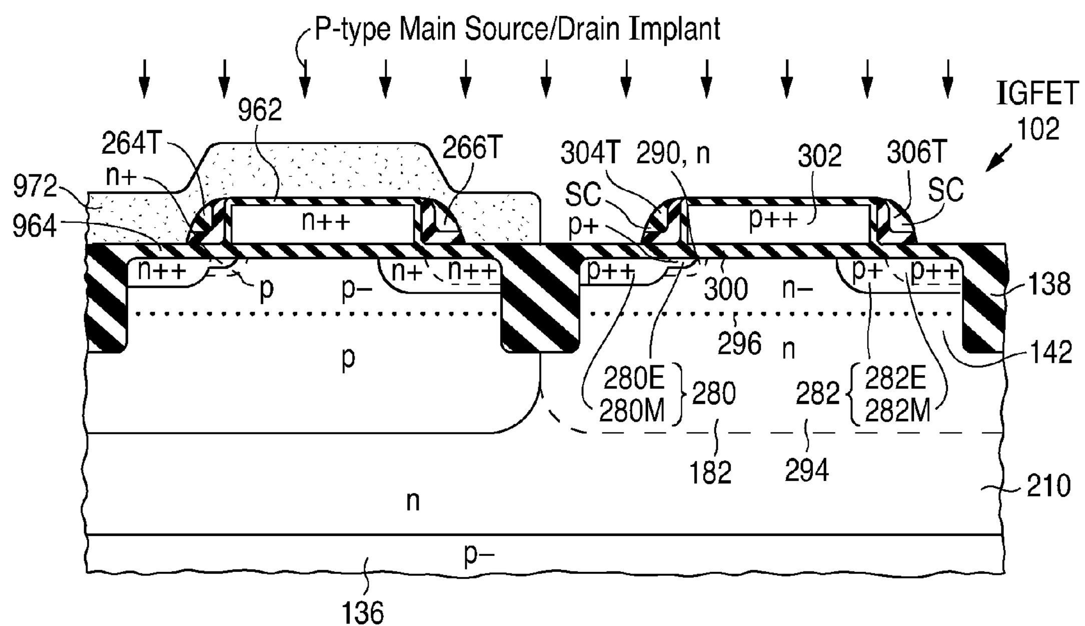
Fig. 14s.1
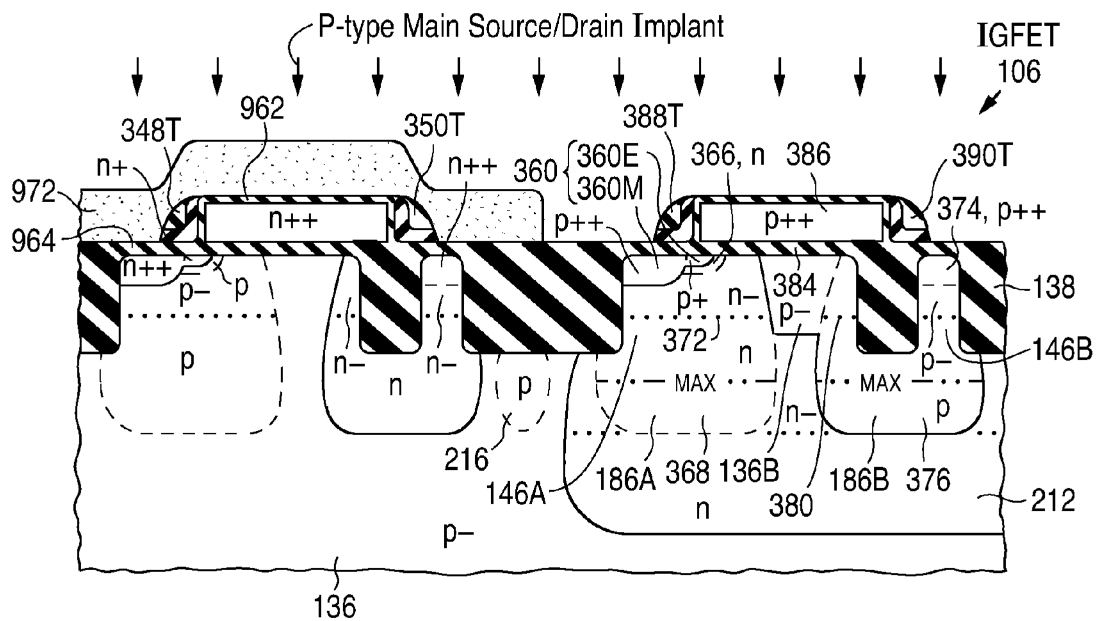
Fig. 14s.2

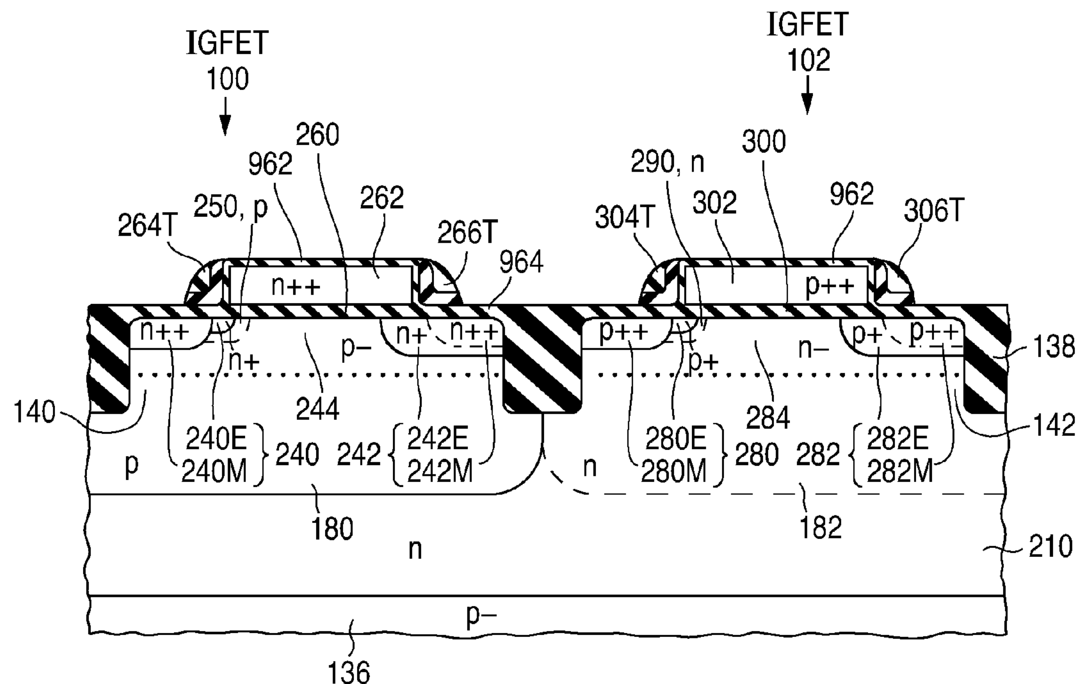
Fig. 14t.1
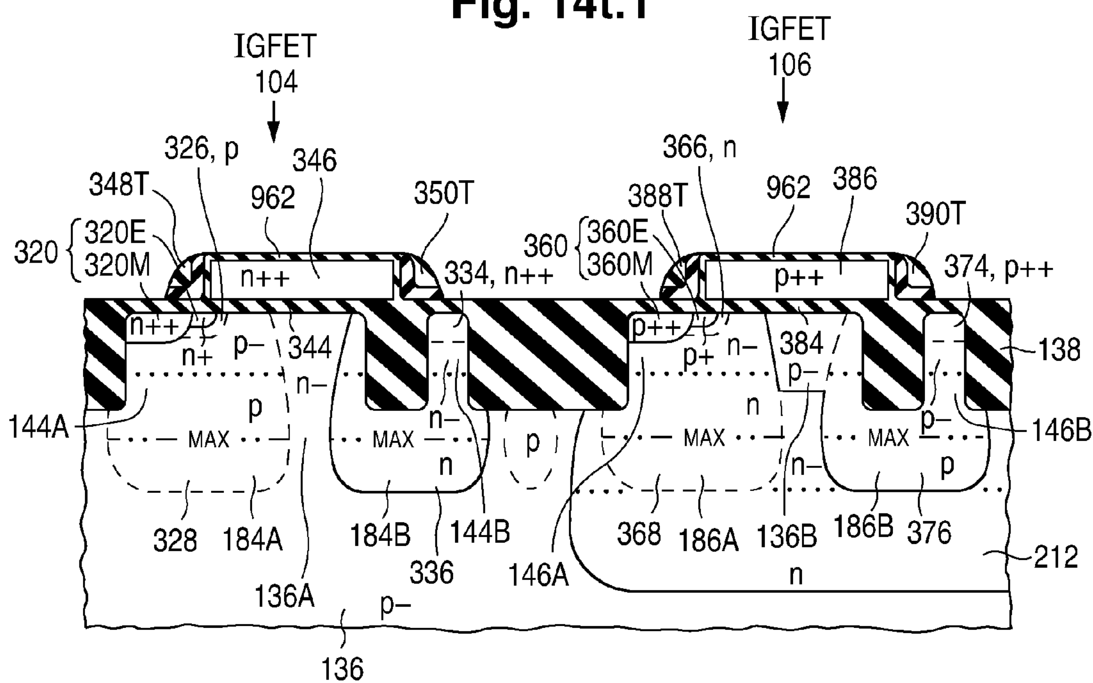
Fig. 14t.2

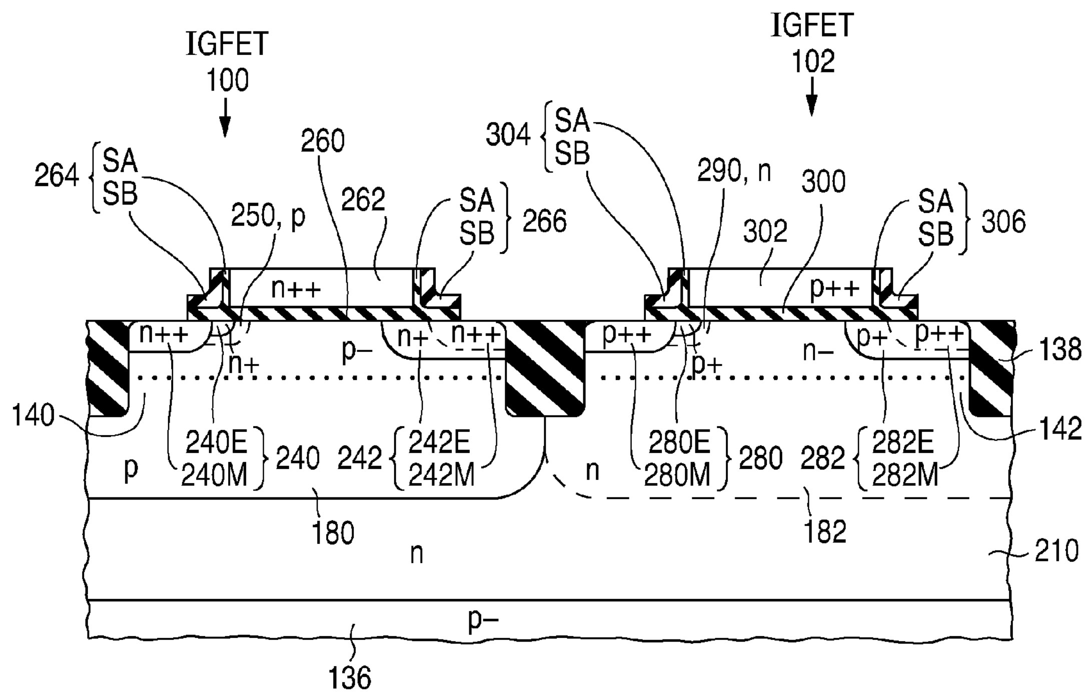
Fig. 14u.1
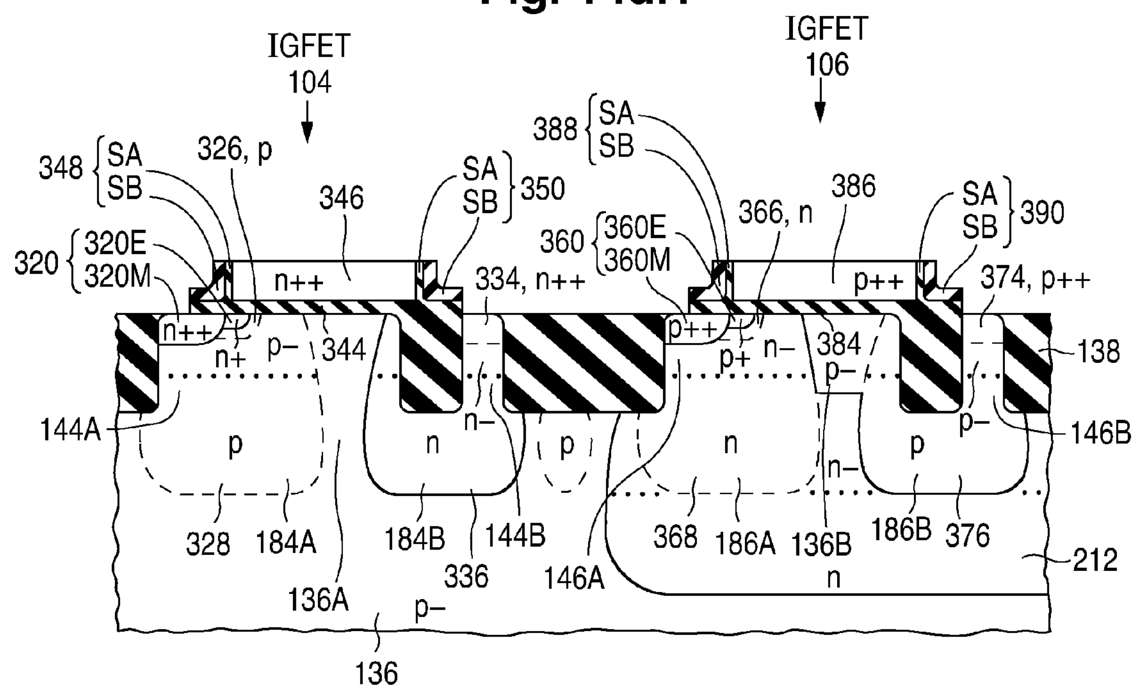
Fig. 14u.2

FABRICATION OF ASYMMETRIC FIELD-EFFECT TRANSISTORS USING L-SHAPED SPACERS

CROSS-REFERENCE TO RELATED APPLICATIONS

This application is related to the following U.S. patent applications all filed on the same date as this application: U.S. patent application Ser. No. 12/382,973 (Bulucea et al.), U.S. patent application Ser. No. 12/382,976 (Bahl et al.), U.S. patent application Ser. No. 12/382,972 (Bahl et al.), now U.S. Pat. No. 7,973,372 B2, U.S. patent application Ser. No. 12/382,966 (Yang et al.), now allowed, U.S. patent application Ser. No. 12/382,967 (Yang et al.), U.S. patent application Ser. No. 12/382,968 (Bulucea et al.), U.S. patent application Ser. No. 12/382,969 (Bulucea et al.), now U.S. Pat. No. 7,968,921 B2, U.S. patent application Ser. No. 12/382,974 (French et al.), U.S. patent application Ser. No. 12/382,971 (Bulucea et al.), now allowed, and U.S. patent application Ser. No. 12/382,970 (Chaparala et al.). To the extent not repeated herein, the contents of these other applications are incorporated by reference herein.

FIELD OF USE

This invention relates to semiconductor technology and, in particular, to field-effect transistors ("FETs") of the insulated-gate type. All of the insulated-gate FETs ("IGFETs") described below are surface-channel enhancement-mode IGFETs except as otherwise indicated.

BACKGROUND

An IGFET is a semiconductor device in which a gate dielectric layer electrically insulates a gate electrode from a channel zone extending between a source zone and a drain zone. The channel zone in an enhancement-mode IGFET is part of a body region, often termed the substrate or substrate region, which forms respective pn junctions with the source and drain. In an enhancement-mode IGFET, the channel zone consists of all the semiconductor material between the source and drain. During IGFET operation, charge carriers move from the source to the drain through a channel induced in the channel zone along the upper semiconductor surface. The threshold voltage is the value of the gate-to-source voltage at which the IGFET starts to conduct current for a given definition of the threshold (minimum) conduction current.

A depletion region extends along the junction between the source and the body region. Another depletion region extends along the junction between the drain and the body region. A high electric field is present in each depletion region. Under certain conditions, especially when the channel length is small, the drain depletion region can laterally extend to the source depletion region and merge with it along or below the upper semiconductor surface. The merging of the source and drain depletion regions along the upper semiconductor surface is termed surface punchthrough. The merging of the two depletion regions below the upper semiconductor surface is termed bulk punchthrough. When surface or bulk punchthrough occurs, the operation of the IGFET cannot be controlled with its gate electrode. Both types of punchthrough need to be avoided.

Various techniques have been employed to improve the performance of IGFETs, including those operating in the short-channel regime, as IGFET dimensions have decreased. One performance improvement technique involves providing an IGFET with a two-part drain for reducing the electric field at the drain so as to avoid hot carrier injection into the gate dielectric layer. The IGFET is also commonly provided with a similarly configured two-part source. Another conventional performance improvement technique is to increase the dopant concentration of the channel zone in a pocket portion along the source for inhibiting surface punchthrough as channel length is reduced and for shifting generally undesired roll-off of the threshold voltage to shorter channel length. Similar to how the IGFET is provided with a two-part source analogous to the two-part drain, the dopant concentration is also commonly increased in a pocket portion along the drain. The resulting IGFET is then typically a symmetric device.

FIG. 1 illustrates such a conventional long-channel symmetric n-channel IGFET 20 as described in U.S. Pat. No. 6,548,842 B1 (Bulucea et al.). IGFET 20 is created from a p-type monocrystalline silicon ("monosilicon") semiconductor body. The upper surface of IGFET 20 is provided with recessed electrically insulating field-insulating region 22 that laterally surrounds active semiconductor island 24 having n-type source/drain ("S/D") zones 26 and 28. Each S/D zone 26 or 28 consists of very heavily doped main portion 26M or 28M and more lightly doped, but still heavily doped, lateral extension 26E or 28E.

S/D zones 26 and 28 are separated from each other by channel zone 30 of p-type body material 32 consisting of lightly doped lower portion 34, heavily doped intermediate well portion 36, and upper portion 38. Although most of upper body-material portion 38 is moderately doped, portion 38 includes ion-implanted heavily doped halo pocket portions 40 and 42 that respectively extend along S/D zones 26 and 28. IGFET 20 further includes gate dielectric layer 44, overlying very heavily doped n-type polycrystalline silicon ("polysilicon") gate electrode 46, electrically insulating gate sidewall spacers 48 and 50, and metal silicide layers 52, 54, and 56.

S/D zones 26 and 28 are largely mirror images of each other. Halo pockets 40 and 42 are also largely mirror images of each other so that channel zone 30 is symmetrically longitudinally graded with respect to channel dopant concentration. Due to the symmetry, either S/D zone 26 or 28 can act as source during IGFET operation while the other S/D zone 28 or 26 acts as drain. This is especially suitable for some digital situations where S/D zones 26 and 28 respectively function as source and drain during certain time periods and respectively as drain and source during other time periods.

The increased p-type dopant channel dopant concentration provided by each halo pocket 40 or 42 along S/D zone 26 or 28, specifically along lateral S/D extension 26E or 28E, causes surface punchthrough to be avoided. Upper body-material portion 38 is also provided with ion-implanted p-type anti-punchthrough ("APT") semiconductor dopant that reaches a maximum concentration in the vicinity of the depth of S/D zones 26 and 28. This causes bulk punchthrough to be avoided.

Each sidewall spacer 48 or 50 is cross-sectionally shaped generally like a right triangle with a curved hypotenuse as viewed in the direction of the IGFET's width. Gate sidewall spacers of such cross-sectional shape are referred to here as curved triangular spacers. Other cross-sectional shapes are conventionally employed for gate side wall spacers. In some cases, the shapes of the gate sidewall spacers are modified significantly during IGFET fabrication so as to improve IGFET characteristics.

FIGS. 2*a*-2*d* (collectively "FIG. 2") illustrate how the shape of a gate sidewall spacer changes as described in Augendre et al. ("Augendre"), "Thin L-shaped spacers for CMOS", 33rd Eur. Solid-State Dev. Rsch. Conf., 16-18 Sep.

2003, pp. 219-222. The IGFETs in Augendre appear to be symmetric devices. FIG. 2 is centered on the spacer structure near an S/D zone and, for convenience, presents part of Augendre's n-channel implementation using the same reference symbols as in FIG. 1 for corresponding regions. At the stage of FIG. 2*a*, precursor 28EP to S/D extension 28E has been formed. Lower dielectric layer 58A of silicon oxide, intermediate dielectric layer 58B of silicon nitride, upper dielectric layer 58C of silicon oxide, and polysilicon layer 58D have been successively provided along the upper semiconductor surface and along gate electrode 46.

An anisotropic etch is performed to remove all of polysilicon layer 58D except for portions along the vertical parts of upper silicon oxide layer 58C. See FIG. 2*b*. Item 58DR indicates a remaining portion of polysilicon layer 58D. The portions of upper oxide layer 58C not covered by the remaining portions, e.g., portion 58DR, of polysilicon layer 58D are also removed. Curved triangular gate sidewall spacer 58T then consists of remaining polysilicon portion 58DR, remaining upper oxide portion 58CR, and the underlying portions of intermediate silicon nitride layer 58B and lower silicon oxide layer 58A. Using gate electrode 46 and curved triangular spacer 58T as a dopant-implantation shield, n-type main S/D semiconductor dopant is ion implanted to define main S/D portion 28M. S/D extension 28E is the segment of precursor S/D extension 28EP outside main S/D portion 28M.

Referring to FIG. 2*c*, the exposed parts of nitride layer 58B are removed. Item 58BR indicates a remaining portion of nitride layer 58B. Polysilicon spacer portion 58DR is removed. Upper oxide portion 58CR and the other remaining portions of upper oxide layer 58C are removed. In so doing, the exposed parts of lower oxide layer 58A are removed. Item 58AR indicates a remaining portion of lower oxide layer 58A. As a result, curved triangular spacer 58T is converted into L-shaped gate sidewall spacer 58L consisting of L-shaped lower oxide portion 58AR and overlying L-shaped nitride portion 58BR.

A layer of cobalt is deposited on the structure of FIG. 2*c* to begin a self-aligned silicidation process commonly referred to as "salicidation". A titanium cap layer is deposited on the cobalt layer. The cobalt overlying gate electrode 46 and main S/D portion 28M is reacted with underlying silicon to form metal silicide layers 52 and 56. The cobalt overlying the L-shaped spacers, including spacer 58L, does not undergo reaction. The titanium cap layer is removed followed by removal of the unreacted cobalt, i.e., the cobalt overlying the L-shaped spacers. FIG. 2*d* depicts the resultant structure. Augendre reports that use of L-shaped spacers during salicidation leads to more uniform tungsten deposition, and enables IGFETs to be packed more closely together, compared to using curved triangular spacers during salicidation.

U.S. Pat. Nos. 6,664,156 B1, 6,815,355 B2, and 6,924,180 B2 describe other IGFET fabrication processes which utilized L-shaped gate sidewall spacers in fabricating symmetric IGFETs. In U.S. Pat. No. 6,924,180, a gate stack consisting of a gate electrode and an underlying gate dielectric layer is defined over a semiconductor body at the location for an n-channel IGFET. Using the gate electrode and thin silicon oxide layers along the gate electrode's lateral sides as an implantation shield, ion implantation is employed to form precursors to n-type S/D extensions akin to S/D extensions 26E and 28E of FIG. 1 and to form p-type precursors to shallow pocket portions akin to halo pocket portions 40 and 42 of FIG. 1. Curved triangular spacers configured similar to curved triangular spacer 58T of FIG. 2 are formed along the lateral sides of the gate electrode. Each spacer consists of an L-shaped dielectric portion and a curved triangular dielectric portion that fills the intervening space. Heavily doped n-type main S/D portions akin to main S/D portions 26M and 28M of FIG. 1 are defined by ion implantation using the gate electrode and the curved triangular spacers as an ion-implantation shield to complete the implantations for the S/D zones.

Similar to Augendre, the curved triangular portions of the gate sidewall spacers are removed at this point in the fabrication process of U.S. Pat. No. 6,924,180 to convert them into L-shaped spacers. Using the gate electrode and the L-shaped spacers as an ion-implantation shield, ion implantation is employed to define a pair of deep p-type pocket portions which extend respectively along the S/D zones up respectively to the shallow pocket portions. The structure is then annealed. U.S. Pat. No. 6,924,180 indicates that the deep pocket portions help alleviate punchthrough.

Various types of wells have been employed in integrated circuits ("ICs"), particularly ICs containing complementary IGFETs where wells must be used for either the n-channel or p-channel IGFETs depending on whether the lightly doped starting semiconductor material for the IGFET body material is of p-type or n-type conductivity. ICs containing complementary IGFETs commonly use both p-type and n-type wells in order to facilitate matching of n-channel and p-channel IGFET characteristics.

Early complementary-IGFET ("CIGFET") fabrication processes, commonly termed "CMOS" fabrication, often created wells, referred to here as "diffused" wells, by first introducing main semiconductor well dopant shallowly into lightly doped semiconductor material prior to formation of a recessed field-insulating region typically consisting largely of thermally grown silicon oxide. Because the field-oxide growth was invariably performed at high temperature over a multi-hour period, the well dopant diffused deeply into the semiconductor material. As a result, the maximum concentration of the diffused well dopant occurred at, or very close to, the upper semiconductor surface. Also, the vertical profile of the diffused well dopant was relatively flat near the upper semiconductor surface.

In more recent CIGFET fabrication processes, ion implantation at relatively high implantation energies has been utilized to create wells subsequent to formation of the field oxide. Since the well dopant is not subjected to the long high-temperature operation used to form the field oxide, the maximum concentration of the well dopant occurs at a significant depth into the semiconductor material. Such a well is referred to as a "retrograde" well because the concentration of the well dopant decreases in moving from the subsurface location of the maximum well-dopant concentration to the upper semiconductor surface. Retrograde wells are typically shallower than diffused wells. The advantages and disadvantages of retrograde wells are discussed in (a) Brown et al., "Trends in Advanced Process Technology—Submicrometer CMOS Device Design and Process Requirements", *Procs. IEEE*, December 1986, pp. 1678-1702, and (b) Thompson et al., "MOS Scaling: Transistor Challenges for the 21st Century", *Intel Technology J.*, Q398, 1998, pp. 1-19.

FIG. 3 illustrates symmetric n-channel IGFET 60 that employs a retrograde well as generally described in Rung et al. ("Rung"), "A Retrograde p-Well for Higher Density CMOS", *IEEE Trans Elec. Devs.*, October 1981, pp. 1115-1119. Regions in FIG. 3 corresponding to regions in FIG. 1 are, for simplicity, identified with the same reference symbols. With this in mind, IGFET 60 is created from lightly doped n-type substrate 62. Recessed field-insulating region 22 is formed along the upper semiconductor surface according to the local-oxidation-of-silicon process. P-type retrograde well 64 is subsequently formed by selectively implanting p-type semiconductor dopant into part of substrate 62. The remaining IGFET regions are then formed to produce IGFET 60 as shown in FIG. 3.

The p-type dopant concentration of retrograde well 64 is at moderate level, indicated by the symbol "p", in the vicinity of the peak well dopant concentration. The well dopant concentration drops to a low level, indicated by the symbol "p−", at the upper semiconductor surface. The dotted line in FIG. 3 indicates generally where the well dopant concentrations transitions from the p level to the p− level in moving from the p portion of well 64 to the upper semiconductor surface.

FIG. 4 indicates the general nature of the dopant profile along an imaginary vertical line through the longitudinal center of IGFET 60 in terms of net dopant concentration $N_N$. Curve segments 62* and 64* respectively represent the net dopant concentrations of n-type substrate 62 and p-type retrograde well 64. Arrow 66 indicates the location of the maximum subsurface p-type dopant concentration in well 64. For comparison, curve segment 68* represents the vertical dopant profile of a typical deeper p-type diffused well.

A specific example of the dopant profile along an imaginary vertical line through the longitudinal center of retrograde well 64 as simulated by Rung is depicted in FIG. 5 in terms of net dopant concentration $N_N$. Curve segment 26' or 28' indicates the individual n-type dopant concentration along an imaginary vertical line through S/D zone 26 or 28 of Rung's simulation of IGFET 60. As FIG. 5 indicates, the concentration of the p-type well dopant decreases by more than a factor of 10 in moving from location 66 of the maximum p-type dopant concentration in well 64 to the upper semiconductor surface. FIG. 5 also indicates that the depth of location 66 is approximately twice as deep as S/D zone 26 or 28 in IGFET 60.

A retrograde IGFET well, such as well 64, whose maximum well dopant concentration (i) is at least a factor of 10 greater than the well dopant concentration at the upper semiconductor surface and (ii) occurs relatively deep compared to, e.g., deeper than, the maximum depth of the S/D zones can be viewed as an "empty" well since there is a relatively small amount well dopant near the top of the well where the IGFET's channel forms. In contrast, a diffused well, i.e., a well in which semiconductor well dopant is introduced shallowly into lightly doped semiconductor material and then diffused deeply into the semiconductor material, is a "filled" well. The well for symmetric IGFET 20 in FIG. 1 can likewise be viewed as a filled well since the APT dopant "fills" the retrograde well that would otherwise occur if the main well dopant were the only well dopant.

A symmetric IGFET structure is generally not needed in situations where current flows in only one direction through an IGFET during device operation. As further discussed in U.S. Pat. No. 6,548,842, drain-side halo pocket portion 42 of symmetric IGFET 20 can be deleted to produce long n-channel IGFET 70 as shown in FIG. 6*a*. IGFET 70 is an asymmetric device because channel zone 30 is asymmetrically longitudinally dopant graded. S/D zones 26 and 28 in IGFET 70 normally respectively function as source and drain. FIG. 6*b* illustrates asymmetric short n-channel IGFET 72 corresponding to long-channel IGFET 70. In IGFET 72, source-side halo pocket 40 closely approaches drain 28. Asymmetric IGFETs 70 and 72 receive the same APT and well implants as symmetric IGFET 60.

U.S. Pat. Nos. 6,078,082 and 6,127,700 (both Bulucea) describe IGFETs having asymmetric channel zones but different vertical dopant concentration characteristics than those employed in the inventive IGFETs of U.S. Pat. No. 6,548,842. IGFETs having asymmetric channel zones are also examined in other prior art documents such as (a) Buti et al., "Asymmetrical Halo Source GOLD drain (HS-GOLD) Deep Sub-half Micron n-MOSFET Design for Reliability and Performance", *IEDM Tech. Dig.,* 3-6 December 1989, pp. 26.2.1-26.2.4, (b) Chai et al., "A Cost-Effective 0.25 μm $L_{eff}$ BiCMOS Technology Featuring Graded-Channel CMOS (GCMOS) and a Quasi-Self-Aligned (QSA) NPN for RF Wireless Applications", *Procs.* 2000 *Bipolar/BiCMOS Circs. and Tech. Meeting,* 24-26 Sep. 2000, pp. 110-113, (c) Ma et al., "Graded-Channel MOSFET (GCMOSFET) for High Performance, Low Voltage DSP Applications", *IEEE Trans. VLSI Systs. Dig*, December 1997, pp. 352-358, and (d) Su et al., "A High-Performance Scalable Submicron MOSFET for Mixed Analog/Digital Applications", *IEDM Tech. Dig.*, December 1991, pp. 367-370.

Choi et al. ("Choi"), "Design and analysis of a new self-aligned asymmetric structure for deep sub-micrometer MOSFET", *Solid-State Electronics*, Vol. 45, 2001, pp. 1673-1678, describes an asymmetric n-channel IGFET configured similarly to IGFET 70 or 72 except that the source extension is more heavily doped than the drain extension. Choi's IGFET also lacks a well region corresponding to intermediate well portion 36. FIG. 7 illustrates Choi's IGFET 80 using the same reference symbols as used for IGFET 70 or 72 to identify corresponding regions. Although source extension 26E and drain extension 28E are both labeled "n+" in FIG. 7, the doping in source extension 26E of IGFET 80 is somewhat more than a factor of 10 greater than the doping in drain extension 28E. Choi indicates that the heavier source-extension doping should reduce the increased source-associated parasitic capacitance that otherwise results from the presence of halo pocket 40 along source 26.

FIGS. 8*a*-8*d* (collectively "FIG. 8") represent steps in Choi's process for fabricating IGFET 80. Referring to FIG. 8*a*, precursor layers 44P and 46P respectively to gate dielectric layer 44 and polysilicon gate electrode 46 are successively formed along lightly doped p-type monosilicon wafer 34P that constitutes a precursor to body-material portion 34. A layer of pad oxide is deposited on precursor gate-electrode layer 46P and patterned to produce pad oxide layer 82. A layer of silicon nitride is deposited on top of the structure and partially removed to produce nitride region 84 that laterally abuts pad oxide 82 and leaves part of gate-electrode layer 46P exposed.

After removing the exposed part of gate-electrode layer 46P, arsenic and boron difluoride are ion implanted through the exposed part of dielectric layer 44P to define precursors 26EP and 40P respectively to n+ source extension 26E and p+ source-side halo pocket 40 as indicated in FIG. 8*b*. Nitride region 84 is converted into silicon nitride region 86 that laterally abuts pad oxide 82 and covers the previously exposed part of dielectric layer 44P. See FIG. 8*c*. After removing pad oxide 82, the exposed part of gate-electrode layer 46P is removed to leave the remainder of layer 46P in the shape of gate electrode 46 as shown in FIG. 8*d*. Another part of dielectric layer 44P is thereby exposed. Arsenic is ion implanted through the newly exposed part of dielectric layer 44P to define precursor 28EP to n+ drain extension 28E. In later steps (not shown), nitride 86 is removed, gate sidewall spacers 48 and 50 are formed, arsenic is ion implanted to define n++ main S/D portions 26M and 28M, and a rapid thermal anneal is performed to produce IGFET 80 as shown in FIG. 7.

Choi's decoupling of the source-extension and drain-extension implants and then forming source extension 26E at a considerably higher doping than drain extension 28E in order to alleviate the increased source-associated parasitic capacitance resulting from source-side halo pocket 40 is clearly advantageous. However, Choi's coupling of the formation of gate electrode 46 with the formation of source/drain extensions 26E and 28E in the process of FIG. 8 is laborious and could make it difficult to incorporate Choi's process into a larger semiconductor process that provides other types of IGFETs. It would be desirable to have a simpler technique for making such an asymmetric IGFET. In particular, it would be desirable to decouple the gate-electrode formation from the formation of differently doped source/drain extensions.

The conventional IGFETs dealt with above generally operate across a voltage range of several volts down to two volts or less. Some IGFET fabrication platforms furnish these IGFETs in "high-voltage" and "low-voltage" forms. The high-voltage IGFETs operate across several volts, e.g., 3-5 volts. The low-voltage IGFETs simply operate across a smaller voltage range than the high-voltage IGFETs in any particular semiconductor structure containing both types of IGFETs. The gate dielectric layer thickness is typically greater for the high-voltage IGFETs than for the low-voltage IGFETs so that the high-voltage IGFETs can withstand higher voltages. The high-voltage IGFETs normally have threshold voltages of greater magnitude than the low-voltage IGFETs.

Some IC applications require considerably higher operating voltage ranges, e.g., ranges up to 10 volts or more. While it might be possible to make relatively minor modifications in the IGFETs dealt with above so as to accommodate such extended operating voltage ranges, better performance is typically achieved by using IGFETs of significantly different configurations. Asymmetric IGFETs which employ the general IGFET configuration referred to as extended-drain (or drain-extended) MOS are particularly suitable for operating across voltage ranges of 10 volts or more. Extended-drain IGFETS, often referred to as laterally diffused MOS ("LDMOS"), are described in (a) Brisbin et al., "Hot-Carrier Reliability and Design of N-LDMOS Transistor Arrays", 2001 *IEEE Intg. Reliability Workshop Final Report,* 15-18 Oct. 2001, pp. 44-48, (b) Wang et al., "Effect of Layout Orientation on the Performance and Reliability of High Voltage N-LDMOS in Standard Submicron Logic STI CMOS Process", *Procs. IEEE* 43rd *Ann.* 2005 *Int'l Reliability Phys. Symp.,* 17-21 Apr. 2005, pp. 654-655, (c) Tsui et al., "A Volatile Half-Micron Complementary BiCMOS Technology for Microprocessor-Based Smart Power Applications", *IEEE Trans. Elec. Devs.*, March 1995, pp. 564-570, and (d) Smayling et al., "A Modular Merged Technology Process including Submicron CMOS Logic, Nonvolatile Memories, Linear Functions, and Power Components", *Procs IEEE* 1993 *Custom Integrated Circuits Conf.,* 9-12 May 1993, pp. 24.5.1-24.5.4.

FIG. 9 illustrates n-channel extended-drain IGFET 90 of Brisbin et al., cited above, using the same reference symbols as used for IGFET 70 or 72 to identify corresponding regions. Main source portion 26M and more lightly doped source extension 26E of n-type source 26 in IGFET 90 are indicated here as being respectively at the "n+" and "n" doping levels rather than respectively at the "n++" and "n+" doping levels used in FIGS. 6*a* and 6*b* for IGFETs 70 and 72. Moderately doped p-type body region 92 formed by introducing p-type body semiconductor dopant into part of the semiconductor body extends along source 26 up to gate dielectric layer 44. Electrical contact to p body region 92 is made via heavily doped p-type body contact portion 94.

N-type drain 28 of IGFET 90 consists of lightly doped drift region 28D, moderately doped intermediate layer 28L, heavily doped surface-adjoining drain contact portion 28C, and heavily doped buried layer 28B. Although not stated in Brisbin, n− drift region 28D is presumably part of a lightly doped n-type epitaxial layer and is thus not formed by a separate doping operation. Drift region 28D extends up to gate dielectric layer 44 and is laterally separated from n+ drain contact portion 28C by part of recessed field insulation 22. Intermediate n layer 28L extends from contact portion 28C along that part of field insulation 22 down to drift region 28D. Polysilicon gate electrode 46 extends partway over that part of insulation 22 in IGFET 90.

N-channel IGFET 96 of Wang et al., cited above, is depicted in FIG. 10 again using the same reference symbols as used for IGFET 70 or 72 to identify corresponding regions. In IGFET 96, source 26 is simply a heavily doped n-type region and does not have a more lightly doped lateral extension. Body region 92 of IGFET 96 is a moderately doped p-type well electrically connected to the upper semiconductor surface via p+ body contact portion 94.

N-type drain 28 of IGFET 96 consists of moderately doped well 28W and heavily doped drain contact portion 28C. N well 28W extends up to gate dielectric layer 44. Recessed field insulation 22 laterally surrounds n+ drain contact portion 28C so that part of field insulation 22 laterally separates drain contact portion 28C from where n well 28W meets gate dielectric 44. As in IGFET 90, polysilicon gate electrode 46 extends partway over the part of insulation 22 in IGFET 96.

The term "mixed signal" refers to ICs containing both digital and analog circuitry blocks. The digital circuitry typically employs the most aggressively scaled n-channel and p-channel IGFETs for obtaining the maximum potential digital speed at given current leakage specifications. The analog circuitry utilizes IGFETs and/or bipolar transistors subjected to different performance requirements than the digital IGFETs. Requirements for the analog IGFETs commonly include high linear voltage gain, good small-signal and large-signal frequency response at high frequency, good parameter matching, low input noise, well controlled electrical parameters for active and passive components, and reduced parasitics, especially reduced parasitic capacitances. Although it would be economically attractive to utilize the same transistors for the analog and digital blocks, doing so would typically lead to weakened analog performance. Many requirements imposed on analog IGFET performance conflict with the results of digital scaling.

More particularly, the electrical parameters of analog IGFETs are subjected to more rigorous specifications than the IGFETs in digital blocks. In an analog IGFET used as an amplifier, the output resistance of the IGFET needs to be maximized in order to maximize its intrinsic gain. The output resistance is also important in setting the high-frequency performance of an analog IGFET. In contrast, the output resistance is considerably less importance in digital circuitry. Reduced values of output resistance in digital circuitry can be tolerated in exchange for higher current drive and consequent higher digital switching speed as long as the digital circuitry can distinguish its logic states, e.g., logical "0" and logical "1".

The shapes of the electrical signals passing through analog transistors are critical to circuit performance and normally have to be maintained as free of harmonic distortions and noise as reasonably possible. Harmonic distortions are caused primarily by non-linearity of transistor gain and transistor capacitances. Hence, linearity demands on analog transistors are very high. The parasitic capacitances at pn junctions have inherent voltage non-linearities that need to be alleviated in analog blocks. Conversely, signal linearity is normally of secondary importance in digital circuitry.

The small-signal analog speed performance of IGFETs used in analog amplifiers is determined at the small-signal frequency limit and involves the small-signal gain and the parasitic capacitances along the pn junctions for the source and drain. The large-signal analog speed performance of analog amplifier IGFETS is similarly determined at the large-signal frequency limit and involves the non-linearities of the IGFET characteristics.

The digital speed of logic gates is defined in terms of the large-signal switching time of the transistor/load combination, thereby involving the drive current and output capacitance. Hence, analog speed performance is determined differently than digital speed performance. Optimizations for analog and digital speeds can be different, leading to different transistor parameter requirements.

Digital circuitry blocks predominantly use the smallest IGFETs that can be fabricated. Because the resultant dimensional spreads are inherently large, parameter matching in digital circuitry is often relatively poor. In contrast, good parameter matching is usually needed in analog circuitry to achieve the requisite performance. This typically requires that analog transistors be fabricated at greater dimensions than digital IGFETs subject to making analog IGFETS as short as possible in order to have source-to-drain propagation delay as low as possible.

In view of the preceding considerations, it is desirable to have a semiconductor fabrication platform that provides IGFETs with good analog characteristics. The analog IGFETs should have high intrinsic gain, high output resistance, high small-signal switching speed with reduced parasitic capacitances, especially reduced parasitic capacitances along the source-body and drain-body junctions. It is also desirable that the fabrication platform be capable of providing high-performance digital IGFETs.

GENERAL DISCLOSURE OF THE INVENTION

The present invention furnishes a process for manufacturing a high-performance asymmetric IGFET suitable for analog applications. The asymmetric IGFET is capable of being positioned next to one or more other IGFETs at a high IGFET packing density.

The present IGFET is fabricated from a semiconductor body having body material of a first conductivity type. In accordance with the invention, a gate electrode is defined above, and vertically separated by a gate dielectric layer from, a portion of the body material intended to be the IGFET's channel zone such that the gate electrode has opposing first and second lateral sides. Using the gate electrode and any material along its lateral sides as a dopant-blocking shield, pocket semiconductor dopant of the first conductivity type is introduced into the body material to define a precursor pocket portion of the body material more heavily doped than laterally adjacent material of the body material. The precursor pocket portion (or precursor halo portion) substantially extends below only the first of the gate electrode's lateral sides. The introduction of the pocket dopant normally entails ion implanting the dopant.

Again using the gate electrode and any material along its lateral sides as a dopant-blocking shield, first S/D-extension semiconductor dopant of a second conductivity type opposite to the first conductivity type is preferably introduced into the semiconductor body to define a precursor first lateral S/D extension of the second conductivity type where "S/D" again means source/drain. The precursor first lateral S/D extension substantially extends below only the first of the gate electrode's lateral sides. The introduction of the first S/D-extension dopant can be performed before or after the introduction of the pocket dopant.

A spacer is provided along the first lateral side of the gate electrode. The spacer is formed with (i) a vertically extending dielectric spacer portion situated along the gate electrode, (ii) a laterally extending dielectric spacer portion continuous with the vertically extending spacer portion and situated along the semiconductor body, and (iii) a filler spacer portion largely occupying the space between the vertically and laterally extending spacer portions. At this point in the fabrication process of the invention, the spacer is generally of a curved triangular shape.

Main S/D semiconductor dopant of the second conductivity type is subsequently introduced into the semiconductor body to define first and second main S/D portions of the second conductivity type using the gate electrode, the spacer, and any other material along the gate electrode's lateral sides as a dopant-blocking shield. The channel zone is thereby situated between the main S/D portions. As a result of the main S/D and pocket dopant introductions, a further pocket portion of the first conductivity type formed with material of at least part of the precursor pocket portion extends to the first main S/D portion. The further pocket portion causes the channel zone to be longitudinally asymmetric. In the preferred case where the first S/D-extension dopant is introduced earlier into the semiconductor body, a first S/D zone of the second conductivity type includes the first main S/D portion and a laterally adjoining further first lateral S/D extension more lightly doped than the first main S/D portion and constituted by material of at least part of the precursor first S/D extension.

The filler spacer portion is subsequently substantially removed. This changes the spacer from a generally curved triangular shape to a generally L shape. With the filler spacer portion removed, a pair of electrical contacts to the main S/D portions are formed.

Ion implantation of the pocket dopant into the semiconductor body can cause (temporary) damage to the semiconductor lattice, especially when the IGFET is a p-channel device with the pocket dopant being a relatively large atom such as arsenic. If the spacer were L shaped during the later introduction of the main S/D dopant, some of the main S/D dopant might pass through the laterally extending portion of the spacer and into semiconductor material intended to be the channel zone and/or into semiconductor material close to the intended location of the channel zone. Due to the semiconductor lattice damage caused by the earlier ion implantation of the pocket dopant, diffusion of the main S/D dopant would be enhanced. Some of the main S/D dopant might then penetrate further into semiconductor material intended to be the channel zone. The presence of this main S/D dopant in semiconductor material intended to be the channel zone would degrade the IGFET's characteristics, e.g., by undesirably shortening the channel zone.

By employing the fabrication process of the invention in which the main S/D dopant is introduced into the semiconductor body while the spacer is in a curved triangular shape, the filler spacer portion occupying the space between the spacer's vertically and laterally extending portions significantly reduces the amount of main S/D dopant entering semiconductor material intended to be the channel zone. IGFET degradation which could otherwise result from main S/D dopant in semiconductor material intended to be the channel zone and which could otherwise be increased due to ion implantation of the pocket dopant is significantly reduced. The later removal of the filler spacer portion prior to forming electrical contacts to the main S/D portions facilitates forming the contacts to the main S/D portions. This enables the IGFET packing density to be increased.

In addition to the structural features resulting from the preceding fabrication steps, the asymmetric IGFET can be further configured in various ways. For instance, the IGFET can be provided with a second lateral S/D extension which extends below the second lateral side of the gate electrode and which is more lightly doped than the second main S/D portion. A second spacer is then provided along the gate electrode's second lateral side and is processed in the same way as the first-mentioned spacer. Alternatively, the IGFET can be provided in an extended-drain configuration.

The first and second main S/D portions normally respectively function as a main source portion and a main drain portion. In that case, the pocket portion is a source-side pocket portion. When the IGFET has two lateral extensions respectively functioning as source and drain extensions, the drain extension is preferably more lightly doped than the source extension. This reduces damaging drain-side hot-carrier injection into the gate dielectric layer while enabling the IGFET to have a high transconductance in the presence of the source resistance.

In short, the IGFET fabrication process of the invention enables the IGFET packing density to be high while avoiding phenomenon that degrade the IGFET channel characteristics. The performance of the asymmetric IGFET manufactured according to the invention is very high, especially for analog applications. The IGFET's cut-off frequency is increased. The operating-current-dependant peak value of the cut-off frequency is likewise increased. IGFET matching is considerably improved. The invention thus provides a significant advance over the prior art.

BRIEF DESCRIPTION OF THE DRAWINGS

FIGS. 11.1 and 11.2 are front cross-sectional views of two portions of a CIGFET semiconductor structure configured according to the invention.

FIGS. 14*a*-14*c*, 14*d*.1-14*u*.1, and 14*d*.2-14*u*.2 are front cross-sectional views representing steps in manufacturing the two portions of the CIGFET semiconductor structure of FIGS. 11.1 and 11.2 in accordance with the invention. The steps of FIGS. 14*a*-14*c* apply to the structural portions illustrated in both of FIGS. 11.1 and 11.2. FIGS. 14*d*.1-14*u*.1 present further steps leading to the structural portion of FIG. 11.1. FIGS. 14*d*.2-14*u*.2 present further steps leading to the structural portion of FIG. 11.2.

Figure 1:
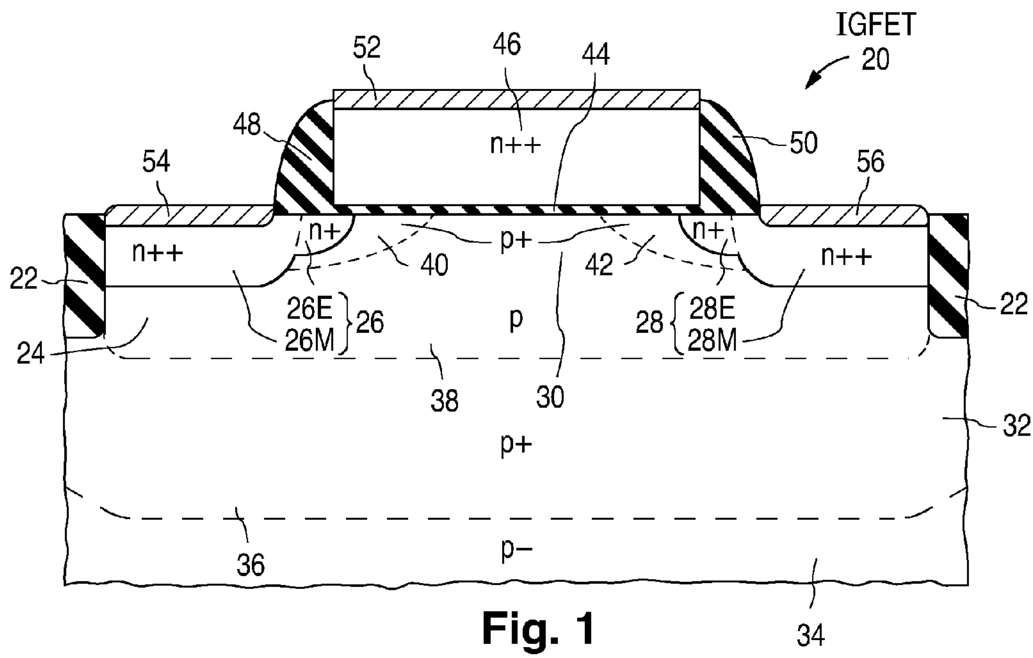
FIG. 1 is a front cross-sectional view of a prior art symmetric long n-channel IGFET that uses a filled well.
Figure 2A:
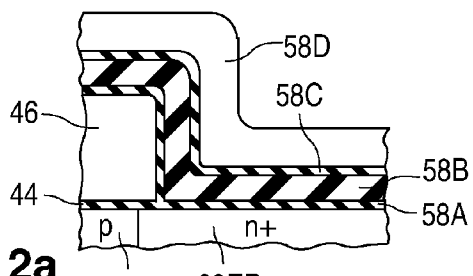
FIGS. 2*a*-2*d* are front cross-sectional views representing steps involving the use of an L-shaped spacer in a conventional process for manufacturing an n-channel IGFET.
Figure 2C:
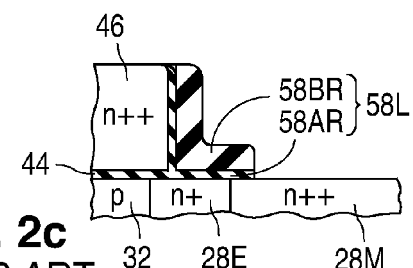
Figure 2B:
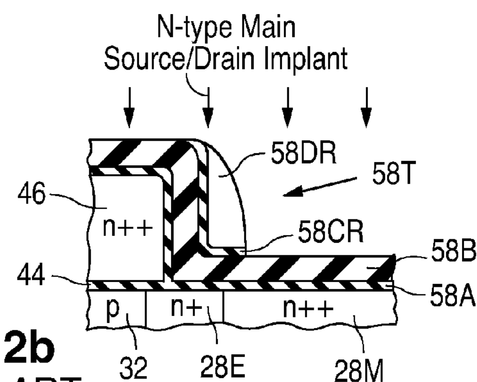
Figure 2D:
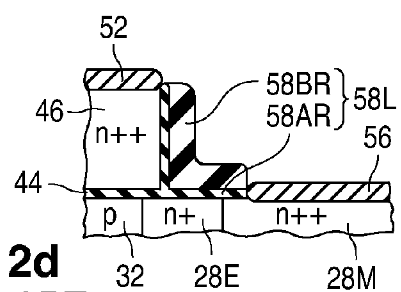
Figure 3:
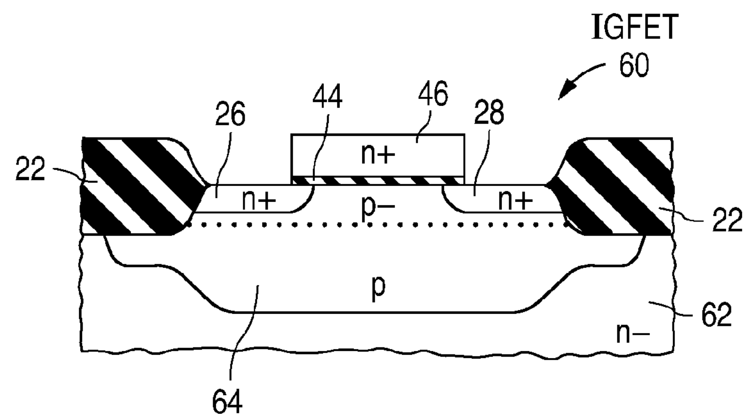
FIG. 3 is a front cross-sectional view of a prior art symmetric long n-channel IGFET that uses a retrograde empty well.
Figure 4:
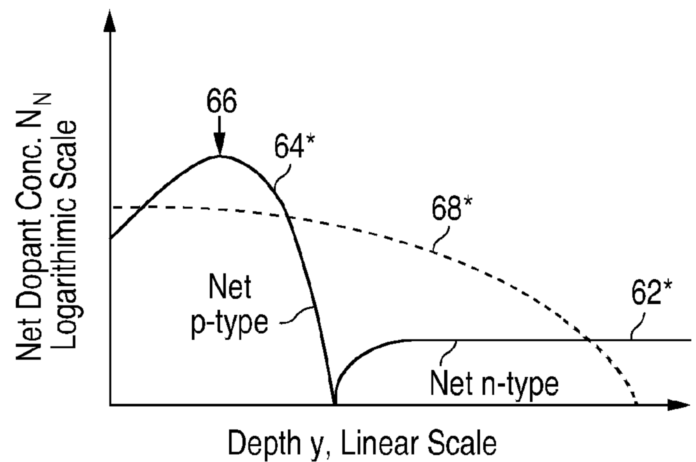
FIGS. 4 and 5 respectively are qualitative and quantitative graphs of net dopant concentration as a function of depth along a vertical line through the longitudinal center of the IGFET of FIG. 3.
Figure 5:
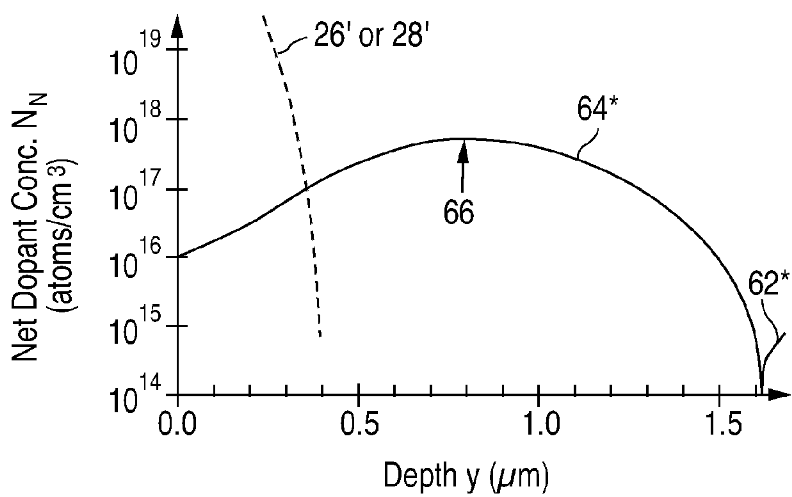
Figure 6A:
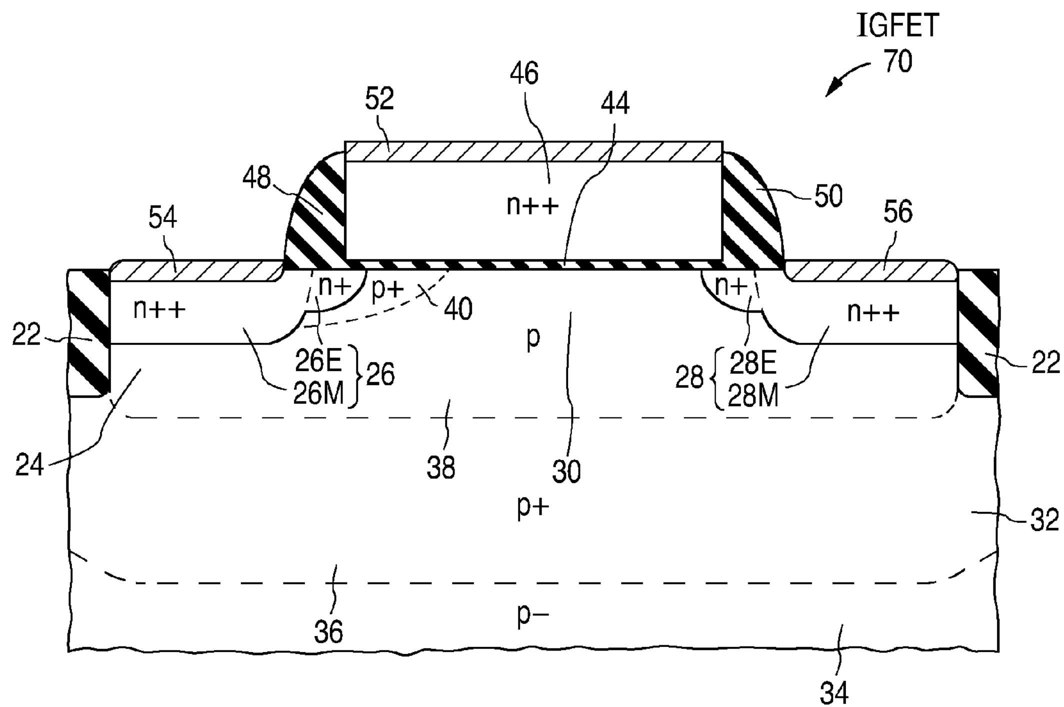
FIGS. 6*a* and 6*b* are front cross-sectional views of respective prior art asymmetric long and short n-channel IGFETs.
Figure 6B:
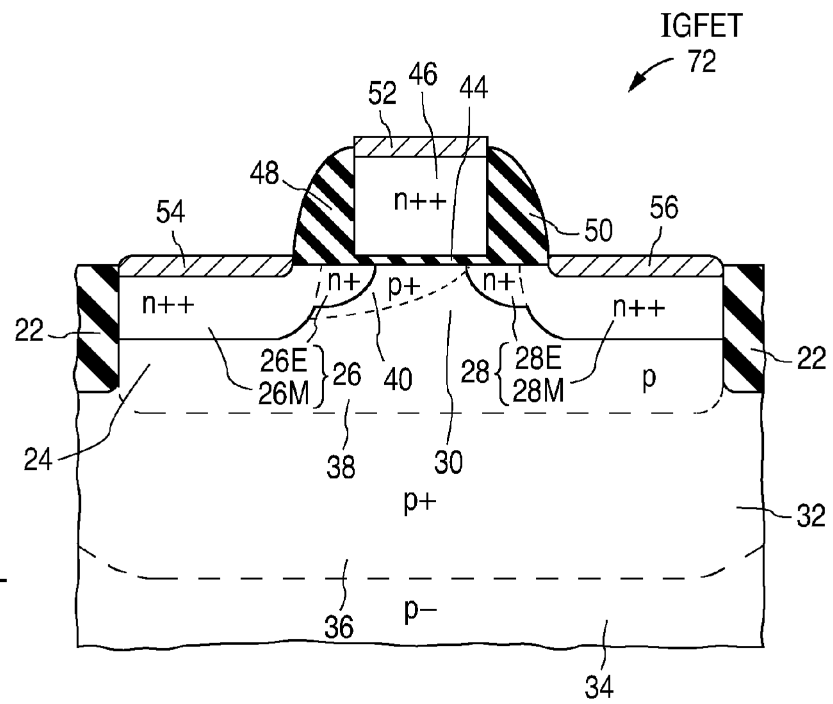
Figure 7:
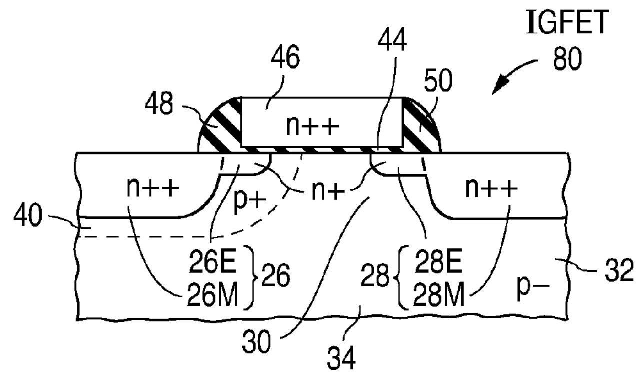
FIG. 7 is a front cross-sectional view of a prior art asymmetric long n-channel IGFET.
Figure 8A:
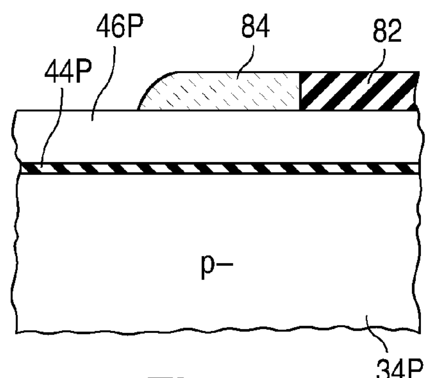
FIGS. 8*a*-8*d* are front cross-sectional views representing steps in manufacturing the IGFET of FIG. 7.
Figure 8C:
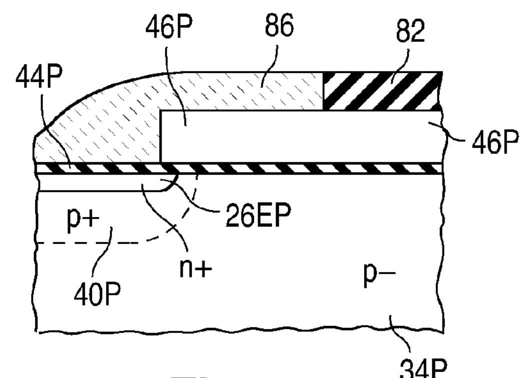
Figure 8B:
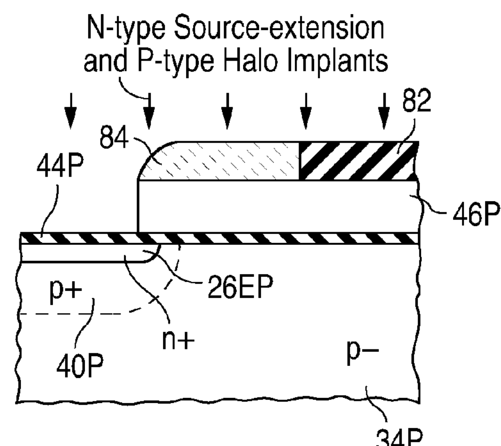
Figure 8D:
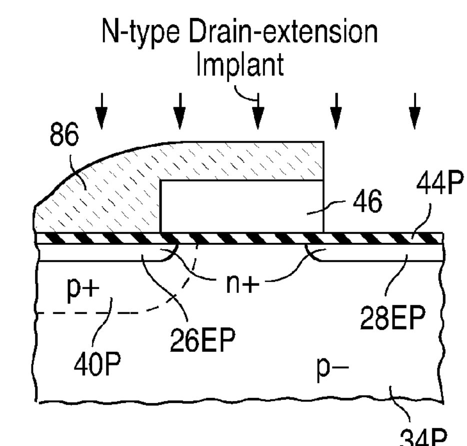
Figure 9:
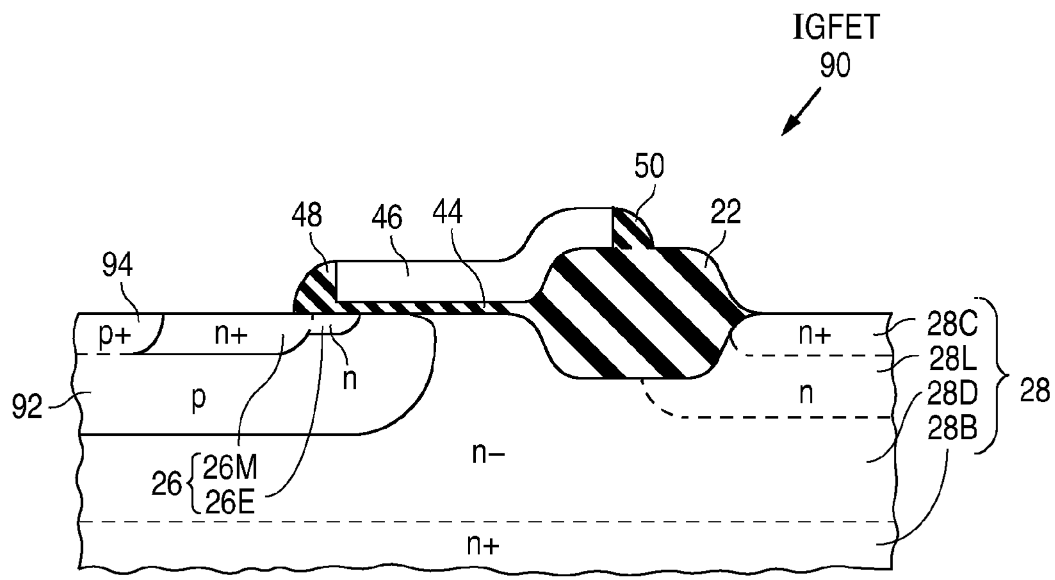
FIGS. 9 and 10 are front cross-sectional views of prior art extended-drain n-channel IGFETs.
Figure 10:
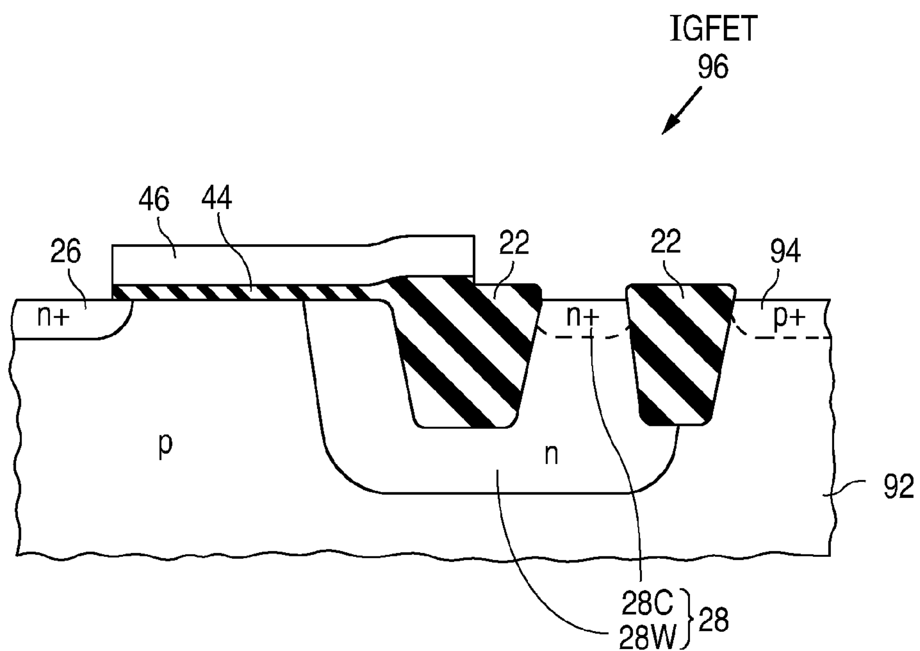

Like reference symbols are employed in the drawings and in the description of the preferred embodiments to represent the same, or very similar, item or items. The letter "P" at the end of a reference symbol in a drawing representing a step in a fabrication process indicates a precursor to a region which is shown in a drawing representing a later stage, including the end, of the fabrication process and which is identified in that later-stage drawing by the portion of the reference symbol preceding "P".

In instances where the conductivity type of a semiconductor region is determined by semiconductor dopant introduced into the region at a single set of dopant-introduction conditions, i.e., in essentially a single doping operation, and in which the concentration of the dopant varies from one general doping level, e.g., moderate indicated by "p" or "n", to another general dopant level, e.g., light indicated by "p−" or "n−", across the region, the portions of the region at the two doping levels are generally indicated by a dotted line. Dot-and-dash lines in cross-sectional views of IGFETs represent locations for dopant distributions in the vertical dopant-distribution graphs. Maximum dopant concentrations in cross-sectional views of IGFETs are indicated by dash-and double-dot lines containing the abbreviation "MAX".

The thicknesses of dielectric layers, especially gate dielectric layers, are much less than the dimensions of many other IGFET elements and regions. To clearly indicate dielectric layers, their thicknesses are generally exaggerated in the cross-sectional views of IGFETs.

DESCRIPTION OF THE PREFERRED EMBODIMENTS

List of Contents

A. Reference Notation and Other Preliminary Information
B. Complementary-IGFET Structures Suitable for Mixed-signal Applications
C. Well Architecture and Doping Characteristics
D. Asymmetric High-voltage IGFETs
  D1. Structure of Asymmetric High-voltage N-channel IGFET
  D2. Source/Drain Extensions of Asymmetric High-voltage N-channel IGFET
  D3. Structure of Asymmetric High-voltage P-channel IGFET
  D4. Source/Drain Extensions of Asymmetric High-voltage P-channel IGFET
E. Extended-drain IGFETs
  E1. Structure of Extended-drain N-channel IGFET
  E2. Operational Physics of Extended-drain N-channel IGFET
  E3. Structure of Extended-drain P-channel IGFET
  E4. Operational Physics of Extended-drain P-channel IGFET
F. Information Generally Applicable to All of Present IGFETs
G. Fabrication of Complementary-IGFET Structure Suitable for Mixed-signal Applications
  G1. General Fabrication Information
  G2. Well Formation
  G3. Gate Formation G4. Formation of Source/Drain Extensions and Halo Pocket Portions
G5. Formation of Gate Sidewall Spacers and Main Portions of Source/Drain Zones
G6. Final Processing
G7. Advantages of Spacer Shaping Sequence
H. Variations A. Reference Notation and Other Preliminary Information The reference symbols employed below and in the drawings have the following meanings where the adjective "lineal" means per unit IGFET width:

$L_{DR}$≡drawn value of channel length as given by drawn value of gate length
$L_{WW}$≡well-to-well separation distance for extended-drain IGFET
N'≡dosage of ions received by ion-implanted material
$N'_{max}$≡maximum dosage of ions received by ion-implanted material in approximate one-quadrant implantation
$N'_1$≡minimum dosage of ions received by ion-implanted material in approximate one-quadrant implantation
$t_{GdH}$≡high value of average gate dielectric thickness
$t_{GdL}$≡low value of average gate dielectric thickness
$V_{BD}$≡breakdown voltage
$V_{DS}$≡drain-to-source voltage
$V_{GS}$≡gate-to-source voltage
$V_T$≡threshold voltage
$x_{DEOL}$≡amount by which by which gate electrode overlaps drain extension
$x_{SEOL}$≡amount by which by which gate electrode overlaps source extension
y≡depth or vertical distance
$y_D$≡maximum depth of drain
$y_{DE}$≡maximum depth of drain extension
$y_{DEPK}$≡average depth at location, in lateral drain extension, of maximum (peak) concentration of semiconductor dopant of same conductivity type as lateral drain extension
$y_{DM}$≡maximum depth of main drain portion
$y_{DNWPK}$≡average depth at location of maximum (peak) concentration of deep n well semiconductor dopant
$y_{NWPK}$≡average depth at location of maximum (peak) concentration of n-type empty main well semiconductor dopant
$y_{PWPK}$≡average depth at location of maximum (peak) concentration of p-type empty main well semiconductor dopant
$y_S$≡maximum depth of source
$y_{SD}$≡maximum depth of source/drain zone
$y_{SE}$≡maximum depth of source extension
$y_{SEPK}$≡average depth at location, in lateral source extension, of maximum (peak) concentration of semiconductor dopant of same conductivity type as lateral source extension
$y_{SM}$≡maximum depth of main source portion
α≡tilt angle from vertical for ion implanting semiconductor dopant
β≡azimuthal angle relative to one principal lateral direction of semiconductor body
$\beta_0$≡base value of azimuthal angle increased in three 90° increments As used below, the term "surface-adjoining" means adjoining (or extending to) the upper semiconductor surface, i.e., the upper surface of a semiconductor body consisting of monocrystalline, or largely monocrystalline, semiconductor material. All references to depths into doped monocrystalline semiconductor material mean depths below the upper semiconductor surface except as otherwise indicated. Similarly, all references to one item extending deeper into monocrystalline semiconductor material than another item mean deeper in relation to the upper semiconductor surface except as otherwise indicated. Each depth or average depth of a location in a doped monocrystalline semiconductor region of an IGFET is, except as otherwise indicated, measured from a plane extending generally through the bottom of the IGFET's gate dielectric layer.

The boundary between two contiguous (or continuous) semiconductor regions of the same conductivity type is somewhat imprecise. Dashed lines are generally used in the drawings to indicate such boundaries. For quantitative purposes, the boundary between a semiconductor substrate region at the background dopant concentration and an adjoining semiconductor region formed by a doping operation to be of the same conductivity type as the substrate region is considered to be the location where the total dopant concentration is twice the background dopant concentration. The boundary between two contiguous semiconductor regions formed by doping operations to be of the same conductivity type is similarly considered to be the location where the total concentrations of the dopants used to form the two regions are equal.

An IGFET is characterized by two orthogonal lateral (horizontal) directions, i.e., two directions extending perpendicular to each other in a plane extending generally parallel to the upper (or lower) semiconductor surface. These two lateral directions are referred to here as the longitudinal and transverse directions. The longitudinal direction is the direction of the length of the IGFET, i.e., the direction from either of its source/drain (again "S/D") zones to the other of its S/D zones. The transverse direction is the direction of the IGFET's width.

The semiconductor body containing the IGFETs has two principal orthogonal lateral (horizontal) directions, i.e., two directions extending perpendicular to each other in a plane extending generally parallel to the upper (or lower) semiconductor surface. The IGFETs in an implementation of any of the present CIGFET structures are normally laid out on the semiconductor body so that the longitudinal direction of each IGFET extends in one of the semiconductor body's principal lateral directions. For instance, the longitudinal directions of some of the IGFETs can extend in one of the semiconductor body's principal lateral directions while the longitudinal directions of the other IGFETs extend in the other of the semiconductor body's principal lateral directions.

An IGFET, whether symmetric or asymmetric, has two biased states (or conditions) referred to as the "biased-on" and "biased-off" states in which a driving potential (voltage) is present between the S/D zone acting as the source and the S/D zone acting as the drain. For simplicity in explaining the two biased states, the source-acting and drain-acting S/D zones are respectively referred to here as the source and drain. In the biased-on state, the IGFET is conductive with voltage $V_{GS}$ between the IGFET's gate electrode and source at such a value that charge carriers flow freely from the source through the channel to the drain under the influence of the driving potential. The charge carriers are electrons when the IGFET is of n-channel type and holes when the IGFET is of p-channel type.

The IGFET is non-conductive in the biased-off state with gate-to-source voltage $V_{GS}$ at such a value that charge carriers do not significantly flow from the source through the channel to the drain despite the presence of the driving potential between the source and the drain as long as the magnitude (absolute value) of the driving potential is not high enough to cause IGFET breakdown. The charge carriers again are electrons for an n-channel IGFET and holes for a p-channel IGFET. In the biased-off state, the source and drain are thus biased so that the charge carriers would flow freely from the source through the channel to the drain if gate-to-source voltage $V_{GS}$ were at such a value as to place the IGFET in the biased-on state.

More specifically, an n-channel IGFET is in the biased-on state when (a) its drain is at a suitable positive potential relative to its source and (b) its gate-to-source voltage $V_{GS}$ equals or exceeds its threshold voltage $V_T$. Electrons then flow from the source through the channel to the drain. Since electrons are negative charge carriers, positive current flow is from the drain to the source. An n-channel IGFET is in the biased-off state when its drain is at a positive driving potential relative to its source but its gate-to-source voltage $V_{GS}$ is less than its threshold voltage $V_T$ so that there is no significant electron flow from the source through the channel to the drain as long as the positive driving potential is not high enough to cause drain-to-source breakdown. Threshold voltage $V_T$ is generally positive for an enhancement-mode n-channel IGFET and negative for a depletion-mode n-channel IGFET.

In a complementary manner, a p-channel IGFET is in the biased-on state when (a) its drain is at a suitable negative potential relative to its source and (b) its gate-to-source voltage $V_{GS}$ is less than or equals its threshold voltage $V_T$. Holes flow from the source through the channel to the drain. Inasmuch as holes are positive charge carriers, positive current flow is from the source to the drain. A p-channel IGFET is in the biased-off state when its drain is at a negative potential relative to its source but its gate-to-source voltage $V_{GS}$ is greater than its threshold voltage $V_T$ so that there is no significant flow of holes from the source through the channel to the drain as long as the magnitude of the negative driving potential is not high enough to cause drain-to-source breakdown. Threshold voltage $V_T$ is generally negative for an enhancement-mode p-channel IGFET and positive for a depletion-mode p-channel IGFET.

Charge carriers in semiconductor material generally mean both electrons and holes. References to charge carriers traveling in the direction of the local electric field mean that holes travel generally in the direction of the local electric field vector and that electrons travel in the opposite direction to the local electric field vector.

The expressions "maximum concentration" and "concentration maximum", as used here in singular or plural form, are generally interchangeable, i.e., have the same meaning except as otherwise indicated.

The semiconductor dopant which determines the conductivity type of the body material of an IGFET is conveniently denominated as the body-material dopant. When the IGFET employs a well region, the body-material dopant includes the semiconductor well dopant or dopants. The vertical dopant profile below a S/D zone of an IGFET is referred to as "hypoabrupt" when the concentration of the body-material dopant reaches a subsurface maximum along an underlying body-material location no more than 10 times deeper below the upper semiconductor surface than that S/D zone and decreases by at least a factor of 10 in moving from the subsurface location of the maximum concentration of the body-material dopant upward to that S/D zone, i.e., to the pn junction for that S/D zone, along an imaginary vertical line extending from the subsurface location of the maximum concentration of the body-material dopant through that S/D zone. See any of U.S. Pat. No. 7,419,863 B1 and U.S. Patent Publications 2008/0311717 A1 and 2008/0308878 A1 (all Bulucea). The pn junction for an S/D zone having an underlying hypoabrupt vertical dopant profile is, for simplicity, sometimes termed a hypoabrupt junction.

In a complementary manner, the vertical dopant profile below a S/D zone of an IGFET is referred to as "non-hypoabrupt" when the concentration of the body-material dopant reaches a subsurface maximum along an underlying body-material location no more than 10 times deeper below the upper semiconductor surface than that S/D zone but decreases by less than a factor of 10 in moving from the subsurface location of the maximum concentration of the body-material dopant upward to the pn junction for that S/D zone along an imaginary vertical line extending from the subsurface location of the maximum concentration of the body-material dopant through that S/D zone. The pn junction for an S/D zone having an underlying non-hypoabrupt vertical dopant profile is, for simplicity, sometimes referred to as a non-hypoabrupt junction.

B. Complementary-IGFET Structures Suitable for Mixed-signal Applications

FIGS. 11.1 and 11.2 illustrate two portions of a complementary-IGFET (again "CIGFET") semiconductor structure configured according to the invention. More particularly, FIG. 11.1 depicts an asymmetric n-channel IGFET 100 and a similarly configured asymmetric p-channel IGFET 102. An asymmetric extended-drain n-channel IGFET 104 and a similarly configured asymmetric extended-drain p-channel IGFET 106 are pictured in FIG. 11.2. Due to its asymmetry, each IGFET 100, 102, 104, or 106 is normally used in situations where its channel-zone current flow is always in the same direction.

IGFETs 100, 102, 104, and 106 are designed to operate in two different voltage regimes. Asymmetric IGFETs 100 and 102, which are designed for unidirectional-current applications, operate across a voltage range of several volts, e.g., a nominal operational range of 3.0 V, and are often referred to here as "high-voltage" IGFETs. Extended-drain IGFETs 104 and 106 operate across a greater voltage range than high-voltage IGFETs 100 and 102, and are generally referred to here as "extended-voltage" IGFETs. The operational range for extended-drain extended-voltage IGFETs 104 and 106 is normally at least 10 V, e.g., nominally 12 V. Extended-drain IGFETs 104 and 106 are especially suitable for applications, such as power devices, high-voltage switches, electrically erasable programmable read-only memory ("EEPROM") programming circuitry, and electrostatic discharge ("ESD") protection devices, which utilize voltages greater than several volts.

The CIGFET semiconductor structure shown in FIGS. 11.1 and 11.2 (collectively "FIG. 11") is typically part of the CIGFET semiconductor structure described in U.S. patent application Ser. No. 12/382,973, cited above. The CIGFET structure of U.S. patent application Ser. No. 12/382,973 is referred to generally here as a larger CIGFET semiconductor structure because it contains symmetric IGFETs, referred to here as "low-voltage" IGFETs, which operate across a lower voltage range than asymmetric IGFETs 100 and 102 and thus across a considerably lower voltage range than extended-drain IGFETs 104 and 106. For example, the low-voltage symmetric IGFETs may operate across a nominal operational range of 1.2 V. The larger CIGFET structure also contains symmetric IGFETs which operate across the high voltage range of asymmetric IGFETs 100 and 102. The symmetric IGFETs are all suitable for digital circuitry applications. Nonetheless, any of the symmetric IGFETs can, as appropriate, be employed in analog circuitry applications.

The IGFETs in the larger CIGFET structure use gate dielectric layers of two different average nominal thicknesses, a high value $t_{GdH}$ and a low value $t_{GdL}$. The gate dielectric thickness for the high-voltage IGFETs, including asymmetric IGFETs 100 and 102, and for extended-drain extended-voltage very high voltage IGFETs 104 and 106 is high value $t_{GdH}$. For 3.0-V operation, high gate dielectric thickness $t_{GdH}$ is 4-8 nm, preferably 5-7 nm, typically 6-6.5 nm, when the gate dielectric material is silicon oxide or largely silicon oxide. The gate dielectric thickness for the low-voltage IGFETs is low value $t_{GdL}$. For 1.2-V operation, low gate dielectric thickness $t_{GdL}$ is 1-3 nm, preferably 1.5-2.5 nm, typically 2 nm, likewise when the gate dielectric material is silicon oxide or largely silicon oxide. All of the typical numerical values given below for the parameters of the IGFETs of FIG. 11 generally apply to an implementation of the present CIGFET semiconductor structure in which the gate dielectric layers have the preceding typical thickness values.

As described further below, asymmetric IGFETs 100 and 102 respectively use p-type and n-type wells. Some of the regions of extended-drain IGFETs 104 and 106 are defined by the dopant introductions used to form the p-type and n-type wells. Consequently, extended-drain IGFETs 104 and 106 effectively use p-type and n-type wells.

Asymmetric IGFETs 100 and 102 are depicted in FIG. 11 as using a common deep n well (discussed further below) formed in a starting region of lightly doped p-type monosilicon. The deep n well electrically isolates the p-type body region of n-channel IGFET 100 from the underlying p-monosilicon. This enables IGFET 100 to be electrically isolated from each other n-channel IGFET. Extending a deep n well used for an n-channel IGFET, such as IGFET 100, below an adjacent p-channel IGFET, such as IGFET 102 in the example of FIG. 11, typically enables the IGFET packing density to be increased. Alternatively, each IGFET 100 or 102 can be provided in a version that lacks a deep n well. In a preferred implementation, n-channel IGFET 100 uses a deep n well while p-channel IGFET 102 lacks a deep n well.

IGFETs 100, 102, 104, and 106 can alternatively be created from a starting region of lightly doped n-type monosilicon. In that event, the deep n wells can be replaced with corresponding deep p wells that perform the complementary functions to the deep n wells. The CIGFET structure of FIG. 11 may include lower-voltage versions of asymmetric high-voltage IGFETs 100 and 102 achieved primarily by suitably reducing the gate dielectric thickness and/or adjusting the doping conditions. All of the preceding comments about changing from a p− starting monosilicon region to an n− starting monosilicon region and using, or not using, deep p and n wells apply to these variations of IGFETs 100, 102, 104, and 106.

Circuit elements other than IGFETs 100, 102, 104, and 106, the above-described variations of IGFETs 100 and 102, and the symmetric IGFETs present in the larger CIGFET structure of U.S. patent application Ser. No. 12/382,973, cited above, may be provided in other parts (not shown) of the CIGFET structure of FIG. 11. For instance, bipolar transistors and diodes along with various types of resistors, capacitors, and/or inductors may be provided in the present CIGFET structure. The bipolar transistors may be configured as described in U.S. patent application Ser. No. 12/382,966, cited above.

The resistors may be monosilicon or polysilicon elements. Depending on the characteristics of the additional circuit elements, the CIGFET structure also contains suitable electrical isolation for the additional elements. Selected ones of IGFETs 100, 102, 104, and 106, the above-described variations of IGFETs 100 and 102 and the symmetric IGFETs for the larger CIGFET structure are typically present in any particular implementation of the CIGFET structure of FIG. 11.

In short, the architecture of the larger CIGFET structure provides IGFETs and other circuit elements suitable for mixed-signal IC applications.

C. Well Architecture and Doping Characteristics

The monosilicon elements of IGFETs 100, 102, 104, and 106 and each other IGFET incorporated into the CIGFET structure of FIG. 11 constitute parts of a doped monosilicon semiconductor body having a lightly doped p-type substrate region 136. A patterned field region 138 of electrically insulating material, typically consisting primarily of silicon oxide, is recessed into the upper surface of the semiconductor body. Field-insulation region 138 is depicted as being of the shallow trench isolation type in FIG. 11 but can be configured in other ways.

The recession of field-insulation region 138 into the upper semiconductor surface defines a group of laterally separated active semiconductor islands. Six such active islands 140, 142, 144A, 144B, 146A, and 146B appear in FIG. 11. Asymmetric IGFETs 100 and 102 respectively use islands 140 and 142. N-channel extended-drain IGFET 104 uses islands 144A and 144B. P-channel extended-drain IGFET 106 similarly uses islands 146A and 146B. In some embodiments, two or more of the IGFETs shown in FIG. 11 and the other IGFETs incorporated into the CIGFET structure of FIG. 11 utilize one of the active islands. This occurs, for instance, when two or more of the IGFETs share an element such as a source or drain.

The semiconductor body contains main well regions 180, 182, 184A, 184B, 186A, and 186B, deep moderately doped n-type well regions 210 and 212, an isolating moderately doped p-type well region 216, and other such well regions for the other IGFETs. Electrical contact to main well regions 180, 182, 184A, 184B, 186A, and 186B, deep n well regions 210 and 212, and substrate region 136 is made via additional laterally separated active semiconductor islands (not shown) defined along the upper semiconductor surface by field insulation 138.

Deep n well regions 210 and 212 respectively form isolating pn junctions 220 and 222 with p− substrate region 136. In so doing, deep n wells 210 and 212 extend deeper into the semiconductor body than the other well regions shown in FIG. 11. For this reason, main well regions 180, 182, 184A, 184B, 186A, and 186B and isolating well region 216 can be considered shallow wells.

Main well regions 180 and 184A are p-type wells respectively for n-channel IGFETs 100 and 104. Main well region 186B is a p-type well for p-channel IGFET 106. Main well regions 182 and 186A are n-type wells respectively for p-channel IGFETs 102 and 106. Main well region 184B is an n-type well for n-channel IGFET 104.

For convenience, FIG. 11 depicts all of main well regions 180, 182, 184A, 184B, 186A, and 186B as extending to the same depth into the semiconductor body. However, the depth of p-type main wells 180, 184A, and 186B can be slightly less than, or somewhat greater than, the depth of n-type main wells 182, 184B, and 186A. Also, certain of p-type main wells 180, 184A, and 186B extend deeper into the semiconductor body than others depending on whether each p-type main well 180, 184A, or 186B merges into p− substrate region 136 or meets a deep n well. Similarly, certain of n-type main wells 182, 184B, and 186A extend deeper into the semiconductor body than others depending on whether each n-type main well 182, 184B, or 186A meets p− substrate region 136 or merges into a deep n well.

In regard to the depth of a doped monosilicon region that merges into a lower doped monosilicon region of the same conductivity type, the depth of the upper monosilicon region is considered to occur at the location where the concentration of the semiconductor dopant which defines the upper region equals the concentration of the semiconductor dopant which defines the lower region. The depth of an n-type main well region, such as n-type main well 182 or 186A, that merges into a deeper n-type well region, such as deep n well 210 or 212, thus occurs at the location where the concentrations of the n-type semiconductor dopants which define the two n-type wells are the same. When p− substrate region 136 is created from p-type monosilicon of a substantially uniform background dopant concentration, the depth of a p-type well region, such as p-type main well 184A, which merges into substrate region 136 occurs at the location where the p-type well dopant concentration is twice the p-type background dopant concentration.

P-type main well region 180 constitutes the body material, or body-material region, for asymmetric high-voltage n-channel IGFET 100 and forms an isolating pn junction 224 with deep n well region 210. See FIG. 11.1. N-type main well region 182 merges into deep n well 210. The combination of n-type main well 182 and deep n well 210 forms the body material, or body-material region, for asymmetric high-voltage p-channel IGFET 102.

In an embodiment (not shown) where deep n well 210 underlies p-type main well region 180 of n-channel IGFET 100 but does not extend below p-channel IGFET 102, p-type main well 180 again forms the body material (region) for n-channel IGFET 100. However, n-type main well 182 then solely constitutes the body material (region) for p-channel IGFET 102 and forms a pn junction with substrate region 136. In an embodiment (also not shown) fully lacking deep n well 210, the combination of p-type main well 180 and p− substrate region 136 forms the body material for n-channel IGFET 100 while n-type main well 182 again constitutes the body material for p-channel IGFET 102 and forms a pn junction with substrate region 136.

P-type main well region 184A merges into p− substrate region 136 as shown in FIG. 11.2. The combination of p-type main well 184A and p− substrate region 136 forms the body material, or body-material region, for extended-drain n-channel IGFET 104. N-type main well region 184B of IGFET 104 forms, as discussed further below, a drain-body pn junction 226 with substrate region 136.

N-type main well region 186A merges into deep n well region 212. The combination of n-type main well 186A and deep n well 212 forms the body material, or body-material region, for extended-drain p-channel IGFET 106. P-type main well region 186B of IGFET 106 forms, as discussed further below, part of a drain-body pn junction 228 with deep n well 212.

P well region 216 is situated below field-insulation region 138 and between n-type main well region 184B of IGFET 104 and deep n well region 212 of IGFET 106. Because IGFETs 104 and 106 operate at very high voltages and are adjacent to each other in the example of FIG. 11.2, p well 216 electrically isolates IGFETs 104 and 106 from each other. P well 216 can be deleted in embodiments where extended-drain IGFETs 104 and 106 are not adjacent to each other.

Main well regions 180, 182, 184A, 184B, 186A, and 186B are all empty retrograde wells. More particularly, p-type main well 180 of asymmetric n-channel IGFET 100 is doped with p-type semiconductor dopant which is also present in that IGFET's S/D zones. The concentration of the p-type dopant (a) locally reaches a subsurface concentration maximum at a subsurface maximum concentration location extending laterally below largely all of each of the channel and S/D zones of IGFET 100 and (b) decreases by at least a factor of 10, preferably by at least a factor of 20, more preferably by at least a factor of 40, in moving upward from the subsurface maximum concentration location along a selected vertical location through a specified one of that IGFET's S/D zones to the upper semiconductor surface. The subsurface location of the maximum concentration of the p-type dopant in p-type main well 180 of IGFET 100 occurs no more than 10 times, preferably no more than 5 times, more preferably no more than 4 times, deeper than the maximum depth of that IGFET's specified S/D zone.

As discussed further below, a p-type halo pocket portion is present along the source of asymmetric IGFET 100. The specified S/D zone for IGFET 100 is typically its drain but can be its source or drain in an variation of IGFET 100 lacking a p-type halo pocket portion along the source.

Additionally, the concentration of the p-type dopant decreases substantially monotonically, typically by less than a factor of 10, in moving from the subsurface maximum concentration location in p-type empty main well 180 of n-channel IGFET 100 along the selected vertical location to that IGFET's specified S/D zone. Since the subsurface location of the maximum concentration of the p-type dopant in p-type main well 180 of IGFET 100 occurs no more than 10 times deeper than the maximum depth of that IGFET's specified S/D zone, the dopant profile below the specified S/D zone of IGFET 100 is typically non-hypoabrupt. The decrease in the concentration of the p-type dopant is normally substantially inflectionless, i.e., does not undergo any inflection, in moving from the subsurface maximum concentration location for IGFET 100 along the selected vertical location for IGFET 100 to its specified S/D zone.

The aforementioned local concentration maximum of the p-type dopant in p-type empty main well region 180 of n-channel IGFET 100 arises from the introduction of p-type semiconductor dopant, referred to here as the p-type empty main well dopant, into the semiconductor body. The halo pocket portion of asymmetric IGFET 100 is produced by additional p-type semiconductor dopant, referred to here as the p-type source halo (or channel-grading) dopant, introduced into the semiconductor body so as to reach an additional local concentration maximum at a considerably lesser depth than the concentration maximum produced by the p-type empty main well dopant. The p-type source halo dopant may also be referred to here as the p-type source-side halo pocket dopant or simply as the p-type source-side pocket dopant.

In addition to meeting the aforementioned p-type well concentration criteria, the concentration of the total p-type dopant in p-type empty main well region 180 of n-channel IGFET 100 preferably decreases substantially monotonically in moving from the pn junction for the IGFET's specified S/D zone along the selected vertical location to the upper semiconductor surface. Some pile-up of p-type semiconductor dopant may occasionally occur along the upper surface of the specified S/D zone of IGFET 100. If so, the concentration of the total p-type dopant in p-type empty main well 180 decreases substantially monotonically in moving from the pn junction for the specified S/D zone along the selected vertical location to a point no further from the upper semiconductor surface than 20% of the maximum depth of the pn junction for the specified S/D zone.

Similar to the dopant concentration characteristics of p-type empty main well region 180, n-type empty main well region 182 of p-channel IGFET 102 is doped with n-type semiconductor dopant which is also present in that IGFET's S/D zones. The concentration of the n-type dopant (a) locally reaches a subsurface concentration maximum at a subsurface maximum concentration location extending laterally below largely all of each of the channel and S/D zones of IGFET 102 and (b) decreases by at least a factor of 10, preferably by at least a factor of 20, more preferably by at least a factor of 40, in moving upward from the subsurface maximum concentration location along a selected vertical location through a specified one of that IGFET's S/D zones to the upper semiconductor surface. The subsurface location of the maximum concentration of the n-type dopant in n-type main well 182 of IGFET 102 occurs no more than 10 times, preferably no more than 5 times, more preferably no more than 4 times, deeper than the maximum depth of that IGFET's specified S/D zone.

An n-type halo pocket portion is, as discussed below, present along the source of asymmetric IGFET 102. The specified S/D zone for IGFET 102 is typically its drain but can be its source or drain in an variation of IGFET 102 lacking an n-type halo pocket portion along the source.

Also, the concentration of the n-type dopant decreases substantially monotonically, typically by less than a factor of 10, in moving from the subsurface maximum concentration location in n-type empty main well 182 of p-channel IGFET 102 along the selected vertical location for IGFET 102 to its specified S/D zone. Consequently, the dopant profile below the specified S/D zone of IGFET 102 is typically non-hypoabrupt. The decrease in the concentration of the n-type dopant is normally substantially inflectionless in moving from the subsurface maximum concentration location for IGFET 102 along the selected vertical location for IGFET 102 to its specified S/D zone.

The aforementioned local concentration maximum of the n-type dopant in n-type empty main well region 182 of n-channel IGFET 102 arises from the introduction of n-type semiconductor dopant, referred to here as the n-type empty main well dopant, into the semiconductor body. The n-type halo pocket of asymmetric IGFET 102 is produced by additional n-type semiconductor dopant, referred to here as n-type source halo (or channel-grading) dopant, introduced into the semiconductor body so as to reach an additional local concentration maximum at a considerably lesser depth than the concentration maximum produced by the n-type empty main well dopant. The n-type source halo dopant may also be referred to here as the n-type source-side halo pocket dopant or simply as the n-type source-side pocket dopant.

Besides meeting the aforementioned n-type well concentration criteria, the concentration of the total n-type dopant in n-type empty main well region 182 of n-channel IGFET 102 preferably decreases substantially monotonically in moving from the pn junction for the IGFET's specified S/D zone along the selected vertical location to the upper semiconductor surface. Some pile-up of n-type semiconductor dopant may occasionally occur along the top of the specified S/D zone of IGFET 102. In that case, the concentration of the total n-type dopant in n-type empty main well 182 decreases substantially monotonically in moving from the pn junction for the specified S/D zone along the selected vertical location to a point no further from the upper semiconductor surface than 20% of the maximum depth of the pn junction for the specified S/D zone.

Because main well regions 180 and 182 are empty wells, there is less total semiconductor dopant in the channel zones of IGFETs 100 and 102 than in the channel zones of otherwise comparable IGFETs that use filled main well regions. As a result, scattering of charge carriers (electrons for n-channel IGFETs and holes for p-channel IGFETs) due to collisions with dopant atoms occurs less in the crystal lattices of the channel zones of IGFETs 100 and 102 than in the crystal lattices of the otherwise comparable IGFETs having filled main wells. The mobilities of the charge carriers in the channel zones of IGFETs 100 and 102 are therefore increased. This enables asymmetric IGFETs 100 and 102 to have increased switching speed.

As to empty main well regions 184A, 184B, 186A, and 186B of extended-drain IGFETs 104 and 106, the concentration of the p-type semiconductor dopant in p-type empty main well 184A of n-channel IGFET 104 or p-type empty main well 186B of p-channel IGFET 106 (a) locally reaches a subsurface concentration maximum at a subsurface maximum concentration location in well 184A or 186B and (b) decreases by at least a factor of 10, preferably by at least a factor of 20, more preferably by at least a factor of 40, in moving upward from the subsurface maximum concentration location along a selected vertical location through that well 184A or 186B to the upper semiconductor surface. As discussed further below, the selected vertical location through well 184A for n-channel IGFET 104 is situated to the side of its halo pocket. The selected vertical location through well 186B for p-channel IGFET 106 extends through active island 146A. The concentration decrease of the p-type dopant along the selected vertical location in p-type main well 184A or 186B is normally substantially monotonic. The subsurface location of the maximum concentration of the p-type dopant in p-type main well 184A or 186B of IGFET 104 or 106 occurs no more than 10 times, preferably no more than 5 times, more preferably no more than 4 times, deeper than the maximum depth of that IGFET's source.

The aforementioned local concentration maxima of the p-type dopant in p-type empty main well regions 184A and 186B arise from the introduction of the p-type empty main well dopant into the semiconductor body. The concentration of the p-type dopant in each p-type empty main well 184A or 186B normally reaches an additional local concentration maximum at a considerably lesser depth than the concentration maximum produced by the p-type empty main well dopant in that well 184A or 186B. The shallow p-type empty-well concentration maximum in each p-type empty main well region 184A or 186B arises from additional p-type empty-well semiconductor dopant introduced into that p-type empty main well 184A or 186B and extends only partially laterally across that well 184A or 186B.

In a complementary manner, the concentration of the n-type semiconductor dopant in n-type empty main well region 184B of n-channel IGFET 104 or p-type empty main well region 186A of p-channel IGFET 106 similarly (a) locally reaches a subsurface concentration maximum at a subsurface maximum concentration location in empty main well 184B or 186A and (b) decreases by at least a factor of 10, preferably by at least a factor of 20, more preferably by at least a factor of 40, in moving upward from the subsurface maximum concentration location along a selected vertical location through that well 184B or 186A to the upper semiconductor surface. As discussed further below, the selected vertical location through well 184B for n-channel IGFET 104 extends through active island 144A. The selected vertical location through well 186A for p-channel IGFET 106 is situated to the side of its halo pocket. The concentration decrease of the n-type dopant along the selected vertical location in p-type main well 184B or 186A is normally substantially monotonic. The subsurface location of the maximum concentration of the n-type dopant in n-type main well 184B or 186A of IGFET 104 or 106 occurs no more than 10 times, preferably no more than 5 times, more preferably no more than 4 times, deeper than the maximum depth of that IGFET's source.

The aforementioned local concentration maxima of the n-type dopant in n-type empty main well regions 184B and 186A arise from the introduction of the n-type empty main well dopant into the semiconductor body. The concentration of the n-type dopant in each n-type empty main well 184B or 186A normally reaches an additional local concentration maximum at a considerably lesser depth than the concentration maximum produced by the n-type empty main well dopant in that well 184B or 186A. The shallow n-type empty-well concentration maximum in each n-type empty main well region 184B or 186A arises from additional n-type empty-well semiconductor dopant introduced into that n-type empty main well 184B or 186A and extends only partially laterally across that well 184B or 186A.

The dash-and-double-dot lines marked "MAX" in FIG. 11.2 indicate the subsurface locations of (a) the p-type deep local concentration maxima in p-type empty main well regions 184A and 186B and (b) the n-type deep local concentration maxima in n-type empty main well regions 184B and 186A. As indicated by these lines, the deep n-type concentration maximum in n-type empty main well 184B of extended-drain n-channel IGFET 104 occurs at approximately the same depth as the deep p-type concentration maximum in that IGFET's p-type empty main well 184A. Likewise, the deep p-type concentration maximum in p-type empty main well 186B of extended-drain p-channel IGFET 106 occurs at approximately the same depth as the deep n-type concentration maximum in n-type empty main well 186A of IGFET 106.

Empty main well regions 184B and 186B respectively serve, as discussed further below, partially or fully as the drains of extended-drain IGFETs 104 and 106. By configuring main wells 184B and 186B as empty retrograde wells, the maximum value of the electric field in each of IGFETs 104 and 106 occurs in the bulk of the monosilicon rather than along the upper semiconductor surface as commonly arises in conventional extended-drain IGFETs. In particular, the maximum value of the electric field in each IGFET 104 or 106 occurs along the pn junction between the drain and body material at, or close to, the subsurface location of the aforementioned local concentration maximum of the main well dopant in well 184B or 186B. As a consequence, impact ionization occurs more in the bulk of the monosilicon, specifically in the bulk of the drain, of IGFET 104 or 106 rather than in the monosilicon along the upper semiconductor surface as commonly arises in conventional extended-drain IGFETs.

By generally shifting impact ionization to the bulk of the monosilicon, fewer charge carriers reach the upper semiconductor surface with sufficient energy to be injected into the gate dielectric layers of extended-drain IGFETs 104 and 106 than into the gate dielectric layers of conventional extended-drain IGFETs in which substantial impact ionization occurs in the monosilicon along the upper semiconductor surface. IGFETs 104 and 106 substantially avoid having their threshold voltages change due to charge injection into their gate dielectric layers. Accordingly, IGFETs 104 and 106 are of considerably enhanced reliability.

Figure 13A:
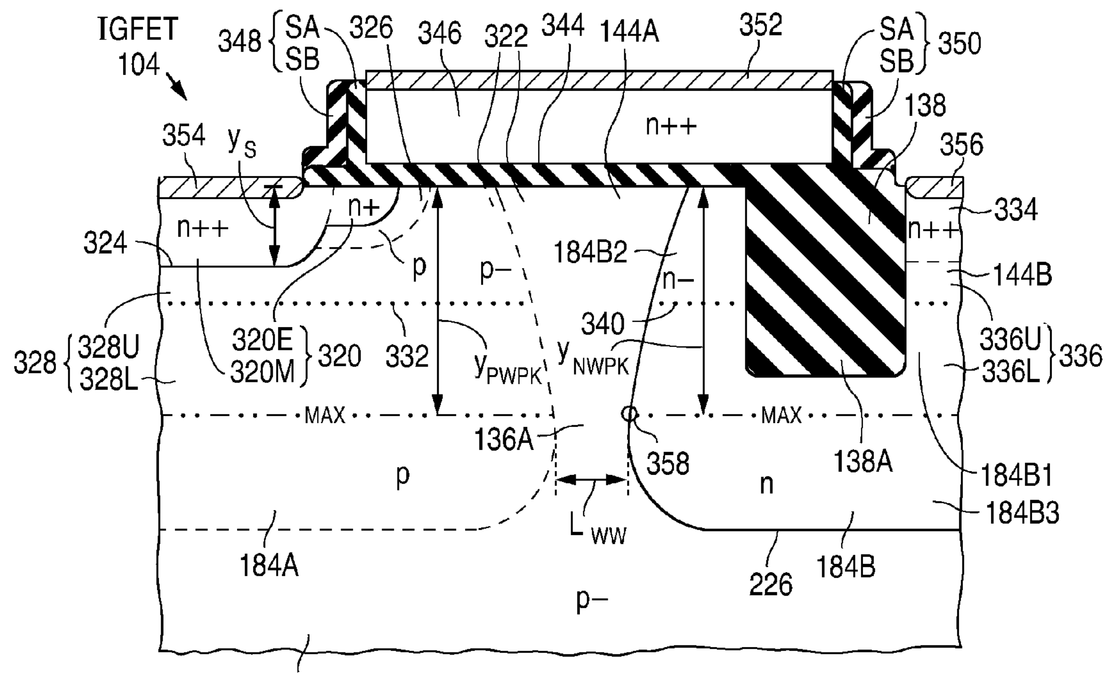
FIGS. 13*a* and 13*b* are respective expanded front cross-sectional views of the cores of the extended-drain n-channel and p-channel IGFETs of FIG. 11.2.
Figure 13B:
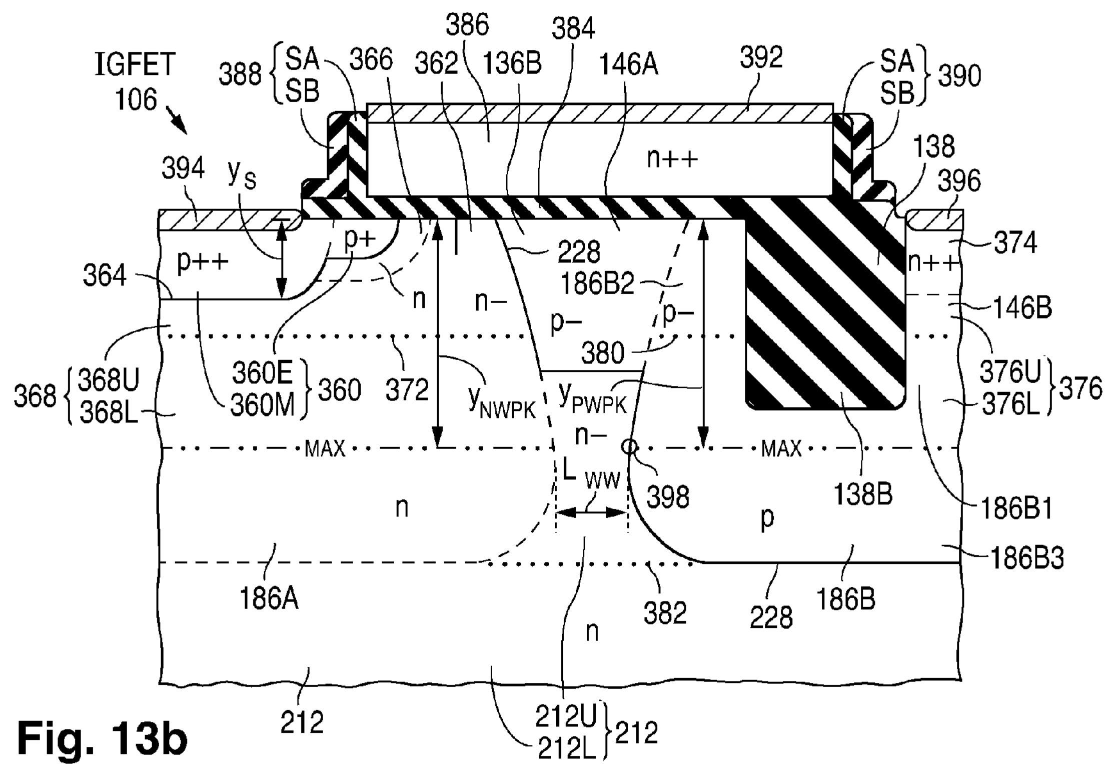

Additionally, empty main well regions 184A and 184B of n-channel IGFET 104 are preferably spaced apart from each other. The minimum spacing $L_{WW}$ between empty main wells 184A and 184B occurs approximately along an imaginary horizontal line extending from the location of the deep p-type concentration maximum in main well 184A to the location of the deep n-type concentration maximum in well 184B because the two concentration maxima occur at approximately the same depth. Empty main well regions 186A and 186B of p-channel IGFET 106 are likewise preferably spaced apart from each other. The minimum spacing $L_{WW}$ between empty main wells 186A and 186B similarly occurs approximately along an imaginary horizontal line extending from the location of the deep n-type concentration maximum in main well 186A to the location of the deep p-type concentration maximum in main well 186B since these two concentration maxima occur at approximately the same depth. The locations of minimum well-to-well spacings $L_{WW}$ for IGFETs 104 and 106 are illustrated in FIGS. 13*a* and 13*b* discussed below.

The drain-to-source breakdown voltage $V_{BD}$ of extended-drain IGFET 104 or 106 depends on minimum well-to-well spacing $L_{WW}$. In particular, breakdown voltage $V_{BD}$ of IGFET 104 or 106 increases as well-to-well spacing $L_{WW}$ increases up to point at which breakdown voltage $V_{BD}$ reaches a saturation value. The increase in breakdown voltage $V_{BD}$ with spacing $L_{WW}$ is typically in the vicinity of 6 V/μm in a $V_{BD}/L_{WW}$ region of commercial interest. The use of empty retrograde wells 184A and 184B in n-channel IGFET 104 or empty retrograde wells 186A and 186B in p-channel IGFET 106 thus provides a convenient way for controlling breakdown voltage $V_{BD}$ in the $V_{BD}/L_{WW}$ region of commercial interest.

Certain of the main well regions in the larger CIGFET structure described in U.S. patent application Ser. No. 12/382,973, cited above, are filled wells. More specifically, each filled main well contains semiconductor dopant which (a) is of the same conductivity type as that filled main well, (b) locally reaches a subsurface concentration maximum at a subsurface location extending laterally below largely all of each of the channel and S/D zones of the IGFET using that filled main well, and (c) increases, or decreases by less than a factor of 10, in moving upward from the subsurface location along any vertical location through each of that IGFET's S/D zones to the upper semiconductor surface. The subsurface location of this maximum dopant concentration occurs no more than 10 times, preferably no more than 5 times, more preferably no more than 4 times, deeper below the upper semiconductor surface than the maximum depth of each of that IGFET's S/D zones. As further described in U.S. patent application Ser. No. 12/382,973, the concentration maxima of the filled wells arise from the introduction of p-type and n-type filled main well semiconductor dopants into the semiconductor body.

A full description of the process for manufacturing the CIGFET structure of the invention is presented in the fabrication process section below. Nonetheless, in completing the basic description of the well regions used in the present CIGFET structure, the p-type deep local concentration maxima of p-type empty main well regions 180, 184A, and 186B are normally defined substantially simultaneously by selectively ion implanting the p-type empty main well dopant, typically boron, into the semiconductor body. Consequently, the p-type deep local concentration maxima of p-type empty main wells 180, 184A, and 186B occur at approximately the same average depth $y_{PWPK}$.

The p-type empty main well maximum dopant concentration at average depth $y_{PWPK}$ in p-type empty main well region 180, 184A, or 186B is normally $4\times10^{17}$-$1\times10^{18}$ atoms/cm$^3$, typically $7\times10^{17}$ atoms/cm$^3$. Average p-type empty main well maximum concentration depth $y_{PWPK}$ is normally 0.4-0.7 μm, typically 0.5-0.55 μm.

Asymmetric empty-well n-channel IGFET 100 does not use a deep p well region. The p-type empty main well subsurface maximum concentration for IGFET 100 is therefore substantially the only local subsurface concentration maximum of the total p-type dopant concentration in moving from the p-type empty main well subsurface maximum concentration location at average p-type empty main well maximum concentration depth $y_{PWPK}$ for IGFET 100 vertically down to a depth y of at least 5 times, normally at least 10 times, preferably at least 20 times, depth $y_{PWPK}$ for IGFET 100.

Asymmetric n-channel IGFET 100 can alternatively be provided in a variation that uses a deep p well region defined with p-type semiconductor dopant, referred to here as the deep p well dopant, whose concentration locally reaches a p-type further subsurface maximum concentration at a further subsurface maximum concentration location extending laterally below largely all of that IGFET's channel zone and normally also below largely all of each of that IGFET's S/D zones but which does not materially affect the essential empty-well nature of p-type empty well region 180. The local further subsurface maximum concentration location of the deep p well dopant occurs in empty main well 180 at an average value of depth y greater than p-type average empty main well maximum concentration depth $y_{PWPK}$ in well 180.

The average depth of the maximum p-type dopant concentration of the deep p well dopant is normally no greater than 10 times, preferably no greater than 5 times, average p-type empty main well maximum concentration depth $y_{PWPK}$. The deep p well dopant causes the total p-type concentration at any depth y less than $y_{PWPK}$ in empty main well 180 to be raised no more than 25%, normally no more than 10%, preferably no more than 2%, more preferably no more than 1%, typically no more than 0.5%.

The n-type deep local concentration maxima of n-type empty main well regions 182, 184B, and 186A are similarly normally defined substantially simultaneously by selectively ion implanting the n-type empty main well dopant, typically phosphorus, into the semiconductor body. Hence, the n-type deep local concentration maxima of n-type empty main wells 182, 184B, and 186A occur at approximately the same average depth $y_{NWPK}$.

The n-type empty main well maximum dopant concentration at average depth $y_{NWPK}$ in n-type empty main well region 182, 184B, or 186A is normally $3\times10^{17}$-$1\times10^{18}$ atoms/cm$^3$, typically $6\times10^{17}$ atoms/cm$^3$. Average n-type empty main well maximum concentration depth $y_{NWPK}$ is normally 0.4-0.8 μm, typically 0.55-0.6 μm. Hence, average n-type empty main well maximum concentration depth $y_{NWPK}$ in n-type empty main well 182, 184B, or 186A is typically slightly greater than average p-type empty main well maximum concentration depth $y_{PWPK}$ in p-type empty main well region 180, 184A, or 186B.

Deep n well region 210 can, as mentioned above, be deleted in a variation of asymmetric empty-well IGFETs 100 and 102. In that case, the n-type empty main well subsurface maximum concentration for p-channel IGFET 102 is substantially the only local subsurface concentration maximum of the total n-type dopant concentration in moving from the n-type empty main well subsurface maximum concentration location at average n-type empty main well maximum concentration depth $y_{NWPK}$ for IGFET 102 vertically down to a depth y of at least 5 times, normally at least 10 times, preferably at least 20 times, depth $y_{NWPK}$ for IGFET 102.

Deep n well regions 210 and 212 are normally defined substantially simultaneously by selectively ion implanting n-type semiconductor dopant, referred to here as the deep n well dopant, into the semiconductor body. As a result, deep n wells 210 and 212 reach n-type local concentration maxima at the same average depth $y_{DNWPK}$. The deep n well dopant is typically phosphorus.

The maximum concentration of the deep n well dopant in deep n well regions 210 and 212 occurs considerably deeper into the semiconductor body than the maximum concentration of the n-type empty main well dopant in n-type empty main well regions 182, 184B, and 186A. Average depth $y_{DNWPK}$ of the maximum concentration of the deep n well dopant in deep n wells 210 and 212 is normally no greater than 10 times, preferably no greater than 5 times, average depth $y_{NWPK}$ of the n-type deep local concentration maxima of n-type empty main wells 182, 184B, and 186A. More particularly, average deep n well maximum concentration depth $y_{DNWPK}$ is normally 1.5-5.0 times, preferably 2.0-4.0 times, typically 2.5-3.0 times, average n-type empty main well maximum concentration depth $y_{NWPK}$.

Additionally, average depth $y_{DNWPK}$ and the maximum concentration of the deep n well dopant in deep n well regions 210 and 212 are of such values that the presence of the deep n well dopant normally has no more than a minor effect on the total (absolute) n-type concentration in empty main well region 182 of asymmetric p-channel IGFET 102 at any depth y less than average n-type empty main well maximum concentration depth $y_{NWPK}$ and on the total (absolute) n-type concentration in empty main well region 186A of extended-drain p-channel IGFET 106 at any depth y less than $y_{NWPK}$. In particular, the deep n well dopant causes the total n-type concentration at any depth y less than $y_{NWPK}$ in empty main well 182 or 186A to be raised no more than 25%, normally no more than 10%.

More specifically, the presence of the deep n well dopant normally has no significant effect on the total (absolute) n-type concentration in empty main well region 182 of asymmetric p-channel IGFET 102 at any depth y less than average n-type empty main well maximum concentration depth $y_{NWPK}$ and on the total (absolute) n-type concentration in empty main well region 186A of extended-drain p-channel IGFET 106 at any depth y less than $y_{NWPK}$. The total n-type concentration at any depth y less than $y_{NWPK}$ in empty main well 182 or 186A is preferably raised no more than 2%, more preferably no more than 1%, typically no more than 0.5%, due to the deep n well dopant.

The deep n well maximum dopant concentration at average depth $y_{DNWPK}$ in deep well region 210 or 212 is normally $1\times10^{17}$-$4\times10^{17}$ atoms/cm$^3$, typically $2\times10^{17}$ atoms/cm$^3$. Average deep n well maximum concentration depth $y_{DNWPK}$ is normally 1.0-2.0 μm, typically 1.5 μm.

The three well implantations, along with any further p-type or n-type well implantation, are performed after formation of field-insulation region 138 and can generally be done in any order.

Each source/drain zone of asymmetric IGFETs 100 and 102 is typically provided with a vertically graded junction. That is, each source/drain zone of IGFETs 100 and 102 typically includes a very heavily doped main portion and a more lightly doped, but still heavily doped, lower portion that underlies and is vertically continuous with the main portion. The same applies to the sources and the drain contact zones of extended-drain IGFETs 104 and 106. The heavily doped lower portions that provide the vertically graded junction features are, for simplicity in explanation, not described in the following sections on asymmetric high-voltage IGFETs, extended-drain IGFETs, information generally applicable to all the IGFETs, and fabrication of the present CIGFET structure. Nor are these heavily doped lower portions illustrated in the drawings accompanying those four sections. Further information on the vertically graded junctions is provided in U.S. patent application Ser. No. 12/382,973, cited above.

D. Asymmetric High-voltage IGFETs

D1. Structure of Asymmetric High-voltage N-channel IGFET

Figure 12:
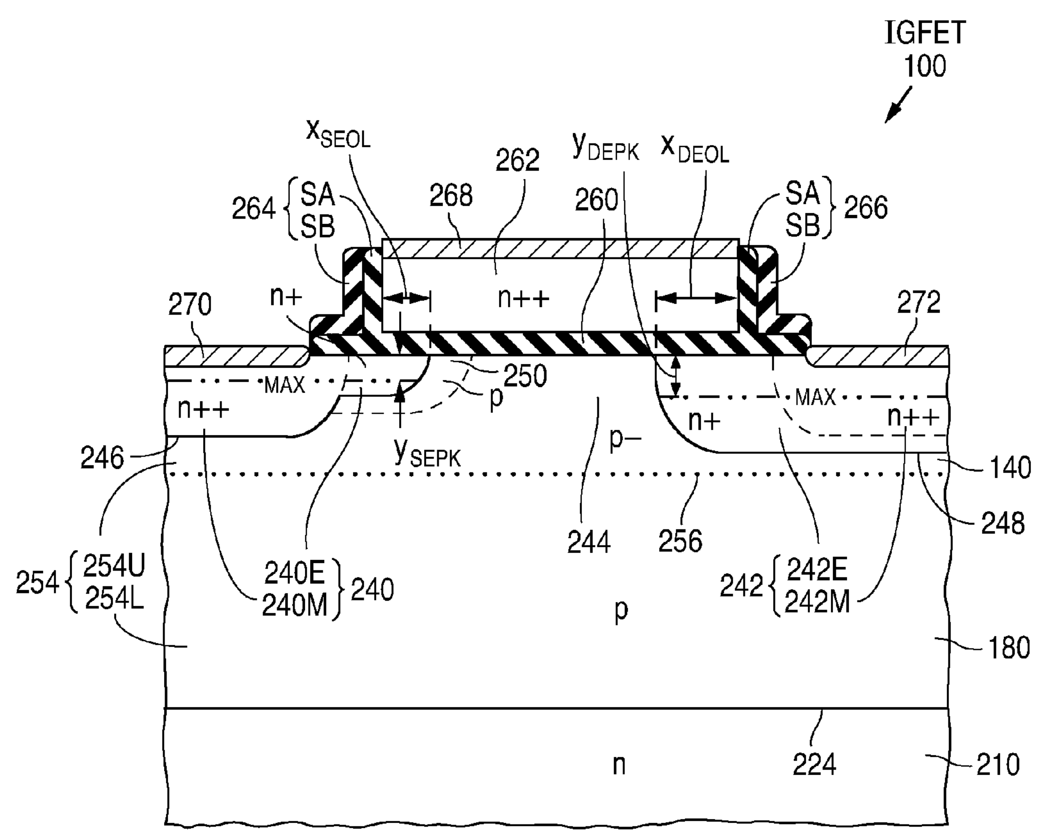
FIG. 12 is an expanded front cross-sectional view of the core of the asymmetric n-channel IGFET of FIG. 11.1.

The internal structure of asymmetric high-voltage empty-well complementary IGFETs 100 and 102 is now described. Beginning with n-channel IGFET 100, an expanded view of the core of IGFET 100 as depicted in FIG. 11.1 is shown in FIG. 12. IGFET 100 has a pair of n-type source/drain (again "S/D") zones 240 and 242 situated in active semiconductor island 140 along the upper semiconductor surface. S/D zones 240 and 242 are often respectively referred to below as source 240 and drain 242 because they normally, though not necessarily, respectively function as source and drain. Source 240 and drain 242 are separated by a channel zone 244 of p-type empty main well region 180 that constitutes the body material for IGFET 100. P-type empty-well body material 180 forms (a) a source-body pn junction 246 with n-type source 240 and (b) a drain-body pn junction 248 with n-type drain 242.

A moderately doped halo pocket portion 250 of p-type empty-well body material 180 extends along source 240 up to the upper semiconductor surface and terminates at a location between source 240 and drain 242. FIGS. 11.1 and 12 illustrate the situation in which source 240 extends deeper than p source-side halo pocket 250. Alternatively, halo pocket 250 can extend deeper than source 240. Halo pocket 250 then extends laterally under source 240. Halo pocket 250 is defined with the p-type source halo dopant.

The portion of p-type empty-well body material 180 outside source-side halo pocket portion 250 constitutes p-type empty-well main body-material portion 254. In moving from the location of the deep p-type empty-well concentration maximum in body material 180 toward the upper semiconductor surface along an imaginary vertical line outside halo pocket portion 250, the concentration of the p-type dopant in empty-well main body-material portion 254 drops gradually from a moderate doping, indicated by symbol "p", to a light doping, indicated by symbol "p−". Dotted line 256 in FIGS. 11.1 and 12 roughly represents the location below which the p-type dopant concentration in main body-material portion 254 is at the moderate p doping and above which the p-type dopant concentration in portion 254 is at the light p− doping. The moderately doped lower part of body-material portion 254 below line 256 is indicated as p lower body-material part 254L in FIG. 12. The lightly doped upper part of body-material portion 254 above line 256 outside p halo pocket 250 is indicated as p− upper body-material part 254U in FIG. 12.

Channel zone 244 (not specifically demarcated in FIG. 11.1 or 12) consists of all the p-type monosilicon between source 240 and drain 242. In particular, channel zone 244 is formed by a surface-adjoining segment of the p− upper part (254U) of main body-material portion 254 and (a) all of p halo pocket portion 250 if source 240 extends deeper than halo pocket 250 as illustrated in the example of FIGS. 11.1 and 12 or (b) a surface-adjoining segment of halo pocket 250 if it extends deeper than source 240. In any event, halo pocket 250 is more heavily doped p-type than the directly adjacent material of the p− upper part (254U) of body-material portion 254 in channel zone 244. The presence of halo pocket 250 along source 240 thereby causes channel zone 244 to be asymmetrically longitudinally dopant graded.

A gate dielectric layer 260 at the $t_{GdH}$ high thickness value is situated on the upper semiconductor surface and extends over channel zone 244. A gate electrode 262 is situated on gate dielectric layer 260 above channel zone 244. Gate electrode 262 extends partially over source 240 and drain 242.

N-type source 240 consists of a very heavily doped main portion 240M and a more lightly doped lateral extension 240E. Although more lightly doped than n++ main source portion 240M, lateral source extension 240E is still heavily doped in sub-μm complementary IGFET applications such as the present one. N-type drain 242 similarly consists of a very heavily doped main portion 242M and a more lightly doped, but still heavily doped, lateral extension 242E. N++ main source portion 240M and n++ main drain portion 242M are normally defined by ion implantation of n-type semiconductor dopant referred to as the n-type main S/D dopant, typically arsenic. External electrical contacts to source 240 and drain 242 are respectively made via main source portion 240M and main drain portion 242M.

Lateral source extension 240E and lateral drain extension 242E terminate channel zone 244 along the upper semiconductor surface. Gate electrode 262 extends over part of each lateral extension 240E or 242E. Electrode 262 normally does not extend over any part of n++ main source portion 240M or n++ main drain portion 242M. Dielectric sidewall spacers 264 and 266 are situated respectively along the opposite transverse sidewalls of gate electrode 262. Metal silicide layers 268, 270, and 272 are respectively situated along the tops of gate electrode 262, main source portion 240M, and main drain portion 242M.

Dielectric sidewall spacers 264 and 266 are L-shaped spacers often respectively referred to as source-side and drain-side spacers because they respectively extend along the source-side and drain-side lateral sides of gate electrode 262. Each L-shaped spacer 264 or 266 consists of a first L-shaped spacer layer SA and a second L-shaped spacer layer SB situated on first spacer layer SA and chemically different from, i.e., of significantly different dielectric chemical composition than, first spacer layer SA. First spacer layer SA of each spacer 264 or 266 is formed with a first vertically extending spacer layer (not separately labeled in FIG. 11.1 or 12) and a first laterally extending spacer layer (also not separately labeled in FIG. 11.1 or 12) which respectively contact gate electrode 262 and the semiconductor body. Second spacer layer SB of each spacer 264 or 266 is formed with a second vertically extending spacer layer (not separately labeled in FIG. 11.1 or 12) and a second laterally extending spacer layer (also not separately labeled in FIG. 11.1 or 12) which respectively lie on the first vertically and laterally extending layers of that spacer's first spacer layer SA Alternatively described, each source-side spacer 264 or drain-side spacer 266 consists of (a) a vertically extending dielectric spacer portion situated along gate electrode 262 and (b) a laterally extending dielectric spacer portion continuous with the vertically extending spacer portion and situated along the semiconductor body so as to generally form an L with the vertically extending spacer portion. The vertically extending portion of each spacer 264 or 266 consists of (i) a first vertically extending layer formed by the vertically extending portion of that spacer's first spacer layer SA and (ii) a second vertically extending layer chemically different from the first vertically extending layer, formed by the vertically extending portion of that spacer's second spacer layer SB, and situated on the first vertically extending layer.

The laterally extending portion of each sidewall spacer 264 or 266 consists of (i) a first laterally extending layer continuous with that spacer's first vertically extending layer and formed by the laterally extending portion of that spacer's first spacer layer SA and (ii) a second laterally extending layer chemically different from the first laterally extending layer, formed by the laterally extending portion of that spacer's second spacer layer SB, and situated on the first laterally extending layer. The laterally extending portion of source-side spacer 264 is situated above part of main source portion 240M and part of source extension 240E. The laterally extending portion of drain-side spacer 266 is situated above part of main drain portion 242M and part of drain extension 242E.

D2. Source/Drain Extensions of Asymmetric High-voltage N-channel IGFET

Drain extension 242E of asymmetric high-voltage IGFET 100 is more lightly doped than source extension 240E. However, the n-type doping of each lateral extension 240E or 242E falls into the range of heavy n-type doping indicated by the symbol "n+". Accordingly, lateral extensions 240E and 242E are both labeled "n+" in FIGS. 11.1 and 12. As explained further below, the heavy n-type doping in lateral source extension 240E is normally provided by n-type dopant of higher atomic weight than the n-type dopant used to provide the heavy n-type doping in lateral drain extension 242E.

N+ source extension 240E is normally defined by ion implantation of n-type semiconductor dopant referred to as the n-type shallow source-extension dopant because it is only used in defining comparatively shallow n-type source extensions. N+ drain extension 242 is normally defined by ion implantation of n-type semiconductor dopant referred to as the n-type drain-extension dopant and also as the n-type deep S/D-extension dopant because it is used in defining both comparatively deep n-type S/D extensions and comparatively deep n-type drain extensions.

N+ lateral extensions 240E and 242E serve multiple purposes. Inasmuch as main source portion 240M and main drain portion 242M are typically defined by ion implantation, extensions 240E and 242E serve as buffers that prevent gate dielectric layer 260 from being damaged during IGFET fabrication by keeping the very high implant dosage of main source portion 240M and main drain portion 242M away from gate dielectric 260. During IGFET operation, lateral extensions 240E and 242E cause the electric field in channel zone 244 to be lower than what would arise if n++ main source portion 240M and n++ main drain portion 242M extended under gate electrode 262. The presence of drain extension 242E inhibits hot carrier injection into gate dielectric 260, thereby preventing gate dielectric 260 from being charged. As a result, threshold voltage $V_T$ of IGFET 100 is highly stable, i.e., does not drift, with operational time.

IGFET 100 conducts current from n+ source extension 240E to n+ drain extension 242E via a channel of primary electrons formed in the depletion region along the upper surface of channel zone 244. In regard to hot carrier injection into gate dielectric layer 260, the electric field in drain 242 causes the primary electrons to accelerate and gain energy as they approach drain 242. Impact ionization occurs in drain 242 to create secondary charge carriers, both electrons and holes, which travel generally in the direction of the local electric field. Some of the secondary charge carriers, especially the secondary electrons, move toward gate dielectric layer 260. Because drain extension 242E is more lightly doped than main drain portion 242M, the primary electrons are subjected to reduced electric field as they enter drain 242. Consequently, fewer hot (energetic) secondary charge carriers are injected into gate dielectric layer 260. Hot carrier damage to gate dielectric 260 is reduced. Also, gate dielectric 260 undergoes reduced charging that would otherwise undesirably cause drift in threshold voltage $V_T$ of IGFET 100.

More particularly, consider a reference n-channel IGFET whose n-type S/D zones each consist of a very heavily doped main portion and a more lightly doped, but still heavily doped, lateral extension. Compared to the situation in which the source and drain extensions of the reference IGFET are at substantially the same heavy n-type doping as in source extension 240E of IGFET 100, the lower n-type doping in drain extension 242E causes the change in dopant concentration across the portion of drain-body junction 248 along drain extension 242E to be more gradual than the change in dopant concentration across the portion of the drain-body pn junction along the drain extension in the reference IGFET. The width of the depletion region along the portion of drain-body junction 248 along drain extension 242E is thereby increased. This causes the electric field in drain extension 242E to be further reduced. As a result, less impact ionization occurs in drain extension 242E than in the drain extension of the reference IGFET. Due to the reduced impact ionization in drain extension 242E, IGFET 100 incurs less damaging hot carrier injection into gate dielectric layer 260.

In addition to being more lightly doped than n+ source extension 240E, n+ drain extension 242E extends significantly deeper than n+source extension 240E. For an IGFET having lateral S/D extensions which are more lightly doped than respective main S/D portions and which terminate the IGFET's channel zone along the upper semiconductor surface, let $y_{SE}$ and $y_{DE}$ be respectively represent the maximum depths of the S/I) extensions. Depth $y_{DE}$ of drain extension 242E of IGFET 100 then significantly exceeds depth $y_{SE}$ of source extension 240E. Drain-extension depth $y_{DE}$ of IGFET 100 is normally at least 20% greater than, preferably at least 30% greater than, more preferably at least 50% greater than, even more preferably at least 100% greater than, its source-extension depth $y_{SE}$. Several factors lead to drain extension 242E extending significantly deeper than source extension 240E.

Source extension 240E and drain extension 242E each reach a maximum (or peak) n-type dopant concentration below the upper semiconductor surface. For an IGFET having lateral S/D extensions which are more lightly doped than respective main S/D portions of the IGFET's S/D zones, which terminate the IGFET's channel zone along the upper semiconductor surface, and which are defined by semiconductor dopant whose maximum (or peak) concentrations occur along respective locations extending generally laterally below the upper semiconductor surface, let $y_{SEPK}$ and $y_{DEPK}$ respectively represent the average depths at the locations of the maximum concentrations of the extension-defining dopants for the S/D extensions. Maximum dopant concentration depths $y_{SEPK}$ and $y_{DEPK}$ for source extension 240E and drain extension 242E of IGFET 100 are indicated in FIG. 12. Depth $y_{SEPK}$ for source extension 240E is normally 0.004-0.020 μm, typically 0.015 μm. Depth $y_{DEPK}$ for drain extension 242E is normally 0.010-0.030 μm, typically 0.020 μm.

One factor which contributes to drain extension 242E extending significantly deeper than source extension 240E is that, as indicated by the preceding $y_{SEPK}$ and $y_{DEPK}$ values for IGFET 100, the ion implantations for source extension 240E and drain extension 242E are performed so that depth $y_{DEPK}$ of the maximum n-type dopant concentration in drain extension 242E significantly exceeds depth $y_{SEPK}$ of the maximum n-type dopant concentration in source extension 240E. Maximum drain-extension dopant concentration depth $y_{DEPK}$ for IGFET 100 is normally at least 10% greater than, preferably at least 20% greater than, more preferably at least 30% greater than, its maximum source-extension dopant concentration depth $y_{SEPK}$.

Inasmuch as drain extension 242E is more lightly doped than source extension 240E, the maximum total n-type dopant concentration at depth $y_{DEPK}$ in drain extension 242E is significantly less than the maximum total n-type dopant concentration at depth $y_{SEPK}$ in source extension 240E. The maximum total n-type dopant concentration at depth $y_{DEPK}$ in drain extension 242E is normally no more than one half of, preferably no more than one fourth of, more preferably no more than one tenth of, even more preferably no more than one twentieth of, the maximum total n-type dopant concentration at depth $y_{SEPK}$ in source extension 240E. As a result, the maximum net n-type dopant concentration at depth $y_{DEPK}$ in drain extension 242E is significantly less than, normally no more than one half of, preferably no more than one fourth of, more preferably no more than one tenth of, even more preferably no more than one twentieth of, the maximum net n-type dopant concentration at depth $y_{SEPK}$ in source extension 240E. Alternatively stated, the maximum total or net n-type dopant concentration at depth $y_{SEPK}$ in source extension 240E is significantly greater than, normally at least two times, preferably at least four times, more preferably at least 10 times, even more preferably at least 20 times, the maximum total or net n-type dopant concentration at depth $y_{DEPK}$ in drain extension 242E.

Two other factors that contribute to drain extension 242E extending significantly deeper than source extension 240E involve p+ source-side halo pocket portion 250. The p-type dopant in halo pocket 250 impedes diffusion of the n-type shallow source-extension dopant in source extension 240E, thereby reducing source-extension depth $y_{SE}$. The p-type dopant in halo pocket 250 also causes the bottom of source extension 240E to occur at a higher location so as to further reduce source-extension depth $y_{SE}$.

The combination of drain extension 242E extending significantly deeper than, and being more lightly doped than, source extension 240E causes the n-type deep S/D-extension dopant in drain extension 242E to be spread out considerably more vertically than the n-type shallow source extension dopant in source extension 240E. Accordingly, the distribution of the total n-type dopant in drain extension 242E is spread out vertically considerably more than the distribution of the total n-type dopant in source extension 240E.

The current flowing from source to drain through an IGFET such as IGFET 100 or the reference IGFET normally spreads out downward upon entering the drain. Compared to the situation in which the source and drain extensions of the reference IGFET are doped substantially the same and extend to the same depth as source extension 240E, the increased depth of drain extension 242E enables the current flow through drain extension 242E to be more spread out vertically than in the drain extension of the reference IGFET. The current density in drain extension 242E is thus less than the current density in the drain extension of the reference IGFET.

The increased spreading of the total n-type dopant in drain extension 242E causes the electric field in drain extension 242E to be less than the electric field in the drain extension of the reference IGFET. Less impact ionization occurs in drain extension 242E than in the drain extension of the reference IGFET. In addition, impact ionization occurs further away from the upper semiconductor surface in drain extension 242E than in the drain extension of the reference IGFET. Fewer hot carriers reach gate dielectric 260 than the gate dielectric layer of the reference IGFET. As a result, the amount of hot carrier injection into gate dielectric layer 260 of IGFET 100 is reduced further.

Drain extension 242E extends significantly further laterally under gate electrode 262 than does source extension 240E. For an IGFET having lateral S/D extensions which are more lightly doped than respective main S/D portions and which terminate the IGFET's channel zone along the upper semiconductor surface, let $x_{SEOL}$ and $x_{DEOL}$ represent the amounts by which the IGFET's gate electrode respectively overlaps the source and drain extensions. Amount $x_{DEOL}$ by which gate electrode 262 of IGFET 100 overlaps drain extension 242E then significantly exceeds amount $x_{SEOL}$ by which gate electrode 262 overlaps source extension 240E. Gate-electrode overlaps $x_{SEOL}$ and $x_{DEOL}$ are indicated in FIG. 12 for IGFET 100. Gate-to-drain-extension overlap $x_{DEOL}$ of IGFET 100 is normally at least 20% greater, preferably at least 30% greater, more preferably at least 50% greater, than its gate-to-source-extension overlap $x_{SEOL}$.

The quality of the gate dielectric material near the drain-side edge of gate electrode 262 is, unfortunately, normally not as good as the quality of the remainder of the gate dielectric material. Compared to the situation in which the S/D extensions of the reference IGFET extend laterally the same amount below the gate electrode as source extension 240E extends laterally below gate electrode 262, the greater amount by which drain extension 242E extends laterally below gate electrode 262 enables the current flow through drain extension 242E to be even more spread out vertically than in the drain extension of the reference IGFET. The current density in drain extension 242E is further reduced. This leads to even less impact ionization in drain extension 242E than in the drain extension of the reference IGFET. The amount of hot carrier injection into gate dielectric layer 260 is reduced even more. Due to the reduced doping, greater depth, and greater gate-electrode overlap of drain extension 242E, IGFET 100 undergoes very little damaging hot carrier injection into gate dielectric 260, thereby enabling the threshold voltage of IGFET 100 to be very stable with operational time.

For an IGFET having main source and drain portions respectively continuous with more lightly doped lateral source and drain extensions that terminate the IGFET's channel zone along the upper semiconductor surface, let $y_{SM}$ and $y_{DM}$ represent the respective maximum depths of the main source and drain portions. Depth $y_{DM}$ of main drain portion 242M of IGFET 100 is typically approximately the same as depth $y_{SM}$ of main source portion 240M. Each of depths $y_{SM}$ and $y_{DM}$ for IGFET 100 is normally 0.08-0.20 µm, typically 0.14 µm. Due to the presence of the p-type dopant that defines halo pocket portion 250, main source portion depth $y_{SM}$ of IGFET 100 can be slightly less than its main drain portion depth $y_{DM}$.

Main source portion 240M of IGFET 100 extends deeper than source extension 240E in the example of FIGS. 11.1 and 12. Main source portion depth $y_{SM}$ of IGFET 100 therefore exceeds its source-extension depth $y_{SE}$. In contrast, drain extension 242E extends deeper than main drain portion 242M in this example. Hence, drain-extension depth $y_{DE}$ of IGFET 100 exceeds its main drain portion depth $y_{DM}$. Also, drain extension 242E extends laterally under main drain portion 242M.

Let $y_S$ and $y_D$ respectively represent the maximum depths of the source and drain of an IGFET. Depths $y_S$ and $y_D$ are the respective maximum depths of the IGFET's source-body and drain-body pn junctions, i.e., source-body junction 246 and drain-body junction 248 for IGFET 100. Since main source portion depth $y_{SM}$ of IGFET 100 exceeds its source-extension depth $y_{SE}$ in the example of FIGS. 11.1 and 12, source depth $y_S$ of IGFET 100 equals its main source portion depth $y_{SM}$. On the other hand, drain depth $y_D$ of IGFET 100 equals its drain-extension depth $y_{DE}$ in this example because drain extension depth $y_{DE}$ of IGFET 100 exceeds its main drain portion depth $y_{DM}$.

Source depth $y_S$ of IGFET 100 is normally 0.08-0.20 µm, typically 0.14 µm. Drain depth $y_D$ of IGFET 100 is normally 0.10-0.22 µm, typically 0.16 µm. Drain depth $y_D$ of IGFET 100 normally exceeds its source depth $y_S$ by 0.01-0.05 µm, typically by 0.02 µm. In addition, source-extension depth $y_{SE}$ of IGFET 100 is normally 0.02-0.10 μm, typically 0.04 μm. Drain-extension depth $y_{DE}$ of IGFET 100 is 0.10-0.22, typically 0.16 μm. Accordingly, drain-extension depth $y_{DE}$ of IGFET 100 is typically roughly four times its source-extension depth $y_{SE}$ and, in any event, is typically more than three times its source-extension depth $y_{SE}$.

The presence of halo pocket portion 250 along source 240 causes channel zone 244 to be asymmetrically longitudinally dopant graded as described above. The reduced doping, greater depth, and greater gate-electrode overlap on drain extension 242E than on source extension 240E provide IGFET 100 with further asymmetry. A further explanation of the doping asymmetries of IGFET 100 and the empty-well doping characteristics of body material 180 is presented in U.S. patent application Ser. No. 12/382,973, cited above.

Threshold voltage $V_T$ of n-channel IGFET 100 is 0.5 V to 0.75 V, typically 0.6 V to 0.65 V, at a drawn channel length $L_{DR}$ in the vicinity of 0.3 μm and a gate dielectric thickness of 6-6.5 nm. IGFET 100 is particularly suitable for unidirectional-current applications at a high operational voltage range, e.g., 3.0 V.

D3. Structure of Asymmetric High-Voltage P-Channel IGFET

Asymmetric high-voltage p-channel IGFET 102 is internally configured basically the same as asymmetric high-voltage n-channel IGFET 100, except that the body material of IGFET 102 consists of n-type empty main well region 182 and deep n well region 210 rather than just an empty main well region (180) as occurs with IGFET 100. The conductivity types in the regions of IGFET 102 are generally opposite to the conductivity types of the corresponding regions in IGFET 100.

More particularly, IGFET 102 has a pair of p-type S/D zones 280 and 282 situated in active semiconductor island 142 along the upper semiconductor surface as shown in FIG. 11.1. S/D zones 280 and 282 are often respectively referred to below as source 280 and drain 282 because they normally, though not necessarily, respectively function as source and drain. Source 280 and drain 282 are separated by a channel zone 284 of n-type empty-well body material 182, i.e., portion 182 of total body material 182 and 210. N-type empty-well body material 182 forms (a) a source-body pn junction 286 with p-type source 280 and (b) a drain-body pn junction 288 with p-type drain 282.

A moderately doped halo pocket portion 290 of n-type empty-well body material 182 extends along source 280 up to the upper semiconductor surface and terminates at a location between source 280 and drain 282. FIG. 11.1 illustrates the situation in which source 280 extends deeper than n source-side halo pocket 290. As an alternative, halo pocket 290 can extend deeper than source 280. Halo pocket 290 then extends laterally under source 290. Halo pocket 290 is defined with the n-type source halo dopant.

The portion of n-type empty-well body material 182 outside source-side halo pocket portion 290 constitutes n-type empty-well body-material portion 294. In moving from the location of the deep n-type empty-well concentration maximum in body material 182 toward the upper semiconductor surface along an imaginary vertical line (not shown) outside halo pocket portion 290, the concentration of the n-type dopant in empty-well main body-material portion 294 drops gradually from a moderate doping, indicated by symbol "n", to a light doping, indicated by symbol "n−". Dotted line 296 in FIG. 11.1 roughly represents the location below which the n-type dopant concentration in main body-material portion 294 is at the moderate n doping and above which the n-type dopant concentration in portion 294 is at the light n− doping.

Channel zone 284 (not specifically demarcated in FIG. 11.1) consists of all the n-type monosilicon between source 280 and drain 282. More particularly, channel zone 284 is formed by a surface-adjoining segment of the n− upper part of empty-well main body-material portion 294 and (a) all of n halo pocket portion 290 if source 280 extends deeper than halo pocket 290 as illustrated in the example of FIG. 11.1 or (b) a surface-adjoining segment of halo pocket 290 if it extends deeper than source 280. In any event, halo pocket 290 is more heavily doped n-type than the directly adjacent material of the n− upper part of main body-material portion 294 in channel zone 284. The presence of halo pocket 290 along source 290 thereby causes channel zone 284 to be asymmetrically longitudinally dopant graded.

A gate dielectric layer 300 at the $t_{GdH}$ high thickness value is situated on the upper semiconductor surface and extends over channel zone 284. A gate electrode 302 is situated on gate dielectric layer 300 above channel zone 284. Gate electrode 302 extends partially over source 280 and drain 282.

P-type source 280 consists of a very heavily doped main portion 280M and a more lightly doped lateral extension 280E. P-type drain 282 similarly consists of a very heavily doped main portion 282M and a more lightly doped lateral extension 282E. Although respectively more lightly doped than p++ main source portion 280M and p++ main drain portion 282M, lateral source extension 280E and lateral drain extension 282E are still heavily doped in the present sub-μm CIGFET application. Main source portion 280M and main drain portion 282M are normally defined by ion implantation of p-type semiconductor dopant referred to as the p-type main S/D dopant, typically boron. External electrical contacts to source 280 and drain 282 are respectively made via main source portion 280M and main drain portion 282M.

Lateral source extension 280E and drain extension 282E terminate channel zone 284 along the upper semiconductor surface. Gate electrode 302 extends over part of each lateral extension 280E or 282E. Electrode 302 normally does not extend over any part of p++ main source portion 280M or p++ main drain portion 282M. Dielectric sidewall spacers 304 and 306 are situated respectively along the opposite transverse sidewalls of gate electrode 302. Metal silicide layers 308, 310, and 312 are respectively situated along the tops of gate electrode 302, main source portion 280M, and main drain portion 282M.

Dielectric sidewall spacers 304 and 306 are L-shaped spacers often respectively referred to as source-side and drain-side spacers because they respectively extend along the source-side and drain-side lateral sides of gate electrode 302. As with L-shaped spacers 264 and 266 of IGFET 100, each L-shaped spacer 304 or 306 of IGFET 102 consists of a first L-shaped spacer layer SA and a chemically different second L-shaped spacer layer SB situated on first spacer layer SA. With spacers 304 and 306 configured the same as spacers 264 and 266, the laterally extending portion of source-side spacer 304 is situated above part of main source portion 280M and part of source extension 280E. The laterally extending portion of drain-side spacer 306 is situated above part of main drain portion 282M and part of drain extension 282E.

D4. Source/Drain Extensions of Asymmetric High-Voltage P-Channel IGFET

Drain extension 282E of asymmetric high-voltage p-channel IGFET 102 is more lightly doped than source extension 280E. However, the p-type doping of each lateral extension 280E or 282E falls into the range of heavy p-type doping indicated by the symbol "p+". Source extension 280E and drain extension 282E are therefore both labeled "p+" in FIG. 11.1.

P+ source extension 280E is normally defined by ion implantation of p-type semiconductor dopant referred to as the p-type shallow source-extension dopant because it is only used in defining comparatively shallow p-type source extensions. P+ drain extension 282E is normally defined by ion implantation of p-type semiconductor dopant referred to as the p-type deep drain-extension dopant and also as the p-type deep S/D-extension dopant because it is used in defining both comparatively deep p-type S/D extensions and comparatively deep p-type drain extensions. The p-type doping in source extension 280E and drain extension 282E is typically provided by boron.

P+ lateral extensions 280E and 282E serve substantially the same purposes in IGFET 102 as lateral extensions 240E and 242E in IGFET 100. In this regard, IGFET 102 conducts current from p+ source extension 280E to p+ drain extension 282E via a channel of primary holes induced in the depletion region along the upper surface of channel zone 284. The electric field in drain 282 causes the primary holes to accelerate and gain energy as they approach drain 282. Taking note that holes moving in one direction are basically electrons travelling away from dopant atoms in the opposite direction, the holes impact atoms in drain 282 to create secondary charge carriers, again both electrons and holes, which travel generally in the direction of the local electric field. Some of the secondary charge carriers, especially the secondary holes, move toward gate dielectric layer 300. Since drain extension 282E is more lightly doped than main drain portion 282M, the primary holes are subjected to reduced electric field as they enter drain 282. As a result, fewer hot (energetic) secondary charge carriers are injected into gate dielectric layer 300 so as to charge it. Undesirable drift of threshold voltage $V_T$ of IGFET 102 is substantially reduced.

The lighter p-type doping in drain extension 282E than in source extension 280E causes IGFET 102 to incur even less hot carrier injection into gate dielectric layer 300 for the same reasons that IGFET 100 incurs even less damaging hot carrier injection into gate dielectric layer 260 as a result of the lighter n-type doping in drain extension 242E than in source extension 240E. That is, the lighter drain-extension doping in IGFET 102 produces a more gradual change in dopant concentration across the portion of drain-body junction 288 along drain extension 282E. The width of the depletion region along the portion of drain-body junction 288 along drain extension 282E is thereby increased, causing the electric field in drain extension 282E to be reduced. Due to the resultant reduction in impact ionization in drain extension 282E, hot carrier injection into gate dielectric layer 300 is reduced.

Each of p+ source extension 280E and p+ drain extension 282E reaches a maximum (or peak) p-type dopant concentration below the upper semiconductor surface. With source extension 280E and drain extension 282E defined by ion implantation, source extension 280E is normally of such a nature that there is an imaginary vertical line (not shown) which extends through source extension 280E and which is sufficiently far away from main source portion 280M that the p-type dopant which defines main source portion 280M does not have any significant effect on the total p-type dopant concentration along that vertical line. As a result, the depth at which the concentration of the p-type shallow source-extension dopant reaches its maximum value along the vertical line largely equals depth $y_{SEPK}$ at the maximum value of the total p-type dopant concentration in source extension 280E. Depth $y_{SEPK}$ for source extension 280E is normally 0.003-0.015 μm, typically 0.006 μm.

Drain extension 282E is likewise normally of such a nature that there is an imaginary vertical line (not shown) which extends through drain extension 282E and which is sufficiently far away from main drain portion 282M that the p-type dopant which defines main drain portion 282M has no significant effect on the total p-type dopant concentration along that vertical line. The depth at which the concentration of the p-type deep S/D-extension dopant reaches its maximum value along the vertical line through drain extension 282E normally largely equals depth $y_{DEPK}$ at the maximum value of the total p-type dopant concentration in drain extension 282E. As with depth $y_{SEPK}$ of the maximum concentration of the p-type shallow p-type source-extension dopant in source extension 280E, depth $y_{DEPK}$ for drain extension 282E is normally 0.003-0.015 μm, typically 0.006 μm.

P+ drain extension 282E extends significantly deeper than p+ source extension 280E even though maximum concentration depth $y_{DEPK}$ for drain extension 282E is normally largely equal to maximum concentration depth $y_{SEPK}$ for source extension 280E. In other words, depth $y_{DE}$ of drain extension 282E of IGFET 102 significantly exceeds depth $y_{SE}$ of source extension 280E. Drain-extension depth $y_{DE}$ of IGFET 102 is normally at least 20% greater than, preferably at least 30% greater than, more preferably at least 50% greater than, even more preferably at least 100% greater than, its source-extension depth $y_{SE}$.

Two primary factors lead to drain extension 282E extending significantly deeper than source extension 280E. Both factors involve n+ source-side halo pocket portion 290. Firstly, the n-type dopant in halo pocket portion 290 slows down diffusion of the p-type shallow source-extension dopant in source extension 280E so as to reduce source-extension depth $y_{SE}$. Secondly, the n-type dopant in halo pocket 290 causes the bottom of source extension 280E to occur at a higher location, thereby further reducing source-extension depth $y_{SE}$. Drain extension 282E can be arranged to extend further deeper than source extension 280E by performing the ion implantations so that depth $y_{DEPK}$ of the maximum p-type dopant concentration in drain extension 282E exceeds depth $y_{SEPK}$ of the maximum p-type dopant concentration in source extension 280E.

In typical implementations of asymmetric IGFETs 100 and 102, the p-type source halo dopant in p halo pocket portion 250 of n-channel IGFET 100 is the same atomic species, normally boron, as the p-type shallow source-extension dopant in p+ source extension 280E of p-channel IGFET 102. Analogously, the n-type source halo dopant in n halo pocket portion 290 of p-channel IGFET 102 is typically the same atomic species, normally arsenic, as the n-type shallow source-extension dopant in n+ source extension 240E of n-channel IGFET 100.

An arsenic atom is considerably larger than a boron atom. As a result, the n-type dopant in halo pocket portion 290 of p-channel IGFET 102 impedes diffusion of the p-type shallow source-extension dopant in source extension 280E considerably more than the p-type dopant in halo pocket portion 250 of n-channel IGFET 100 slows down diffusion of the n-type shallow source-extension dopant in source extension 240E. This enables IGFETs 100 and 102 to have comparable ratios of drain-extension depth $y_{DE}$ to source-extension depth $y_{SE}$ even though maximum concentration depth $y_{DEPK}$ for drain extension 282E of p-channel IGFET 102 is normally largely the same as maximum concentration depth $y_{SEPK}$ for source extension 280E whereas maximum concentration depth $y_{DEPK}$ for drain extension 242E of n-channel IGFET 100 is considerably greater than maximum concentration depth $y_{SEPK}$ for source extension 240E.

The distribution of the p-type deep S/D-extension dopant in drain extension 282E of p-channel IGFET 102 is spread out vertically significantly more than the distribution of the p-type shallow source-extension dopant in source extension 280E. As a result, the distribution of the total p-type dopant in drain extension 282E is spread out vertically significantly more than the distribution of the total p-type dopant in source extension 280E.

The greater depth of drain extension 282E than source extension 280E causes hot carrier injection into gate dielectric layer 300 of IGFET 102 to be further reduced for largely the same reasons that IGFET 100 incurs less hot carrier injection into gate dielectric layer 260. In particular, the increased depth of drain extension 282E in IGFET 102 causes the current through drain extension 282E to be more spread out vertically, thereby reducing the current density in drain extension 282E. The increased spreading of the total p-type dopant in drain extension 282E causes the electric field in drain extension 282E to be reduced. The resultant reduction in impact ionization in drain extension 282E produces less hot carrier injection into gate dielectric 300.

Drain extension 282E extends significantly further below gate electrode 302 than does source extension 280E. Consequently, amount $x_{DEOL}$ by which gate electrode 302 of IGFET 102 overlaps drain extension 282E significantly exceeds amount $x_{SEOL}$ by which gate electrode 302 overlaps source extension 280E. Gate-to-drain-extension overlap $x_{DEOL}$ of IGFET 102 is normally at least 20% greater, preferably at least 30% greater, more preferably at least 50% greater, than its gate-to-source-extension overlap $x_{SEOL}$.

The greater overlap of gate electrode 302 over drain extension 282E than over source extension 280E causes hot carrier injection into gate dielectric layer 300 of IGFET 102 to be reduced even further for the same reasons that IGFET 100 incurs even less hot carrier injection into gate dielectric layer 260 as a result of the greater overlap of gate electrode 262 over drain extension 242E than over source extension 240E. That is, the greater amount by which drain extension 282E of IGFET 102 extends laterally below gate electrode 302 enables the current flow through drain extension 282E to be even more spread out vertically. The current density in drain extension 282E is further reduced. The resultant further reduction in impact ionization in drain extension 282E causes even less hot carrier injection into gate dielectric layer 300. Due to the reduced doping, greater depth, and greater gate-electrode overlap of drain extension 282E, IGFET 102 undergoes very little hot carrier injection into gate dielectric 300. As with IGFET 100, the threshold voltage of IGFET 102 is very stable with operational time.

Depth $y_{DM}$ of main drain portion 282M of IGFET 102 is typically approximately the same as depth $y_{SM}$ of main source portion 280M. Each of depths $y_{SM}$ and $y_{DM}$ for IGFET 102 is normally 0.05-0.15 μm, typically 0.10 μm. Due to the presence of the n-type dopant that defines halo pocket portion 290, main source portion depth $y_{SM}$ of IGFET 102 can be slightly less than its main drain portion depth $y_{DM}$.

Main source portion 280M of IGFET 102 extends deeper than source extension 280E in the example of FIG. 11.1. Main source portion depth $y_{SM}$ of IGFET 102 thus exceeds its source-extension depth $y_{SE}$. In contrast, drain extension 282E extends deeper than main drain portion 282M in this example. Consequently, drain-extension depth $y_{DE}$ of IGFET 102 exceeds its main drain portion depth $y_{DM}$. Also, drain extension 282E extends laterally under main drain portion 282M.

Inasmuch as main source portion depth $y_{SM}$ of IGFET 102 exceeds its source-extension depth $y_{SE}$ in the example of FIG. 11.1, source depth $y_S$ of IGFET 102 equals its main source portion depth $y_{SM}$. On the other hand, drain depth $y_D$ of IGFET 102 equals its drain-extension depth $y_{DE}$ in this example because drain-extension depth $y_{DE}$ of IGFET 102 exceeds its main drain portion depth $y_{DM}$. Source depth $y_S$ of IGFET 102 is normally 0.05-0.15 μm, typically 0.10 μm. Drain depth $y_D$ of IGFET 102 is normally 0.08-0.20 μm, typically 0.14 μm. Drain depth $y_D$ of IGFET 102 thereby normally exceeds its source depth $y_S$ by 0.01-0.10 μm, typically by 0.04 μm. Additionally, source-extension depth $y_{SE}$ of IGFET 102 is normally 0.02-0.10 μm, typically 0.06 μm. Drain-extension depth $y_{DE}$ of IGFET 102 is 0.08-0.20 μm, typically 0.14 μm. Accordingly, drain-extension depth $y_{DE}$ of IGFET 102 is typically more than twice its source-extension depth $y_{SE}$.

IGFET 102 employs deep n well region 210 in the implementation of FIG. 11.1. Inasmuch as average deep n well maximum concentration depth $y_{DNWPK}$ is normally 1.0-2.0 μm, typically 1.5 μm, average depth $y_{DNWPK}$ for IGFET 102 is normally 5-25 times, preferably 8-16 times, typically 10-12 times its drain depth $y_D$.

Subject to the conductivity types being reversed, p-channel IGFET 102 has a longitudinal dopant distribution along the upper semiconductor surface quite similar to the longitudinal dopant distributions along the upper semiconductor surface for n-channel IGFET 100. A further explanation of the doping asymmetries of IGFET 102 and the empty-well doping characteristics of p-type empty-well body material 182 is presented in U.S. patent application Ser. No. 12/382,973, cited above.

Threshold voltage $V_T$ of p-channel IGFET 102 is −0.5 V to −0.7 V, typically −0.6 V, at a drawn channel length $L_{DR}$ in the vicinity of 0.3 μm and a gate dielectric thickness of 6-6.5 nm. As with n-channel IGFET 100, p-channel IGFET 102 is particularly suitable for unidirectional-current applications at a high operational voltage range, e.g., 3.0 V.

E. Extended-Drain IGFETs

E1. Structure of Extended-Drain N-Channel IGFET

The internal structure of asymmetric extended-drain extended-voltage complementary IGFETs 104 and 106 is described next. Expanded views of the cores of IGFETs 104 and 106 are respectively shown in FIGS. 13*a* and 13*b*.

Starting with n-channel IGFET 104, it has an n-type first S/D zone 320 situated in active semiconductor island 144A along the upper semiconductor surface as shown in FIGS. 11.2 and 13*a* Empty main well 184B constitutes an n-type second S/D zone for IGFET 104. Parts of n-type S/D zone 184B are, as described further below, situated in both of active semiconductor islands 144A and 144B. S/D zones 320 and 184B are often respectively referred to below as source 320 and drain 184B because they normally, though not necessarily, respectively function as source and drain.

Source 320 and drain 184B are separated by a channel zone 322 of p-type body material formed with p-type empty main well region 184A and p− substrate region 136. P-type empty-well body material 184A, i.e., portion 184A of total body material 184A and 136, forms a source-body pn junction 324 with n-type source 320. Pn junction 226 between n-type empty-well drain 184B and p− substrate region 136 is the drain-body junction for IGFET 104. Empty main well regions 184A and 184B are often respectively described below as empty-well body material 184A and empty-well drain 184B in order to clarify the functions of empty wells 184A and 184B.

N-type source 320 consists of a very heavily doped main portion 320M and a more lightly doped lateral extension 320E. External electrical contact to source 320 is made via n++ main source portion 320M. Although more lightly doped than main source portion 320M, lateral source extension 320E is still heavily doped in the present sub-μm CIGFET application. N+ source extension 320E terminates channel zone 322 along the upper semiconductor surface at the source side of IGFET 104.

N++ main source portion 320M extends deeper than source extension 320E. Accordingly, the maximum depth $y_S$ of source 320 is the maximum depth $y_{SM}$ of main source portion 320M. Maximum source depth $y_S$ for IGFET 104 is indicated in FIG. 13*a*. Main source portion 320M and source extension 320E are respectively defined with the n-type main S/D and shallow source extension dopants.

A moderately doped halo pocket portion 326 of p-type empty-well body material 184A extends along source 320 up to the upper semiconductor surface and terminates at a location within body material 184A and thus between source 320 and drain 184B. FIGS. 11.2 and 13*a* illustrate the situation in which source 320, specifically main source portion 320M, extends deeper than p source-side halo pocket 326. Alternatively, halo pocket 326 can extend deeper than source 320. Halo pocket 326 then extends laterally under source 320. Halo pocket 326 is defined with the p-type source halo dopant.

The portion of p-type empty-well body material 184A outside source-side halo pocket portion 326 is indicated as item 328 in FIGS. 11.2 and 13*a*. In moving from the location of the deep p-type empty-well concentration maximum in body material 184A toward the upper semiconductor surface along a selected imaginary vertical line through channel zone 322 outside halo pocket 326, the concentration of the p-type dopant in empty-well body-material portion 328 drops gradually from a moderate doping, indicated by symbol "p", to a light doping, indicated by symbol "p−". Dotted line 332 (only labeled in FIG. 13*a*) roughly represents the location below which the p-type dopant concentration in body-material portion 328 is at the moderate p doping and above which the p-type dopant concentration in portion 328 is at the light p− doping. The moderately doped part of body-material portion 328 below line 332 is indicated as p lower body-material part 328L in FIG. 13*a*. The lightly doped part of body-material portion 328 above line 332 is indicated as p− upper body-material part 328U in FIG. 13*a*.

The p-type dopant in p-type empty-well body-material portion 328 consists of the p-type empty main well dopant, the p-type background dopant of p− substrate region 136, and (near p halo pocket portion 326) the p-type source halo dopant. The concentration of the p-type background dopant is largely constant throughout the semiconductor body. Since the p-type empty main well dopant in p-type empty-well body material 184A reaches a deep subsurface concentration maximum along a subsurface location at average depth $y_{PWPK}$, the presence of the p-type empty main well dopant in body-material portion 328 causes the concentration of the total p-type dopant in portion 328 to reach a deep local subsurface concentration maximum substantially at the location of the deep subsurface concentration maximum in body material 184A. The deep subsurface concentration maximum in body-material portion 328, as indicated by the left-hand dash-and-double-dot line labeled "MAX" in FIG. 13*a*, extends laterally below the upper semiconductor surface and likewise occurs at average depth $y_{PWPK}$. The occurrence of the deep subsurface concentration maximum in body-material portion 328 causes it to bulge laterally outward. The maximum bulge in body-material portion 328, and thus in body material 184A, occurs along the location of the deep subsurface concentration maximum in portion 328 of body material 184A.

N-type empty-well drain 184B includes a very heavily doped external contact portion 334 situated in active semiconductor island 144B along the upper semiconductor surface. N++ external drain contact portion 334 is sometimes referred to here as the main drain portion because, similar to main source portion 320M, drain contact portion 334 is very heavily doped, is spaced apart from channel zone 322, and is used in making external electrical contact to IGFET 104. The portion of drain 184B outside n++ external drain contact portion/main drain portion 334 is indicated as item 336 in FIGS. 11.2 and 13*a*.

In moving from the location of the deep n-type empty-well concentration maximum in drain 184B toward the upper semiconductor surface along a selected imaginary vertical line through island 144A, the concentration of the n-type dopant in drain 184B drops gradually from a moderate doping, indicated by symbol "n", to a light doping, indicated by symbol "n−". Dotted line 340 (only labeled in FIG. 13*a*) roughly represents the location below which the n-type dopant concentration in empty-well drain portion 336 is at the moderate n doping and above which the n-type dopant concentration in portion 336 is at the light n− doping. The moderately doped part of drain portion 336 below line 340 is indicated as n lower empty-well drain part 336L in FIG. 13*a*. The lightly doped part of drain portion 336 above line 340 is indicated as n− upper empty-well drain part 336U in FIG. 13*a*.

The n-type dopant in n-type empty-well drain portion 336 consists of the n-type empty main well dopant and (near n++ drain contact portion 334) the n-type main S/D dopant utilized, as described below, to form drain contact portion 334. Because the n-type empty main well dopant in n-type empty-well drain 184B reaches a deep subsurface concentration maximum at average depth $y_{NWPK}$, the presence of the n-type empty main well dopant in drain portion 336 causes the concentration of the total n-type dopant in portion 336 to reach a deep local subsurface concentration maximum substantially at the location of the deep subsurface concentration maximum in well 184B. The deep subsurface concentration maximum in drain portion 336, as indicated by the right-hand dash-and-double-dot line labeled "MAX" in FIG. 13*a*, extends laterally below the upper semiconductor surface and likewise occurs at average depth $y_{NWPK}$. The occurrence of the deep subsurface concentration maximum in empty-well drain portion 336 causes it to bulge laterally outward. The maximum bulge in drain portion 336, and therefore in empty-well drain 184B, occurs along the location of the deep subsurface concentration maximum in portion 336 of drain 184B.

A surface-adjoining portion 136A of p− substrate region 136 laterally separates empty-well body material 184A, specifically empty-well body-material portion 328, and empty-well drain 184B, specifically empty-well drain portion 336. Letting $L_{WW}$ represent the minimum separation distance between a pair of complementary (p-type and n-type) empty main wells of an extended drain IGFET such as IGFET 104, FIG. 13*a* indicates that minimum well-to-well separation distance $L_{WW}$ between empty-well body material 184A and empty-well drain 184B occurs generally along the locations of their maximum lateral bulges. This arises because average depths $y_{PWPK}$ and $y_{NWPK}$ of the deep subsurface concentration maxima in body material 184A and drain 184B are largely equal in the example of FIGS. 11.2 and 13*a*. A difference between depths $y_{PWPK}$ and $y_{NWPK}$ would typically cause the location of minimum well-to-well separation $L_{WW}$ for IGFET 104 to move somewhat away from the location indicated in FIG. 13*a* and to be somewhat slanted relative to the upper semiconductor surface rather than being fully lateral as indicated in FIG. 13*a*.

Well-separating portion 136A is lightly doped because it constitutes part of p− substrate region 136. The deep concentration maximum of the p-type dopant in p-type empty-well body material 184A occurs in its moderately doped lower part (328L). The deep concentration maximum of the n-type dopant in n-type empty-well drain 184B similarly occurs in its moderately doped lower part (336L). Hence, the moderately doped lower part (328L) of p-type body material 184A and the moderately doped lower part (336L) of n-type drain 184B are laterally separated by a more lightly doped portion of the semiconductor body.

Channel zone 322 (not specifically demarcated in FIG. 11.2 or 13*a*) consists of all the p-type monosilicon between source 320 and drain 184B. In particular, channel zone 322 is formed by a surface-adjoining segment of well-separating portion 136A, a surface-adjoining segment of the p− upper part (328U) of body-material portion 328, and (a) all of p halo pocket portion 326 if source 320 extends deeper than halo pocket 326 as illustrated in the example of FIGS. 11.2 and 13*a* or (b) a surface-adjoining segment of halo pocket 326 if it extends deeper than source 320. In any event, halo pocket 326 is more heavily doped p-type than the directly adjacent material of the p− upper part (328U) of body-material portion 328 in channel zone 322. The presence of halo pocket 326 along source 320 thereby causes channel zone 322 to be asymmetrically longitudinally dopant graded. The presence of the surface-adjoining segment of well-separating portion 136A in channel zone 322 causes it to be further asymmetrically longitudinally dopant graded.

Drain 184B extends below recessed field insulation 138 so as to electrically connect material of drain 184B in island 144A to material of drain 184B in island 144B. In particular, field insulation 138 laterally surrounds n++ drain contact portion 334 and an underlying more lightly doped portion 184B1 of empty-well drain 184B. A portion 138A of field insulation 138 thereby laterally separates drain contact portion 334 and more lightly doped underlying drain portion 184B1 from a portion 184B2 of drain 184B situated in island 144A. Drain portion 184B2 is continuous with p− well-separating portion 136A and extends up to the upper semiconductor surface. The remainder of drain 184B is identified as item 184B3 in FIG. 13*a* and consists of the n-type drain material extending from the bottoms of islands 144A and 144B down to the bottom of drain 184B. Since drain 184B extends below field insulation 138 and thus considerably deeper than source 320, the bottom of channel zone 322 slants considerably downward in moving from source 320 to drain 184B.

A gate dielectric layer 344 at the $t_{GdH}$ high thickness value is situated on the upper semiconductor surface and extends over channel zone 322. A gate electrode 346 is situated on gate dielectric layer 344 above channel zone 322. Gate electrode 346 extends partially over source 320 and drain 184B. More particularly, gate electrode 346 extends partially over source extension 320E but not over main source portion 320M. Gate electrode 346 extends over drain portion 184B2 and partway, typically approximately halfway, across field-insulation portion 138A toward drain contact portion 334. Dielectric sidewall spacers 348 and 350 are situated respectively along the opposite transverse sidewalls of gate electrode 346. Metal silicide layers 352, 354, and 356 are respectively situated along the tops of gate electrode 346, main source portion 320M, and drain contact portion 334.

Dielectric sidewall spacers 348 and 350 are L-shaped spacers often respectively referred to as source-side and drain-side spacers because they respectively extend along the source-side and drain-side lateral sides of gate electrode 346. Analogous to L-shaped spacers 264 and 266 of IGFET 100, each L-shaped spacer 348 or 350 of IGFET 104 consists of a first L-shaped spacer layer SA and a chemically different second L-shaped spacer layer SB situated on first spacer layer SA. With spacers 348 and 350 configured the same as spacers 264 and 266, the laterally extending portion of source-side spacer 348 is situated above part of main source portion 320M and part of source extension 320E. The laterally extending portion of drain-side spacer 350 is situated above field-insulation portion 138A. Depending on the lateral width of field-insulation portion 138A, the laterally extending portion of drain-side spacer 350 may also extend over part of drain contact portion/main drain portion 334.

Extended-drain IGFET 104 is in the biased-on state when (a) its gate-to-source voltage $V_{GS}$ equals or exceeds its positive threshold voltage $V_T$ and (b) its drain-to-source voltage $V_{DS}$ is at a sufficiently positive value as to cause electrons to flow from source 320 through channel zone 322 to drain 184B. When gate-to-source voltage $V_{GS}$ of IGFET 104 is less than its threshold voltage $V_T$ but drain-to-source voltage $V_{DS}$ is at a sufficiently positive value that electrons would flow from source 320 through channel zone 322 to drain 184B if gate-to-source voltage $V_{GS}$ equaled or exceeded its threshold voltage $V_T$ so as to make IGFET 104 conductive, IGFET 104 is in the biased-off state. In the biased-off state, there is no significant flow of electrons from source 320 through channel zone 322 to drain 184B as long as drain-to-source voltage $V_{DS}$ is not high enough to place IGFET 104 in a breakdown condition.

The doping characteristics of empty-well body material 184A and empty-well drain 184B cause the peak magnitude of the electric field in the monosilicon of extended-drain IGFET 104 to occur significantly below the upper semiconductor surface when IGFET 104 is in the biased-off state. During IGFET operation, IGFET 104 undergoes considerably less deterioration due to hot-carrier gate dielectric charging than a conventional extended-drain IGFET in which the peak magnitude of the electric field in the IGFET's monosilicon occurs along the upper semiconductor surface. The reliability of IGFET 104 is increased considerably.

An explanation of how the doping characteristics of empty-well body material 184A and empty-well drain 184B enable the peak magnitude of the electric field in the monosilicon of IGFET 104 to occur significantly below the upper semiconductor surface when IGFET 104 is in the biased-off state is presented in U.S. patent application Ser. No. 12/382,973, cited above. Briefly, empty main well maximum dopant concentration depths $y_{PWPK}$ and $y_{NWPK}$ are of similar values with p-type empty main well maximum concentration depth $y_{PWPK}$ in p-type empty-well body-material 184A typically being slightly greater than n-type empty main well maximum concentration depth $y_{NWPK}$ in n-type empty-well drain 184B.

Both of empty main well maximum dopant concentration depths $y_{PWPK}$ and $y_{NWPK}$ of IGFET 104 are greater than maximum depth $y_S$ of source 320. Each of depths $y_{PWPK}$ and $y_{NWPK}$ is normally at least twice maximum source depth $y_S$ of IGFET 104 but normally no more than 10 times, preferably no more than 5 times, more preferably no more than 4 times, source depth $y_S$ of IGFET 104. For example, each depth $y_{PWPK}$ or $y_{NWPK}$ is typically 2-3 times source depth $y_S$.

Beginning with empty-well body material 184A, the concentration of the p-type empty main well dopant decreases, typically substantially monotonically, by at least a factor of 10, preferably by at least a factor of 20, more preferably by at least a factor of 40, in moving from the location of the maximum concentration of the p-type empty main well dopant at depth $y_{PWPK}$ upward along a selected imaginary vertical line through p-type empty-well body-material portion 328, including the portion of channel zone. 322 between halo pocket portion 326 and portion 136A of p− substrate region 136, to the upper semiconductor surface. For example, the concentration of the p-type empty main well dopant typically decreases substantially monotonically by more than a factor of 80, in the vicinity of a factor of 100, in moving from the $y_{PWPK}$ location of the maximum concentration of the p-type empty main well dopant upward along the selected vertical line through body-material portion 328 to the upper semiconductor surface. The concentration of the total p-type dopant reaches a maximum largely at depth $y_{PWPK}$ along the selected vertical line and has largely the same variation as the concentration of the p-type empty main well dopant along the vertical line for depth y no greater than $y_{PWPK}$.

Turning to n-type empty-well drain 184B, the concentration of the n-type empty main well dopant similarly decreases, typically substantially monotonically, by at least a factor of 10, preferably by at least a factor of 20, more preferably by at least a factor of 40, in moving from the location of the maximum concentration of the n-type empty main well dopant at depth $y_{NWPK}$ upward along a selected imaginary vertical line through portions 184B3 and 184B2 of empty-well drain 184B to the upper semiconductor surface. For instance, the concentration of the n-type empty main well dopant typically decreases by more than a factor of 80, in the vicinity of a factor of 100, in moving from the $y_{NWPK}$ location of the maximum concentration of the n-type empty main well dopant upward along the selected vertical line through portions 184B3 and 184B2 of drain 184B to the upper semiconductor surface. The concentration of the total n-type dopant reaches a maximum at depth $y_{NWPK}$ along the vertical line and varies the same along the vertical line through portions 184B2 and 184B3 of n-type empty-well drain 184B as the concentration of the n-type empty main well dopant.

E2. Operational Physics of Extended-Drain N-Channel IGFET

The foregoing empty-well characteristics enable extended-drain n-channel IGFET 104 to have the following device physics and operational characteristics. When IGFET 104 is in the biased-off state, the electric field in the IGFET's monosilicon reaches a peak value along drain-body junction 226 at a location determined by the proximity of empty well regions 184A and 184B to each other and by the maximum values of (a) concentration $N_T$ of the total p-type dopant in portion 328 of p-type empty-well body material 184A and (b) concentration $N_T$ of the total n-type dopant in portions 184B2 and 184B3 of n-type empty-well drain 184B. Because depth $y_{PWPK}$ at the maximum value of concentration $N_T$ of the total p-type dopant in p-type empty-well body-material portion 328 normally approximately equals depth $y_{NWPK}$ at the maximum value of concentration $N_T$ of the total n-type dopant in portions 184B2 and 184B3 of n-type empty-well drain 184B and because empty wells 184A and 184B are closest to each other at depths $y_{PWPK}$ and $y_{NWPK}$, the peak value of the electric field in the monosilicon of IGFET 104 occurs approximately along drain-body junction 226 at depth $y_{NWPK}$. This location is indicated by circle 358 in FIG. 13*a*. Inasmuch as depth $y_{NWPK}$ is normally at least twice maximum depth $y_S$ of source 320, location 358 of the peak electric field in the monosilicon of IGFET 104 is normally at least twice maximum source depth $y_S$ of IGFET 104 when it is in the biased-off state.

When IGFET 104 is in the biased-on state, electrons flowing from source 320 to drain 184B initially travel in the monosilicon along the upper surface of the portion of channel zone 322 in empty-well body material 184A. Upon entering portion 136A of p− substrate region 136, the electrons move generally downward and spread out. Upon reaching drain 184B, the electron flow becomes distributed across the generally vertical portion of drain-body junction 226 in island 144A. The electron flow is also spread out laterally across portion 184B2 of drain 184B.

The velocities of the electrons, referred to as primary electrons, increase as they travel from source 320 to drain 184B, causing their energies to increase. Impact ionization occurs in drain 184B when highly energetic primary electrons strike atoms of the drain material to create secondary charge carriers, both electrons and holes, which travel generally in the direction of the local electric field. Some of the secondary charge carriers, especially the secondary holes, generated in the bulk region of high electric field travel upward toward the portion of dielectric layer 344 overlying portion 184B2 of drain 184B.

The amount of impact ionization generally increases as the electric field increases and as the current density of the primary electrons increases. The maximum amount of impact ionization occurs where the scalar product of the electric field vector and the primary electron current density vector is highest. By having the peak electric field occur along drain-body junction 226 at depth $y_{NWPK}$, impact ionization in drain 184B is forced significantly downward. The maximum amount of impact ionization in drain 184B normally occurs at a depth greater than maximum source depth $y_S$ of IGFET 104.

Compared to a conventional n-channel extended-drain IGFET of approximately the same size as IGFET 104, considerably fewer secondary charge carriers, especially secondary holes, generated by impact ionization in IGFET 104 reach the upper semiconductor surface with sufficient energy to enter gate dielectric layer 344. Hot carrier charging of gate dielectric 344 is considerably reduced. IGFET 104 thereby incurs much less threshold voltage drift caused by impact-ionization-generated charge carriers lodging in gate dielectric 344. The operating characteristics of IGFET 104 are very stable with operational time. The reliability and lifetime of IGFET 104 are considerably enhanced.

Threshold voltage $V_T$ of n-channel IGFET 104 is normally 0.5 V to 0.7 V, typically 0.6 V, at a drawn channel length $L_{DR}$ in the vicinity of 0.5 μm and a gate dielectric thickness of 6-6.5 nm. Extended-drain IGFET 104 is particularly suitable for power, high-voltage switching, EEPROM programming, and ESD protection applications at an operational voltage range, e.g., 12 V, considerably higher than the typically 3.0-V high-voltage operational range of asymmetric n-channel IGFET 100.

E3. Structure of Extended-Drain P-Channel IGFET

Extended-drain extended-voltage p-channel IGFET 106 is configured similarly to extended-drain extended-voltage n-channel IGFET 104. However, there are some notable differences due to the fact that deep n well 212 of p-channel IGFET 106 does not reach the upper semiconductor surface.

Referring to FIGS. 11.2 and 13*b*, p-channel IGFET 106 has a p-type first S/D zone 360 situated in active semiconductor island 146A along the upper semiconductor surface. The combination of empty main well region 186B and a surface-adjoining portion 136B of p− substrate region 136 constitutes a p-type second S/D zone 186B/136B for IGFET 106. Parts of p-type S/D zone 186B/136B are, as described further below, situated in both of active semiconductor islands 146A and 146B. S/D zones 360 and 186B/136B are often respectively referred to below as source 360 and drain 186B/136B because they normally, though not necessarily, respectively function as source and drain.

Source 360 and drain 186B/136B are separated by a channel zone 362 of n-type body material formed with n-type empty main well region 186A and deep n well region 212. N-type empty-well body material 186A, i.e., portion 186A of total body material 186A and 212, forms a source-body pn junction 364 with p-type source 360. Deep n well 212 and n-type body material 186A form drain-body pn junction 228 with drain 186B/136B. Drain-body junction 228 consists of three parts. One part of drain-body junction 228 is between deep n well 212 and p-type empty main well region 186B. Another part of junction 228 is between deep n well 212 and p- substrate drain portion 136B. The remaining part of junction 228 is between n-type empty main well region 186A and p- drain portion 136B. Empty main well regions 186A and 186B are often respectively described below as empty-well body material 186A and empty-well drain material 186B in order to clarify the functions of empty wells 186A and 186B.

P-type source 360 consists of a very heavily doped main portion 360M and a more lightly doped, but still heavily doped, lateral extension 360E. External electrical contact to source 360 is made via p++ main source portion 360M. P+ source extension 360E terminates channel zone 362 along the upper semiconductor surface at the source side of IGFET 106.

Main source portion 360M extends deeper than source extension 360E. As a result, the maximum depth $y_S$ of source 360 is the maximum depth $y_{SM}$ of main source portion 360M. Maximum source depth $y_S$ for IGFET 106 is indicated in FIG. 13*b*. Main source portion 360M and source extension 360E are respectively defined with the p-type main S/D and shallow source extension dopants.

A moderately doped halo pocket portion 366 of n-type empty-well body material 186A extends along source 360 up to the upper semiconductor surface and terminates at a location within body material 186A and thus between source 360 and drain 186B/136B. FIGS. 11.2 and 13*b* illustrate the situation in which source 360, specifically main source portion 360M, extends deeper than n source-side halo pocket 366. As an alternative, halo pocket 366 can extend deeper than source 360. In that case, halo pocket 366 extends laterally under source 360. Halo pocket 366 is defined with the n-type source halo dopant.

The portion of n-type empty-well body material 186A outside source-side halo pocket portion 366 is indicated as item 368 in FIGS. 11.2 and 13*b*. In moving from the location of the deep n-type empty-well concentration maximum in body material 186A toward the upper semiconductor surface along a selected imaginary vertical line through channel zone 362 outside halo pocket 366, the concentration of the n-type dopant in body-material portion 368 drops gradually from a moderate doping, indicated by symbol "n", to a light doping, indicated by symbol "n−". Dotted line 372 (only labeled in FIG. 13*b*) roughly represents the location below which the n-type dopant concentration in body-material portion 368 is at the moderate n doping and above which the n-type dopant concentration in portion 368 is at the light n− doping. The moderately doped part of body-material portion 368 below line 372 is indicated as n lower body-material part 368L in FIG. 13*b*. The lightly doped part of body-material portion 368 above line 372 outside n halo pocket 366 is indicated as n-upper body-material part 368U in FIG. 13*b*.

The n-type dopant in n-type body-material portion 368 consists of the n-type empty main well dopant, the deep n well dopant that forms deep n well 212, and (near n halo pocket portion 366) the n-type source halo dopant that forms halo pocket portion 366. The concentration of the deep n well dopant is very small compared to the concentration of the n-type empty main well dopant at average n-type empty main well maximum concentration depth $y_{NWPK}$. Because the n-type empty main well dopant in n-type empty-well body material 186A reaches a deep subsurface concentration maximum along a subsurface location at average depth $y_{NWPK}$, the presence of the n-type empty main well dopant in body-material portion 368 causes the concentration of the total n-type dopant in portion 368 to reach a deep local subsurface concentration maximum substantially at the location of the deep subsurface concentration maximum in body material 186A. The deep subsurface concentration maximum in body-material portion 368, as indicated by the left-hand dash-and-double-dot line labeled "MAX" in FIG. 13*b*, extends laterally below the upper semiconductor surface and likewise occurs at average depth $y_{NWPK}$. The occurrence of the deep subsurface concentration maximum in body-material portion 368 causes it to bulge laterally outward. The maximum bulge in body-material portion 368, and thus in body material 186A, occurs along the location of the deep subsurface concentration maximum in portion 368 of body material 186A.

P-type drain 186B/136B, specifically empty-well drain material 186B, includes a very heavily doped external contact portion 374 situated in active semiconductor island 146B along the upper semiconductor surface. P++ external drain contact portion 374 is sometimes referred to here as the main drain portion because, similar to main source portion 360M, drain contact portion 374 is very heavily doped, is spaced apart from channel zone 362, and is used in making external electrical contact to IGFET 106. The portion of empty well 186B outside n++ external drain contact portion/main drain portion 374 is indicated as item 376 in FIGS. 11.2 and 13*b*.

In moving from the location of the deep p-type empty-well concentration maximum in empty well 186B toward the upper semiconductor surface along a selected imaginary vertical line through island 146A, the concentration of the p-type dopant in drain 186B/136B drops gradually from a moderate doping, indicated by symbol "p", to a light doping, indicated by symbol "p−". Dotted line 380 (only labeled in FIG. 13*b*) roughly represents the location below which the p-type dopant concentration in empty-well drain portion 376 is at the moderate p doping and above which the p-type dopant concentration in portion 376 is at the light p− doping. The moderately doped part of drain portion 376 below line 380 is indicated as p lower empty-well drain part 376L in FIG. 13*b*. The lightly doped part of drain portion 376 above line 380 is indicated as p− upper empty-well drain part 376U in FIG. 13*b*.

The p-type dopant in p-type empty-well drain portion 376 consists of the p-type empty main well dopant, the largely constant p-type background dopant of p− substrate region 136, and (near p++ drain contact portion 374) the p-type main S/D dopant utilized, as described below, to form drain contact portion 374. Since the p-type empty main well dopant in p-type drain 186B/136B reaches a deep subsurface concentration maximum at average depth $y_{PWPK}$, the presence of the p-type empty main well dopant in drain portion 376 causes the concentration of the total p-type dopant in portion 376 to reach a deep local subsurface concentration maximum substantially at the location of the deep subsurface concentration maximum in well 186B. The deep subsurface concentration maximum in drain portion 376, as indicated by the right-hand dash-and-double-dot line labeled "MAX" in FIG. 13*b*, extends laterally below the upper semiconductor surface and likewise occurs at average depth $y_{PWPK}$. The occurrence of the deep subsurface concentration maximum in empty-well drain portion 376 causes it to bulge laterally outward. The maximum bulge in drain portion 376, and thus in empty well 186B, occurs along the location of the deep subsurface concentration maximum in portion 376 of well 186B.

The deep n well dopant used to form deep n well 212 reaches a maximum subsurface dopant concentration along a location extending laterally below main wells 186A and 186B and the doped monosilicon situated between wells 186A and 186B. Somewhat similar to how the dopant concentration in each well 186A or 186B changes in moving from the location of the maximum well dopant concentration toward the upper semiconductor surface, the concentration of the n-type dopant in deep n well 212 drops gradually from a moderate doping, indicated by symbol "n", to a light doping, indicated by symbol "n−", in moving from the location of the maximum dopant concentration maximum in well 212 toward the upper semiconductor surface along a selected imaginary vertical line extending through the monosilicon situated between main wells 186A and 186B. Dotted line 382 (only labeled in FIG. 13*b*) roughly represents the location below which the n-type dopant concentration in deep n well 212 is at the moderate n doping and above which the n-type dopant concentration in deep n well 212 is at the light n− doping. The moderately doped part of deep n well 212 below line 382 is indicated as n lower well part 212L in FIG. 13*b*. The lightly doped part of deep n well 212 above line 382 is indicated as n− upper well part 212U in FIG. 13*b*.

Empty-well body material 186A, specifically empty-well body-material portion 368, and empty-well drain material 186B, specifically empty-well drain portion 376, are laterally separated by a well-separating portion of the semiconductor body. The well-separating portion for IGFET 106 consists of (a) the lightly doped upper part (212U) of deep n well 212 and (b) overlying drain portion 136B. FIG. 13*b* indicates that minimum well-to-well separation distance $L_{WW}$ between empty-well body material 186A and well 186B occurs generally along the locations of their maximum lateral bulges. This arises because average depths $y_{NWPK}$ and $y_{PWPK}$ of the deep subsurface concentration maxima in body material 186A and well 186B are largely equal in the example of FIGS. 11.2 and 13*b*. A difference between depths $y_{NWPK}$ and $y_{PWPK}$ would typically cause the location of minimum well-to-well separation $L_{WW}$ for IGFET 106 to move somewhat away from the location indicated in FIG. 13*b* and to be somewhat slanted relative to the upper semiconductor surface rather than being fully lateral as indicated in FIG. 13*b*.

Letting the well-separating portion for IGFET 106 be referred to as well-separating portion 212U/136B, drain portion 136B of well-separating portion 212U/136B is lightly doped p-type since portion 136B is part of p− substrate region 136. Part 212U of well-separating portion 212U/136B is lightly doped n-type since part 212U is the lightly doped upper part of deep n well 212. The deep concentration maximum of the n-type dopant in n-type empty-well body material 186A occurs in its moderately doped lower part (368L). The deep concentration maximum of the p-type dopant in p-type empty well 186B similarly occurs in its moderately doped lower part (376L). Hence, the moderately doped lower part (368L) of n-type body material 186A and the moderately doped lower part (376L) of p-type well 186B are laterally separated by a more lightly doped portion of the semiconductor body.

Channel zone 362 (not specifically demarcated in FIG. 11.2 or 13*b*) consists of all the n-type monosilicon between source 360 and drain 186B/136B. In particular, channel zone 362 is formed by a surface-adjoining segment of the n− upper part (368U) of body-material portion 368, and (a) all of n halo pocket portion 366 if source 360 extends deeper than halo pocket 366 as illustrated in the example of FIGS. 11.2 and 13*b* or (b) a surface-adjoining segment of halo pocket 366 if it extends deeper than source 360. In any event, halo pocket 366 is more heavily doped n-type than the directly adjacent material of the n− upper part (368U) of body-material portion 368 in channel zone 362. The presence of halo pocket 366 along source 360 thereby causes channel zone 362 to be asymmetrically longitudinally dopant graded.

Well region 186B of drain 186B/136B extends below recessed field insulation 138 so as to electrically connect material of drain 186B/136B in island 146A to material of drain 186B/136B in island 146B. In particular, field insulation 138 laterally surrounds p++ drain contact portion 374 and an underlying more lightly doped portion 186B1 of drain 186B/136B. A portion 138B of field insulation 138 thereby laterally separates drain contact portion 374 and more lightly doped underlying drain portion 186B1 from a portion 186B2 of well 186B situated in island 146A. Drain portion 186B2 is continuous with lightly doped well-separating portion 212U/136B and extends up to the upper semiconductor surface. The remainder of well 186B is identified as item 186B3 in FIG. 13*b* and consists of the n-type drain material extending from the bottoms of islands 146A and 146B down to the bottom of well 186B.

A gate dielectric layer 384 at the $t_{GdH}$ high thickness value is situated on the upper semiconductor surface and extends over channel zone 362. A gate electrode 386 is situated on gate dielectric layer 384 above channel zone 362. Gate electrode 386 extends partially over source 360 and drain 186B/136B. More particularly, gate electrode 386 extends partially over source extension 360E but not over main source portion 360M. Gate electrode 386 extends over drain portions 136B and 186B2 and partway, typically approximately halfway, across field-insulation portion 138B toward drain contact portion 374. Dielectric sidewall spacers 388 and 390 are situated respectively along the opposite transverse sidewalls of gate electrode 386. Metal silicide layers 392, 394, and 396 are respectively situated along the tops of gate electrode 386, main source portion 360M, and drain contact portion 374.

Dielectric sidewall spacers 388 and 390 are L-shaped spacers often respectively referred to as source-side and drain-side spacers because they respectively extend along the source-side and drain-side lateral sides of gate electrode 386. As with L-shaped spacers 264 and 266 of asymmetric IGFET 100 and thus as with L-shaped spacers 348 and 350 of extended-drain IGFET 104, each L-shaped spacer 388 or 390 of IGFET 106 consists of a first L-shaped spacer layer SA and a chemically different second L-shaped spacer layer SB situated on first spacer layer SA. With spacers 388 and 390 configured the same as spacers 348 and 350, the laterally extending portion of source-side spacer 388 is situated above part of main source portion 360M and part of source extension 360E. The laterally extending portion of drain-side spacer 390 is situated above field-insulation portion 138B. Depending on the lateral width of field-insulation portion 138B, the laterally extending portion of drain-side spacer 390 may also extend over part of drain contact portion/main drain portion 374.

Extended-drain IGFET 106 is in the biased-on state when (a) its gate-to-source voltage $V_{GS}$ equals or is less than its negative threshold voltage $V_T$ and (b) its drain-to-source voltage $V_{DS}$ is at a sufficiently negative value as to cause holes to flow from source 360 through channel zone 362 to drain 186B/136B. When gate-to-source voltage $V_{GS}$ of IGFET 106 exceeds its threshold voltage $V_T$ but drain-to-source voltage $V_{DS}$ is at a sufficiently negative value that holes would flow from source 360 through channel zone 362 to drain 186B/136B if gate-to-source voltage $V_{GS}$ equaled or were less than its threshold voltage $V_T$ so as to make IGFET 106 conductive, IGFET 106 is in the biased-off state. In the biased-off state, there is no significant flow of holes from source 360 through channel zone 362 to drain 186B/136B as long as drain-to-source voltage $V_{DS}$ is not low enough, i.e., of a sufficiently high negative value, to place IGFET 106 in a breakdown condition.

The doping characteristics of empty-well body material 186A and empty well region 186B of drain 186B/136B are likewise of such a nature that the peak magnitude of the electric field in the monosilicon of IGFET 106 occurs significantly below the upper semiconductor surface when IGFET 106 is in the biased-off state. Stress is relieved along the upper semiconductor surface, particularly where drain 186B meets gate dielectric layer 384. Consequently, dielectric layer 384 undergoes considerably less deterioration during IGFET operation than in a conventional extended-drain IGFET whose electric field reaches a maximum in the monosilicon along the upper semiconductor surface. IGFET 106 has considerably enhanced lifetime and reliability.

The empty-well doping characteristics that cause the peak magnitude of the electric field in the monosilicon of p-channel IGFET 106 to occur significantly below the upper semiconductor surface when IGFET 106 is in the biased-off state are quite similar to the empty-well doping characteristics of n-channel IGFET 104.

An explanation of how the doping characteristics of empty-well body material 186A and empty-well region 184B of drain 186B/136B enable the peak magnitude of the electric field in the monosilicon of IGFET 106 to occur significantly below the upper semiconductor surface when IGFET 106 is in the biased-off state is presented in U.S. patent application Ser. No. 12/382,973, cited above. Briefly, the concentration of the n-type empty well dopant in n-type empty-well body material 186A reaches a maximum concentration largely at average depth $y_{NWPK}$ along a selected imaginary vertical line through body-material portion 368 of body material 186A. The concentration of the p-type empty main well dopant in portions 186B2 and 186B3 of empty well 186B of n-type drain 186B/136B reaches a maximum concentration largely at average depth $y_{PWPK}$ along a selected imaginary vertical line through portions 186B2 and 186B3 of empty well 186B. The dopant concentration maxima largely at roughly equal depths $y_{NWPK}$ and $y_{PWPK}$ in empty-well body material 186A and empty well 186B arise, as mentioned above, from respective ion implantations of the n-type and p-type empty main well dopants.

Both of empty main well maximum dopant concentration depths $y_{NWPK}$ and $y_{PWPK}$ of IGFET 106 are greater than maximum depth $y_S$ of source 360. Each of depths $y_{NWPK}$ and $y_{PWPK}$ is normally at least twice maximum source depth $y_S$ of IGFET 106 but normally no more than 10 times, preferably no more than 5 times, more preferably no more than 4 times, source depth $y_S$ of IGFET 106. Each depth $y_{PWPK}$ or $y_{NWPK}$ is typically 2-4 times source depth $y_S$.

The concentration of the n-type empty main well dopant decreases, typically substantially monotonically, by at least a factor of 10, preferably by at least a factor of 20, more preferably by at least a factor of 40, in moving from the location of the maximum concentration of the n-type empty main well dopant at depth $y_{NWPK}$ upward along the selected vertical line through n-type empty-well body-material portion 368, including the portion of channel zone 362 outside halo pocket portion 366, to the upper semiconductor surface. For example, the concentration of the n-type empty main well dopant typically decreases by more than a factor of 80, in the vicinity of a factor of 100, in moving from the $y_{NWPK}$ location of the maximum concentration of the n-type empty main well dopant upward along the selected vertical line through body-material portion 368 to the upper semiconductor surface. The concentration of the total n-type dopant in body-material portion 368 also reaches a maximum largely at depth $y_{NWPK}$ along the vertical line and has largely the same variation as the concentration of the n-type empty main well dopant along the vertical line for depth y no greater than $y_{NWPK}$.

Moving to p-type empty well region 186B of drain 186B/136B, the concentration of the p-type empty main well dopant decreases, typically substantially monotonically, by at least a factor of 10, preferably by at least a factor of 20, more preferably by at least a factor of 40, in moving from the location of the maximum concentration of the p-type empty main well dopant at depth $y_{PWPK}$ upward along the selected vertical line through portions 186B3 and 186B2 of drain 186B/136B to the upper semiconductor surface. For instance, the concentration of the p-type empty main well dopant decreases by more than a factor of 80, in the vicinity of a factor of 100, in moving from the $y_{PWPK}$ location of the maximum concentration of the p-type empty main well dopant upward along the selected vertical line through drain portions 186B3 and 186B2 to the upper semiconductor surface. The concentration of the total p-type dopant in portions 186B2 and 186B3 of empty well region 186B along the vertical line has largely the same variation as the concentration of the p-type empty main well dopant along the vertical line for depth y no greater than $y_{PWPK}$.

E4. Operational Physics of Extended-Drain P-Channel IGFET

Extended-drain p-channel IGFET 106 has very similar device physics and operational characteristics to extended-drain n-channel IGFET 104 subject to the voltage and charge polarities being reversed. The device physics and operation of IGFETS 104 and 106 do not differ significantly due to the fact that portion 136B of p− substrate 136 forms part of p-type drain 186B/136B of IGFET 106 whereas similarly located portion 136A of substrate 136 forms part of the overall p-type body material for IGFET 104. The drain characteristics of IGFET 106 are determined more by the substantial p-type doping in portions 186B2 and 186B3 of empty well region 186B of drain 186B/136B than by the lighter p-type doping in substrate portion 136B.

When IGFET 106 is in the biased-off state, the electric field in the IGFET's monosilicon reaches a peak value along drain-body junction 228 at a location determined by the proximity of empty well regions 186A and 186B to each other and by the maximum values of (a) the concentration of the total n-type dopant in portion 368 of n-type empty-well body material 186A and (b) the concentration of the total p-type dopant in portions 186B2 and 186B3 of p-type empty-well drain material 186B of drain 186B/136B. Because depth $y_{NWPK}$ at the maximum concentration of the total n-type dopant in n-type empty-well body-material portion 368 normally approximately equals depth $y_{PWPK}$ at the maximum concentration of the total p-type dopant in portions 186B2 and 186B3 of p-type drain 186B/136B and because empty wells 186A and 186B are closest to each other at depths $y_{NWPK}$ and $y_{PWPK}$, the peak value of the electric field in the monosilicon of IGFET 106 occurs approximately along drain-body junction 228 at depth $y_{PWPK}$. This location is indicated by circle 398 in FIG. 13*b*. Since depth $y_{PWPK}$ is normally at least twice maximum depth $y_S$ of source 360, location 398 of the peak electric field in the monosilicon of IGFET 106 is normally at least twice maximum source depth $y_S$ of IGFET 106 when it is in the biased-off state.

Holes moving in one direction essentially constitute electrons moving away from dopant atoms in the opposite direction. Upon placing IGFET 106 in the biased-on state, holes flowing from source 360 to drain 186B/136B initially travel in the monosilicon along the upper surface of the portion of channel zone 362 in empty-well body material 186A. As the holes enter p− substrate portion 136B of drain 186B/136B, they generally move downward and spread out. The holes move downward further and spread out more as they enter portion 186B2 of drain 186B/136B.

The velocities of the holes, referred to as primary holes, increase as they travel from source 360 to drain 186B/136B, causing their energies to increase. Impact ionization occurs in drain 186B/136B when highly energetic charge carriers strike atoms of the drain material to create secondary charge carriers, once again both electrons and holes, which travel generally in the direction of the local electric field. Some of the secondary charge carriers, especially the secondary electrons, generated in the bulk region of high electric field travel upward toward the portion of dielectric layer 384 overlying drain portion 186B2.

The amount of impact ionization generally increases with increasing electric field and with increasing primary hole current density. In particular, the maximum amount of impact ionization occurs generally where the scalar product of the electric field vector and the primary hole current density vector is highest. Because the peak electric field occurs along drain-body junction 228 at depth $y_{PWPK}$, impact ionization in drain 186B/136B is forced significantly downward. The highest amount of impact ionization in drain 186B/136B normally occurs at a depth greater than maximum source depth $y_S$ of IGFET 106.

In comparison to a conventional extended-drain p-channel IGFET of approximately the same size as IGFET 106, considerably fewer secondary charge carriers, especially secondary electrons, generated by impact ionization in IGFET 106 reach gate dielectric layer 384. As a result, gate dielectric 384 incurs considerable less hot carrier charging. Threshold voltage drift resulting from impact-ionization-generated charge carriers lodging in gate dielectric 384 is greatly reduced in IGFET 106. Its operating characteristics are very stable with operational time. The net result is that IGFET 106 has considerably enhanced reliability and lifetime.

Threshold voltage $V_T$ of p-channel IGFET 106 is normally −0.45 V to −0.7 V, typically −0.55 V to −0.6 V, at a drawn channel length $L_{DR}$ in the vicinity of 0.5 μm and a gate dielectric thickness of 6-6.5 nm. As with extended-drain IGFET 104, extended-drain IGFET 106 is particularly suitable for power, high-voltage switching, EEPROM programming, and ESD protection applications at an operational voltage range, e.g., 12 V, considerably higher than the typically 3.0-V high-voltage operational range of asymmetric p-channel IGFET 102.

F. Information Generally Applicable to all of Present IGFETs

The gate electrodes of n-channel IGFETs 100 and 104 both preferably consist of polysilicon doped very heavily n-type in the example of FIG. 11. Alternatively, the gate electrodes of IGFETs 100 and 104 can be formed with other electrically conductive material such as refractory metal, metal silicide, or polysilicon doped sufficiently p-type as to be electrically conductive. In the example of FIG. 11, the gate electrodes of p-channel IGFETs 102 and 106 both preferably consist of polysilicon doped very heavily p-type. The gate electrodes of IGFETs 102 and 106 can alternatively be formed with other electrically conductive material such as refractory metal, metal silicide, or polysilicon doped sufficiently n-type as to be electrically conductive. Each such refractory metal or metal silicide is chosen to have an appropriate work function for achieving suitable values of threshold voltage $V_T$.

The combination of each gate electrode 262, 302, 346, or 386 and overlying metal silicide layer 268, 308, 352, or 392 can be viewed as a composite gate electrode. The metal silicide layers typically consist of cobalt silicide. Nickel silicide or platinum silicide can alternatively be used for the metal silicide layers.

First spacer layers SA are typically constituted with silicon/oxygen dielectric material such as silicon oxide and/or tetraethyl orthosilicate. Second spacer layers SB are typically constituted with silicon/nitrogen dielectric material such as silicon nitride.

A depletion region (not shown) extends along the upper surface of channel zone 244, 284, 322, or 362 of each IGFET 100, 102, 104, or 106 during IGFET operation. The surface depletion region of each asymmetric high-voltage IGFET 100 or 102 has a maximum thickness normally less than 0.05 μm, typically in the vicinity of 0.03 μm. The maximum thickness of the surface depletion region of each extended-drain IGFET 104 or 106 is normally less than 0.06 μm, typically in the vicinity of 0.04 μm.

Figure 14A:
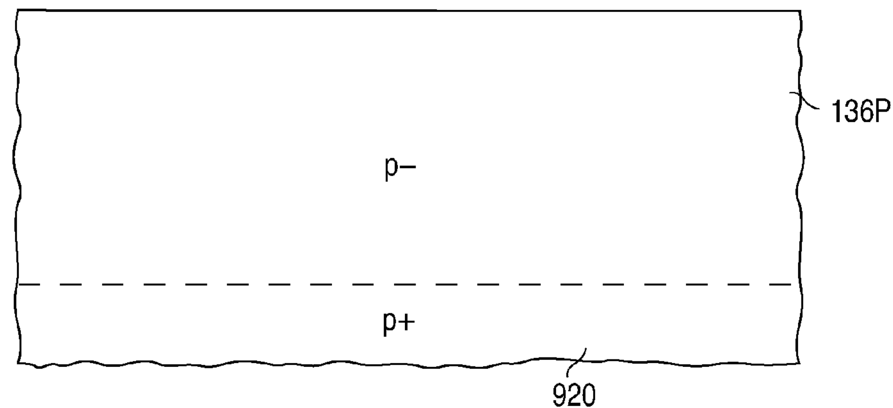
Figure 14B:
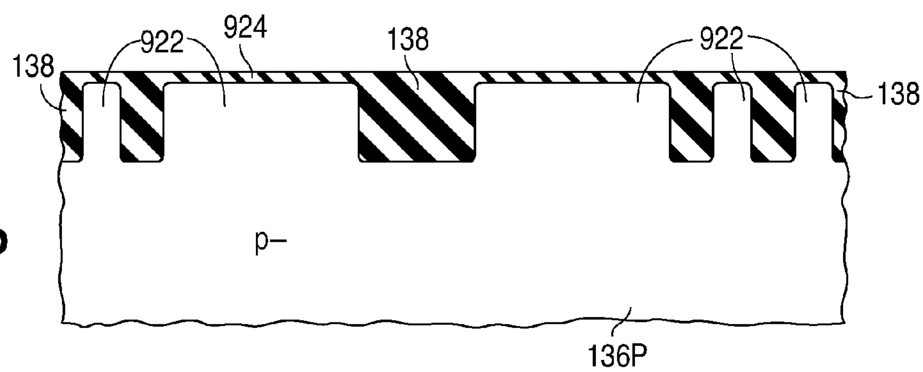
Figure 14C:
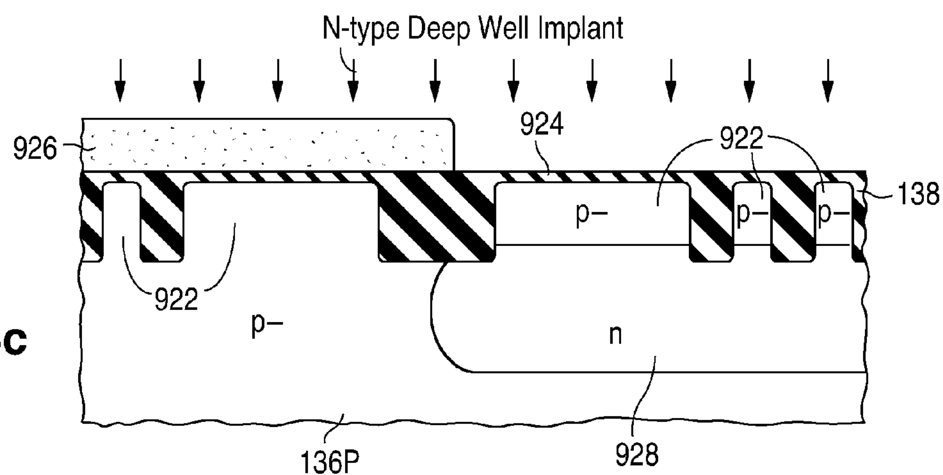

G. Fabrication of Complementary-IGFET Structure Suitable for Mixed-Signal Applications FIGS. 14*a*-14*c*, 14*d*.1-14*u*.1, and 14*d*.2-14*u*.2 (collectively "FIG. 14") illustrate a semiconductor process in accordance with the invention for manufacturing a CIGFET semiconductor structure containing asymmetric IGFETs 100, 102, 104, and 106. The semiconductor fabrication process of FIG. 14 is typically part of the semiconductor fabrication process described in U.S. patent application Ser. No. 12/382,973, cited above, for manufacturing the larger CIGFET structure. In order to shorten the fabrication description, steps needed to fabricate the symmetric IGFETs of the larger CIGFET structure, but not needed to fabricate IGFETs 100, 102, 104, and 106, are generally not described below.

The steps involved in the fabrication of asymmetric IGFETs 100, 102, 104, and 106 up through the formation of deep n wells, including deep n wells 210 and 212, are generally shown in FIGS. 14*a*-14*c*. FIGS. 14*d*.1-14*y*.1 illustrate later steps specifically leading to complementary asymmetric IGFETs 100 and 102 as depicted in FIG. 11.1. FIGS. 14*d*.2-14*y*.2 illustrate later steps specifically leading to complementary extended-drain IGFETs 104 and 106 as shown in FIG. 11.2.

Resistors, capacitors, and inductors can be readily provided with the semiconductor fabrication platform of FIG. 14. The resistors can be both of the monosilicon type and the polysilicon type. Bipolar transistors, both npn and pnp, can be provided along with diodes without increasing the number of steps needed to fabricate IGFETs 100, 102, 104, and 106. In addition, bipolar transistors can be provided by using the few additional steps described in U.S. patent application Ser. No. 12/382,966, cited above.

The semiconductor fabrication process of FIG. 14 includes a capacity for selectively providing deep n wells of which deep n wells 210 and 212 are examples. The presence or absence of a deep n well at a particular location in the present CIGFET structure depends on whether a masking plate (reticle) used in defining the deep n wells does, or does not, have a pattern for a deep n well at that location. Taking note that asymmetric IGFETs 100 and 102 utilize deep n well 210, a version of each asymmetric IGFET 100 or 102 lacking a deep n well can be simultaneously created according to the fabrication steps employed to create IGFET 100 or 102 having deep n well 210 by configuring the deep n well masking plate to avoid defining a deep n well at the location for the version of IGFET 100 or 102 lacking the deep n well.

The fabrication of any one of IGFETs 100, 102, 104, and 106 including any of their variations described above can be deleted from any particular implementation of the semiconductor fabrication process of FIG. 14. In that event, any step used in fabricating such a deleted IGFET can be deleted from that implementation of the present semiconductor fabrication process to the extent that the step is not used in fabricating any other IGFET being manufactured in the process implementation.

Ions of a semiconductor dopant implanted into the semiconductor body impinge on the upper semiconductor surface generally parallel to an impingement axis. For generally non-perpendicular ion impingement on the upper semiconductor surface, the impingement axis is at a tilt angle $\alpha$ to the vertical, i.e., to an imaginary vertical line extending generally perpendicular to the upper (or lower) semiconductor surface, more specifically to an imaginary vertical line extending perpendicular to a plane extending generally parallel to the upper (or lower) semiconductor surface. Inasmuch as the gate dielectric layers of the IGFETs extend laterally generally parallel to the upper semiconductor surface, tilt angle $\alpha$ can alternatively be described as being measured from an imaginary vertical line extending generally perpendicular to the gate dielectric layer of an IGFET.

The range of an ion-implanted semiconductor dopant is generally defined as the distance that an ion of the dopant-containing species travels through the implanted material in moving from the point on the implantation surface at which the ion enters the implanted material to the location of the maximum concentration of the dopant in the implanted material. When a semiconductor dopant is ion implanted at a non-zero value of tilt angle $\alpha$, the implantation range exceeds the depth from the implantation surface to the location of the maximum concentration of the dopant in the implanted material. The range of an ion-implanted semiconductor dopant is alternatively defined as the average distance that ions of the dopant-containing species travel through the implanted material before stopping. The two definitions for the implantation range typically yield largely the same numerical result.

Aside from the halo pocket ion implantation steps and some of the S/D-extension ion implantation steps, all of the ion implantation steps in the semiconductor fabrication platform of FIG. 14 are performed roughly perpendicular to the upper (or lower) semiconductor surface. More particularly, some of the roughly perpendicular ion implantation steps are performed virtually perpendicular to the upper semiconductor surface, i.e., at substantially a zero value of tilt angle $\alpha$. The value of tilt angle $\alpha$ is substantially zero in each ion implantation described below for which no value, or range of values, is given for tilt angle $\alpha$.

The remainder of the roughly perpendicular ion implantation steps are performed with tilt angle $\alpha$ set at a small value, typically 7°. This small deviation from perpendicularity is used to avoid undesirable ion channeling effects. For simplicity, the small deviation from perpendicularity is generally not indicated in FIG. 14.

Angled ion implantation refers to implanting ions of a semiconductor dopant at a significant non-zero value of tilt angle $\alpha$. For angled ion implantation, tilt angle $\alpha$ is normally at least 15°. Depending on whether an IGFET has one halo pocket portion or a pair of halo pocket portions, angled ion implantation is generally employed to provide an IGFET with semiconductor dopant for each such halo pocket portion. Angled ion implantation is also sometimes employed to provide certain of the IGFETs with S/D extensions. Tilt angle $\alpha$ is normally constant during each particular angled ion implantation but can sometimes be varied during an angled implantation.

As viewed perpendicular to a plane extending generally parallel to the upper (or lower) semiconductor surface, the image of the tilt angle's impingement axis on that plane is at an azimuthal angle $\beta$ to the longitudinal direction of at least one IGFET and thus at azimuthal angle $\beta$ to one of the semiconductor body's principal lateral directions. Each ion implantation at a non-zero value of tilt angle $\alpha$ is normally performed at one or more non-zero values of azimuthal angle $\beta$. This applies to both the angled ion implantations and the tilted implantations performed at a small value, again typically 7°, of tilt angle $\alpha$ to avoid ion channeling.

Most of the ion implantations at a non-zero value of tilt angle $\alpha$ are normally performed at one or more pairs of different values of azimuthal angle $\beta$. Each pair of values of azimuthal angle $\beta$ normally differs by approximately 180°. Approximately the same dosage of the ion-implanted semiconductor dopant is normally provided at each of the two values of each of the pairs of azimuthal-angle values.

Only one pair of azimuthal-angle values differing by approximately 180° is needed if the longitudinal directions of all the IGFETs in a group of IGFETs receiving semiconductor dopant during a tilted ion implantation extend in the same principal lateral direction of the semiconductor body. In that case, one half of the total implant dosage can be supplied at one of the azimuthal-angle values, and the other half of the total implant dosage is supplied at the other azimuthal-angle value. One choice for the two azimuthal-angle values is 0° and 180° relative to the semiconductor body's principal lateral direction extending parallel to the longitudinal directions of the IGFETs.

Four different values of azimuthal angle $\beta$, i.e., two pairs of different azimuthal-angle values, can be employed for a tilted ion implantation simultaneously performed on a group of IGFETs whose longitudinal directions variously extend in both of the semiconductor body's principal lateral directions. Each consecutive pair of values of azimuthal angle $\beta$ then normally differs by approximately 90°. In other words, the four values of azimuthal angle $\beta$ are $\beta_0$, $\beta_0$+90°, $\beta_0$+180°, and $\beta_0$+270° where $\beta_0$ is a base azimuthal-angle value ranging from 0° to just under 90°. For instance, if base value $\beta_0$ is 45°, the four values of azimuthal angle $\beta$ are 45°, 135°, 225°, and 315°. Ion implanting at four azimuthal-angle values with 90° angular increments is referred to as a four-quadrant implant. Approximately one fourth of the total implant dosage is supplied at each of the four azimuthal-angle values.

Tilted ion implantation, including angled ion implantation for which tilt angle $\alpha$ is normally at least 15°, can be done in various other ways. If an angled ion implantation is simultaneously performed on a group of asymmetric IGFETs laid out to have the same orientation so as to provide each asymmetric IGFET in the group only with a source extension or only with a source-side halo pocket portion, the angled implantation can be done at as little as a single value, e.g., 0°, of azimuthal angle $\beta$. Tilted ion implantation can also be done as the semiconductor body is rotated relative to the source of the semiconductor dopant so that azimuthal angle $\beta$ varies with time. For instance, azimuthal angle $\beta$ can vary with time at a variable or constant rate. The implant dosage is then typically provided to the semiconductor body at a variable or constant rate.

While tilted ion implantation can be done in different ways in different tilted implantation steps, each tilted implantation simultaneously performed on a group of IGFETs subsequent to defining the shapes of their gate electrodes is preferably done at four azimuthal-angle values of $\beta_0$, $\beta_0$+90°, $\beta_0$+180°, and $\beta_0$+270° with approximately one fourth of the total implant dosage supplied at each azimuthal-angle value. The tilted implantation characteristics of IGFETs oriented one way on the semiconductor body are respectively substantially the same as the tilted ion implantation characteristics of like-configured IGFETs that may be oriented another way in another way on the semiconductor body. This makes it easier for an IC designer to design an IC manufactured according to an implementation of the semiconductor fabrication platform of FIG. 14.

In each ion implantation performed after the gate-electrode shapes are defined and used to introduce a semiconductor dopant through one or more openings in a photoresist mask into one or more selected parts of the semiconductor body, the combination of the photoresist mask, the gate electrodes (or their precursors), and any material situated along the sides of the gate electrodes serves as a dopant-blocking shield to ions of the dopant impinging on the semiconductor body. Material situated along the sides of the gate electrodes may include dielectric sidewall spacers situated along at least the transverse sides of the gate electrodes.

When the ion implantation is an angled implantation performed at four 90° incremental values of azimuthal angle $\beta$ with material of the so-implanted regions, e.g., the halo pocket portions and some of the S/D extensions, extending significantly under the gate electrodes, the dopant-blocking shield may cause the implanted material below each gate electrode to receive ions impinging at no more than two of four incremental $\beta$ values. If base azimuthal-angle value $\beta_0$ is zero so that the four azimuthal-angle values are 0°, 90°, 180°, and 270°, the material below the gate electrode largely receives ions impinging at only a corresponding one of the four 0°, 90°, 180°, and 270° values. This dosage N' of impinging ions is referred to as a one quadrant dose $N'_1$.

If base azimuthal-angle value $\beta_0$ is greater than zero, the material below the gate electrode largely receives some ions impinging at one corresponding one of the four $\beta_0$, $\beta_0$+90°, $\beta_0$+180°, and $\beta_0$+270° values and other ions impinging at a corresponding adjacent one of the four $\beta_0$, $\beta_0$+90°, $\beta_0$+180°, and $\beta_0$+270° values. The total dosage N' of ions received by the material below the gate electrode is approximately:

$$N'=N'_1(\sin\beta_0+\cos\beta_0) \quad (1)$$

The maximum dose $N'_{max}$ of ions received by the material below the gate electrode occurs when base azimuthal-angle value $\beta_0$ is 45°. Using Eq. 1, maximum dose $N'_{max}$ is $\sqrt{2}N'_1$. Inasmuch as $\sqrt{2}$ is approximately 1.4, maximum dose $N'_{max}$ is only about 40% higher than one quadrant dose $N'_1$. For simplicity, dosage N' of ions received by material below the gate electrode is, except as otherwise indicated, approximated herein as a one quadrant dose $N'_1$ even though actual dosage N' varies from $N'_1$ to approximately $1.4N'_1$ depending on base azimuthal-angle value $\beta_0$.

The dopant-containing particle species of the n-type semiconductor dopant utilized in each of the n-type ion implantations in the fabrication process of FIG. 14 consists of the specified n-type dopant in elemental form except as otherwise indicated. In other words, each n-type ion implantation is performed with ions of the specified n-type dopant element rather than with ions of a chemical compound containing the dopant element. The dopant-containing particle species of the p-type semiconductor dopant employed in each of the p-type ion implantations variously consists of the p-type dopant, normally boron, in elemental or chemical compound form. Hence, each p-type ion implantation is normally performed with boron ions or with ions of a boron-containing chemical compound such as boron difluoride. The ionization charge state during each ion implantation is single ionization of the positive type except as otherwise indicated.

The n-type and p-type dopants diffuse both laterally and vertically during elevated-temperature operations, i.e., temperature significantly greater than room temperature. Lateral and vertical diffusion of the dopants used to define the source/drain zones and the halo pocket portions is generally indicated in FIG. 14. Upward vertical diffusion of the dopants that define the empty main well regions is shown in FIG. 14 because upward diffusion of those dopants is important to achieving the benefits of using empty main well regions in the present CIGFET structure. For simplicity in illustration, downward and lateral diffusion of the empty main well dopants is not indicated in FIG. 14. Nor does FIG. 14 generally indicate diffusion of any of the other well dopants.

Each anneal or other operation described below as being performed at elevated temperature includes a ramp-up segment and a ramp-down segment. During the ramp-up segment, the temperature of the then-existent semiconductor structure is increased from a low value to the indicated elevated temperature. The temperature of the semiconductor structure is decreased from the indicated elevated temperature to a low value, during the ramp-down segment. The time period given below for each anneal or other high-temperature operation is the time at which the semiconductor structure is at the indicated elevated temperature. No time period at the indicated elevated temperature is given for a spike anneal because the ramp-down segment begins immediately after the ramp-up segment ends and the temperature of the semiconductor structure reaches the indicated elevated temperature.

In some of the fabrication steps in FIG. 14, openings extend through a photoresist mask above the active semiconductor regions for two IGFETs. When the two IGFETs are formed laterally adjacent to each other in the exemplary cross sections of FIG. 14, the two photoresist openings are illustrated as a single opening in FIG. 14 even though they may be described below as separate openings.

The letter "P" at the end of a reference symbol appearing in the drawings of FIG. 14 indicates a precursor to a region which is shown in FIG. 11 and which is identified there by the portion of the reference symbol preceding "P". The letter "P" is dropped from the reference symbol in the drawings of FIG. 14 when the precursor has evolved sufficiently to largely constitute the corresponding region in FIG. 11.

The cross-sectional views of FIGS. **14*d*.1-14*u*.1 and 14*d*.2-14*u*.2 include situations in which part of the semiconductor structure is substantially the same in two consecutive cross-sectional views due to the presence of an item, such as a photoresist mask in the later view, that substantially prevents any change from occurring in that part of the semiconductor structure in going from the earlier view to the later view. In order to simplify the illustration of FIG. 14**, the later view in each of these situations is often provided with considerably reduced labeling.

G2. Well Formation

The starting point for the fabrication process of FIG. 14 is a monosilicon semiconductor body typically consisting of a heavily doped p-type substrate 920 and an overlying lightly doped p-type epitaxial layer 136P. See FIG. **14*a*. P+ substrate 920 is a semiconductor wafer formed with <100> monosilicon doped with boron to a concentration of $4\times10^{18}$-$5\times10^{18}$ atoms/cm$^3$ for achieving a typical resistivity of approximately 0.015 ohm-cm. For simplicity, substrate 920 is not shown in the remainder of FIG. 14. Alternatively, the starting point can simply be a p-type substrate lightly doped substantially the same as p− epitaxial layer 136**P.

Epitaxial layer 136P consists of epitaxially grown <100> monosilicon lightly doped p-type with boron to a concentration of approximately $4\times10^{14}$ atoms/cm$^3$ for achieving a typical resistivity of 30 ohm-cm. The thickness of epitaxial layer 136P is typically 5.5 μm. When the starting point for the fabrication process of FIG. 14 is a lightly doped p-type substrate, item 136P is the p− substrate.

Field-insulation region 138 is provided along the upper surface of p− epitaxial layer (or p− substrate) 136P as shown in FIG. 14*b* so as to define a group of laterally separated active monosilicon semiconductor islands 922 that include the active semiconductor islands for all of IGFETs 100, 102, 104, and 106. The active islands for IGFETs 100, 102, 104, and 106 are not individually indicated in FIG. 14*b*. Additional ones (also not separately indicated in FIG. 14*b*) of active islands 922 are used to provide electrical contact to main well regions 180, 182, 184A, and 186A, deep n well regions 210 and 212, and substrate region 136.

Field insulation 138 is preferably created according to a trench-oxide technique but can be created according to a local-oxidation technique. The depth of field insulation 138 is normally 0.35-0.55 μm, typically 0.45 μm. In providing field insulation 138, a thin screen insulating layer 924 of silicon oxide is thermally grown along the upper surface of epitaxial layer 136P.

A photoresist mask 926 having openings above the locations for deep n wells 210 and 212 and any other deep n wells is formed on screen oxide layer 924 as shown in FIG. 14*c*. The deep n well dopant is ion implanted at a moderate dosage through the openings in photoresist 926, through the uncovered sections of screen oxide 924, and into vertically corresponding portions of the underlying monosilicon to define a group of laterally separated deep n-type well regions 928, one of which is shown in FIG. 14*c*. Photoresist 926 is removed. Deep n well regions 928, which are situated below the upper semiconductor surface and extend upward into selected ones of active islands 922, respectively constitute precursors to deep n well regions 210 and 212 and any other deep n wells.

The dosage of the deep n well dopant is normally $1\times10^{13}$-$1\times10^{14}$ ions/cm$^2$, typically $1.5\times10^{13}$ ions/cm$^2$. The deep n well dopant normally consists of phosphorus or arsenic. For the typical case in which phosphorus constitutes the deep n well dopant, the implantation energy is normally 1,000-3,000 kiloelectron volts ("keV"), typically 1,500 keV.

An initial rapid thermal anneal ("RTA") is performed on the resultant semiconductor structure to repair lattice damage and place the atoms of the implanted deep n well dopant in energetically more stable states. The initial RTA is performed in a non-reactive environment at 900-1050° C., typically 950-1000° C., for 5-20 s, typically 10 s. The deep n well dopant diffuses vertically and laterally during the initial RTA. This dopant diffusion is not indicated in FIG. 14.

In the remainder of the process of FIG. 14, the CIGFET structure at each processing stage is illustrated with two FIGS. "14*z*.1" and "14*z*.2" where "z" is a letter varying from "d" to "u". Each FIG. 14*z*.1 illustrates additional processing done to create asymmetric high-voltage IGFETs 100 and 102 in FIG. 11.1. Each FIG. 14*z*.2 illustrates additional processing done to create asymmetric extended-drain IGFETs 104 and 106 in FIG. 11.2. Each group of two FIGS. 14*z*.1 and 14*z*.2 is, for convenience, collectively referred to below as "FIG. 14*z*" where "z" varies from "d" to "u". For instance, FIGS. 14*d*.1 and 14*d*.2 are collectively referred to as "FIG. 14*d*".

A photoresist mask 930 having openings above island 142 for asymmetric p-channel IGFET 102 and above the locations for n-type empty main well regions 184B and 186A of extended-drain IGFETs 104 and 106 is formed on screen oxide layer 924 as depicted in FIG. 14*d*. The edge of photoresist mask 930 that defines the side of empty main well 184B closest to the intended location for p-type empty main well region 184A of IGFET 104 is critically controlled to control separation distance $L_{WW}$ between empty wells 184A and 184B. The edge of photoresist 930 that defines the side of empty main well 186A closest to the intended location for p-type empty main well region 186B of IGFET 106 is critically controlled to control separation distance $L_{WW}$ between empty wells 186A and 186B.

The n-type empty main well dopant is ion implanted at a moderate dosage through the openings in photoresist 930, through the uncovered sections of screen oxide 924, and into vertically corresponding portions of the underlying monosilicon to define (a) an n precursor 182P to empty main well region 182 of IGFET 102 and (b) n precursors 184BP and 186AP to respective empty main well regions 184B and 186A of IGFETs 104 and 106. Photoresist 930 is removed. N precursor empty main wells 182P and 186AP respectively extend into, but only partway through, precursors 210P and 212P to deep n well regions 210 and 212.

The dosage of the n-type empty main well dopant is normally $1\times10^{13}$-$5\times10^{13}$ ions/cm$^2$, typically $2.5\times10^{13}$-$3\times10^{13}$ ions/cm$^2$. The n-type empty main well dopant normally consists of phosphorus or arsenic. For the typical case in which phosphorus constitutes the n-type empty main well dopant, the implantation energy is normally 350-500 keV, typically 425-450 keV.

The concentration of the n-type empty main well dopant in n precursor empty main well regions 182P, 184BP, and 186AP reaches respective local maxima along largely the same respective locations as in n-type final empty main well regions 182, 184B, and 186A. The n-type empty main well dopant concentration in each of precursor empty main wells 182P, 184BP, and 186AP varies vertically in roughly a Gaussian manner.

In moving from the location of the n-type empty main well dopant concentration maximum in each of precursor empty main wells 182P, 184BP, and 186AP toward the upper semiconductor surface, the n-type empty main well dopant concentration drops gradually from a moderate doping, indicated by symbol "n", to a light doping, indicated by symbol "n−". Dotted lines 296P, 340P, and 372P in FIG. 14*d* basically constitute respective precursors to dotted lines 296, 340, and 372 in FIG. 11. Although shown in FIG. 11.2, dotted lines 340 and 372 for IGFETs 104 and 106 are, as mentioned above, only labeled in FIGS. 13*a* and 13*b*. Each precursor dotted line 296P, 340P, or 372P thus roughly represents the location below which the n-type empty main well dopant concentration in corresponding precursor empty main well 182P, 184BP, or 186AP is at the moderate n doping and above which the n-type empty main well dopant concentration in precursor well 182P, 184BP, or 186AP is at the light n-doping.

N precursor empty main well regions 182P, 184BP, and 186AP do not reach the upper semiconductor surface at this point in the fabrication process. Three isolated surface-adjoining portions 136P1, 136P2, and 136P3 of p− epitaxial layer 136P are thus respectively present in islands 142, 144B, and 146A respectively above n precursor empty main wells 182P, 184BP, and 186AP. Isolated p− epitaxial-layer portion 136P3 also extends laterally over precursor deep n well region 212P. Isolated p− epitaxial-layer portions 136P1-136P3 are all separated from the underlying remainder of epitaxial layer 136P by the combination of field insulation 138 and n-type monosilicon.

The two regions of p− monosilicon formed by segments of (a) isolated epitaxial-layer portion 136P1 in island 142 and (b) the part of isolated epitaxial-layer portion 136P3 overlying n precursor empty main well 186AP in island 146A become n− monosilicon of respective empty main wells 182 and 186A in the final CIGFET structure. In addition, the two regions of p− monosilicon formed by isolated epitaxial portion 136P2 in island 144B and the (non-isolated) part of epitaxial layer 136P situated in island 144A above n precursor empty main well 184BP become n− monosilicon of empty main well 184B in the final CIGFET structure. These four regions of p− monosilicon thus need to be converted to n− monosilicon. As described below, the four p− monosilicon regions are normally converted to n− monosilicon by upward diffusion of part of the n-type empty main well dopant from n precursor empty main well regions 182P, 184BP, and 186AP during subsequent fabrication steps, primarily steps performed at elevated temperature.

A separate n-type doping operation can also be performed to convert the preceding four p− monosilicon regions to n− monosilicon if, for example, there is uncertainty that each of the four p− monosilicon regions would be converted fully to n− monosilicon via upward diffusion of part of the n-type empty main well dopant during subsequent elevated-temperature fabrication steps. Before removing photoresist 930, an n-type semiconductor dopant, referred to as the n-type compensating dopant, can be ion implanted at a low dosage through the uncovered sections of screen oxide 924 and into the underlying monosilicon to convert the four p− monosilicon regions to n− monosilicon.

If it is desired that any of the four p− monosilicon regions not receive the n-type compensating dopant, an additional photoresist mask (not shown) having openings above selected ones of (a) island 142 and (b) the locations for n-type empty main well regions 184B and 186A can be formed on screen oxide layer 924. The n-type compensating dopant is then ion implanted at a low dosage through the openings in the additional photoresist mask and into the semiconductor body after which the additional photoresist is removed. In either case, the dosage of the n-type compensating dopant should generally be as low as reasonable feasible so as to maintain the empty-well nature of final main well regions 182, 184B, and 186A.

A photoresist mask 932 having openings above island 140 for asymmetric n-channel IGFET 100, above the locations for p-type empty main well regions 184A and 186B of extended-drain IGFETs 104 and 106, and above the location for isolating p well region 216 is formed on screen oxide layer 924. See FIG. 14*e*. The edge of photoresist mask 932 that defines the side of empty main well 184A closest to the intended location for n-type empty main well region 184B of IGFET 104 is critically controlled to control separation distance $L_{WW}$ between empty wells 184A and 184B. The edge of photoresist 932 that defines the side of empty main well 186B closest to the intended location for n-type empty main well region 186A of IGFET 106 is critically controlled to control separation distance $L_{WW}$ between empty wells 186A and 186B.

The p-type empty main well dopant is ion implanted at a moderate dosage through the openings in photoresist 932, through the uncovered sections of screen oxide 924, and into vertically corresponding portions of the underlying monosilicon to define (a) a p precursor 180P to empty main well region 180 of IGFET 100, (b) p precursors 184AP and 186BP to respective empty wells 184A and 186B of IGFETs 104 and 106, and (c) a p precursor 216P to isolating p well 216. Photoresist 932 is removed. P precursor empty main well regions 180P and 186BP respectively extend into, but only partway through, precursor deep n well regions 210P and 212P.

The dosage of the p-type empty main well dopant is normally $1\times10^{13}$-$5\times10^{13}$ ions/cm$^2$, typically $2.5\times10^{13}$-$3\times10^{13}$ ions/cm$^2$. The p-type empty main well dopant normally consists of boron in elemental form or in the form of boron difluoride. For the typical case in which elemental boron constitutes the p-type empty main well dopant, the implantation energy is normally 100-225 keV, typically 150-175 keV.

The concentration of the p-type empty main well dopant in p precursor empty main well regions 180P, 184AP, and 186BP reaches respective local maxima along largely the same respective locations as in p-type final empty main well regions 180, 184A, and 186B. The p-type empty main well dopant concentration in each of precursor empty main wells 180P, 184AP, and 186BP varies vertically in roughly a Gaussian manner.

In moving from the location of the p-type empty main well dopant concentration maximum in each of precursor empty main wells 180P, 184AP, and 186BP toward the upper semiconductor surface, the p-type empty main well dopant concentration drops gradually from a moderate doping, indicated by symbol "p", to a light doping, indicated by symbol "p−". Dotted lines 256P, 332P, and 380P in FIG. 14*e* basically constitute respective precursors to dotted lines 256, 332, and 380 in FIG. 11. Although shown in FIG. 11.2, dotted lines 332 and 380 for IGFETs 104 and 106 are, as mentioned above, only labeled in FIGS. 13*a* and 13*b*. Each precursor dotted line 256P, 332P, or 380P therefore roughly represents the location below which the p-type empty main well dopant concentration in corresponding precursor empty main well 180P, 184AP, or 186BP is at the moderate p doping and above which the p-type empty main well dopant concentration in precursor well 180P, 184AP, or 186BP is at the light p-doping.

P precursor empty main well regions 180P, 184AP, and 186BP do not reach the upper semiconductor surface at this point in the fabrication process. Two additional surface-adjoining portions 136P5 and 136P6 of p− epitaxial layer 136P are therefore respectively present in islands 140 and 146B respectively above p precursor empty main wells 180P and 186BP. P-epitaxial-layer portion 136P5 and 136P6 are all separated from the underlying bulk of p- epitaxial layer 136P by the combination of(a) field insulation 138 and (b) moderately doped p-type monosilicon and moderately doped n-type monosilicon. Due to this separation from the underlying bulk of epitaxial layer 136, epitaxial-layer portions 136P5 and 136P6 are referred to here as isolated p- epitaxial-layer portions.

None of the remaining semiconductor dopants introduced into the semiconductor body significantly go into precursor deep n wells 210P and 212P (or into any other precursor deep n well). Since the initial RTA caused the atoms of the deep n well dopant to go into energetically more stable states, precursor deep n wells 210P and 212P are respectively substantially final deep n wells 210 and 212 and are so indicated in the remaining drawings of FIG. 14.

Tilt angle α is approximately 0° for all of the preceding implantations. Each of them is performed at only one value of azimuthal angle β, i.e., each is a single-quadrant implantation, with azimuthal angle β being approximately 0°.

N3. Gate Formation

The upper semiconductor surface is exposed by removing screen oxide layer 924 and cleaned, typically by a wet chemical process. A sacrificial layer (not shown) of silicon oxide is thermally grown along the upper semiconductor surface to prepare the upper semiconductor surface for gate dielectric formation. The thickness of the sacrificial oxide layer is typically at least 10 nm. The sacrificial oxide layer is subsequently removed. The cleaning operation and the formation and removal of the sacrificial oxide layer remove defects and/or contamination along the upper semiconductor surface to produce a high-quality upper semiconductor surface.

A comparatively thick gate-dielectric-containing dielectric layer (not shown) is provided along the upper semiconductor surface. Portions of the thick dielectric layer are at the lateral locations for, and later constitute portions of, the gate dielectric layers at the high gate dielectric thickness $t_{GdH}$, i.e., gate dielectric layers 260 and 300 of asymmetric IGFETs 100 and 102, gate dielectric layers 344 and 384 of extended-drain IGFETs 104 and 106, and the gate dielectric layers of the high-voltage symmetric IGFETs provided by the larger CIGFET fabrication process of U.S. patent application Ser. No. 12/382,973, cited above. To allow for subsequent increase in the thickness of the sections of the thick dielectric layer at the lateral locations for the $t_{GdH}$ high-thickness gate dielectric layers, the thickness of the thick dielectric layer slightly less, typically 0.2 nm less, than the intended $t_{GdH}$ thickness.

The thick dielectric layer is normally thermally grown. The thermal growth is performed in a wet oxidizing environment at 900-1100° C., typically 1000° C., for 30-90 s, typically 45-60 s. The thick dielectric layer normally consists of substantially pure silicon oxide for which the wet oxidizing environment is formed with oxygen and hydrogen.

The high-temperature conditions of the thermal growth of the thick dielectric layer serves as an anneal which repairs lattice damage caused by the implanted p-type and n-type main well dopants and places atoms of the implanted p-type and n-type main well dopants in energetically more stable states. As a result, precursor well region 216P substantially becomes isolating p well region 216. The high temperature of the thermal growth of the thick dielectric layer also causes the p-type and n-type well dopants, especially the main well dopants, to diffuse vertically and laterally. Only the upward diffusion of the empty main well dopants is indicated in the later drawings of FIG. 14. As a result of the upward diffusion of the empty main well dopants, precursor empty main well regions 180P, 182P, 184AP, 184BP, 186AP, and 186BP expand upward toward the upper semiconductor surface.

Precursor empty main wells 180P, 182P, 184AP, 184BP, 186AP, and 186BP may reach the upper semiconductor surface during the thick-dielectric-layer thermal growth if it is sufficiently strong. However, precursor empty wells 180P, 182P, 184AP, 184BP, 186AP, and 186BP typically expand upward only partway to the upper semiconductor surface during the thick-dielectric-layer thermal growth. This situation is illustrated in FIG. 14*f* discussed further below. Due to the upward expansion of precursor empty wells 180P, 182P, 184AP, 184BP, 186AP, and 186BP, isolated p-epitaxial-layer portions 136P1-136P3, 136P5, and 136P6 shrink in size vertically.

A photoresist mask (not shown) having openings above the monosilicon islands for the low-voltage symmetric IGFETs provided by the larger CIGFET fabrication process of U.S. patent application Ser. No. 12/382,973, cited above, is formed on the thick dielectric layer. The uncovered material of the thick dielectric layer is removed to expose the monosilicon islands for those low-voltage symmetric IGFETs. Referring to FIG. 14*f*, item 942R is the remainder of the gate-dielectric-containing thick dielectric layer. The photoresist is removed.

A comparatively thin gate-dielectric-containing dielectric layer (not shown) is provided along the upper semiconductor surface above the islands for the low-voltage symmetric IGFETs and thus at the respective lateral locations for their gate dielectric layers. Portions of the thin dielectric layer later respectively constitute the gate dielectric layers for the low-voltage symmetric IGFETs. The thickness of the thin dielectric layer substantially equals low gate dielectric thickness $t_{GdL}$.

The thin dielectric layer is normally created primarily by thermal growth. Nitrogen is normally incorporated into the thin dielectric layer by a plasma nitridization operation performed primarily for preventing boron in the gate electrodes of the symmetric low-voltage p-channel IGFETs from diffusing into their channel zones.

The thickness of thick gate-dielectric-containing dielectric remainder 942R increases slightly by thermal growth during the thermal growth of the thin dielectric layer. Due to reduced oxygen penetration to the upper surfaces of islands 140, 142, 144A, 144B, 146A, and 146B covered with thick dielectric remainder 942R, the increase in the thickness of dielectric remainder 942R is considerably less than the thickness of the thin dielectric layer. Thick dielectric remainder 942R receives nitrogen during the plasma nitridization operation. At the end of the thermal growth of the thin dielectric layer and the subsequent plasma nitridization, the thickness of thick dielectric remainder 942R substantially equals the $t_{GdH}$ high-thickness gate dielectric thickness value, i.e., normally 4-8 nm, preferably 5-7 nm, typically 6.0-6.5 nm for 3.0-V operation of asymmetric IGFETs 100 and 102.

The high temperature of the thermal growth of the thin dielectric layer acts as an anneal which causes the implanted p-type and n-type well dopants to diffuse further vertically and laterally. Only the upward diffusion of the empty main well dopants during the thick-dielectric-layer and thin-dielectric-layer thermal growths is indicated in FIG. 14*f*.

Precursors 262P, 302P, 346P, and 386P to respective gate electrodes 262, 302, 346, and 386 of IGFETs 100, 102, 104, and 106 are now formed on the partially completed CIGFET structure of FIG. 14*f*. See FIG. 14*g*. More particularly, precursor gate electrodes 262P and 302P for asymmetric IGFETs 100 and 102 are formed on thick gate-dielectric-containing dielectric remainder 942R respectively above selected segments of islands 140 and 142. Precursor gate electrode 346P for extended-drain n-channel IGFET 104 is formed on thick dielectric remainder 942R and part of field-insulation portion 138A so as to overlie a selected segment of island 144A without extending over island 144B. Precursor gate electrode 386P for extended-drain p-channel IGFET 106 is similarly formed on thick dielectric remainder 942R and part of field-insulation portion 138B so as to overlie a selected segment of island 146A without extending over island 146B.

Precursor gate electrodes 262P, 302P, 346P, and 386P are created by depositing a layer of largely undoped (intrinsic) polysilicon on dielectric remainder 942R and then patterning the polysilicon layer using a suitable critical photoresist mask (not shown). Portions (not shown) of the gate-electrode polysilicon layer can be used for polysilicon resistors. Each such resistor portion of the polysilicon layer typically overlies field insulation 138. The thickness of the polysilicon layer is 160-200 nm, typically 180 nm.

The polysilicon layer is patterned so that precursor polysilicon gate electrodes 262P and 302P respectively overlie the intended locations for channel zones 244 and 284 of asymmetric IGFETs 100 and 102. In addition, precursor polysilicon gate electrode 346P for extended-drain n-channel IGFET 104 overlies the intended location for channel zone 322, including the intended location for the channel-zone segment of portion 136A of p- substrate region 136 (see FIG. 13*a*), and extends over the intended location for portion 184B2 of empty main well region 184B partway across field-insulation portion 138A toward the intended location for portion 184B1 of empty main well 184B. Precursor polysilicon gate electrode 386P for extended-drain p-channel IGFET 106 overlies the intended locations for channel zone 362 and portion 136B of p- substrate region 136 (see FIG. 13*b*) and extends over the intended location for portion 186B2 of empty main well region 186B partway across field-insulation portion 138B toward portion 186B1 of empty main well 186B.

The portions of thick dielectric remainder 942R underlying precursor gate electrodes 262P, 302P, 346P, and 386P of IGFETs 100, 102, 104, and 106 respectively constitute their gate dielectric layers 260, 300, 344, and 384. All portions of thick dielectric remainder 942R not covered by precursor gate electrodes, including precursor gate electrodes 262P, 302P, 346P, and 386P, are removed in the course of removing the photoresist used in patterning the polysilicon layer. Segments of islands 140, 142, 144A, 144B, 146A, and 146B situated to the sides of precursor gate electrodes 262P, 302P, 346P, and 386P are thereby exposed.

A thin sealing dielectric layer 946 is thermally grown along the exposed surfaces of precursor gate electrodes 262P, 302P, 346P, and 386P for IGFETs 100, 102, 104, and 106. Again see FIG. 14*g*. A thin dielectric surface layer 948 simultaneously forms along the exposed segments of islands 140, 142, 144A, 144B, 146A, and 146B for IGFETs 100, 102, 104, and 106. The thermal growth of dielectric layers 946 and 948 is performed at 900-1050° C., typically 950-1000° C., for 5-25 s, typically 10 s. Sealing dielectric layer 946 has a thickness of 1-3 nm, typically 2 nm.

The high temperature of the thermal growth of dielectric layers 946 and 948 acts as a further anneal which causes additional vertical and lateral diffusion of the implanted p-type and n-type well dopants. With the thermal growth of dielectric layers 946 and 948 done for a considerably shorter time period than the thermal growth of the gate-dielectric-containing thick dielectric layer, the well dopants diffuse considerably less during the thermal growth of dielectric layers 946 and 948 than during the thick-dielectric-layer thermal growth. None of the additional dopant diffusion caused by the thermal growth of dielectric layers 946 and 948 is indicated in FIG. 14*g*.

FIG. 14*g* illustrates an example in which the top of each of precursor empty main well regions 180P, 182P, 184AP, 184BP, 186AP, and 186BP is below the upper semiconductor surface at the end of the thermal growth of dielectric layers 946 and 948. However, precursor empty main wells 180P, 182P, 184AP, 184BP, 186AP, and 186BP may reach the upper semiconductor by the end of the thermal growth of dielectric layers 946 and 948.

G4. Formation of Source/Drain Extensions and Halo Pocket Portions

A photoresist mask 952 having an opening above the location for drain extension 242E of asymmetric n-channel IGFET 100 is formed on dielectric layers 946 and 948 as shown in FIG. 14*h*. Photoresist mask 952 is critically aligned to precursor gate electrode 262P of IGFET 100. The n-type deep S/D-extension dopant is ion implanted in a significantly angled manner at a high dosage through the opening in photoresist 952, through the uncovered section of surface dielectric 948, and into a vertically corresponding portion of the underlying monosilicon to define an n+ precursor 242EP to drain extension 242E of IGFET 100. Photoresist 952 is removed.

Tilt angle $\alpha$ for the angled n-type deep S/D-extension implantation is at least 15°, normally 20°-45°, typically 30°. As a result, precursor drain extension 242EP of asymmetric IGFET 100 extends significantly laterally below its precursor gate electrode 262P.

The n-type deep S/D-extension implantation is a four-quadrant implant with base azimuthal-angle value $\beta_0$ equal to 20°-25°. The dosage of the n-type deep S/D-extension dopant is normally $2\times10^{13}$-$1\times10^{14}$ ions/cm$^2$, typically $5\times10^{13}$-$6\times10^{13}$ ions/cm$^2$. Approximately one fourth of the n-type deep S/D-extension implant dosage is implanted at each azimuthal-angle value. The n-type deep S/D-extension dopant normally consists of phosphorus or arsenic. For the typical case in which phosphorus constitutes the n-type deep S/D-extension dopant, the implantation energy is normally 15-45 keV, typically 30 keV.

A photoresist mask 954 having openings above the location for source extension 240E of asymmetric n-channel IGFET 100 and above the location for source extension 320E of extended-drain n-channel IGFET 104 is formed on dielectric layers 946 and 948. See FIG. 14*i*. Photoresist mask 954 is critically aligned to precursor gate electrodes 262P and 346P of IGFETs 100 and 104. The n-type shallow source extension dopant is ion implanted at a high dosage through the openings in critical photoresist 954, through the uncovered sections of surface dielectric 948, and into vertically corresponding portions of the underlying monosilicon to define (a) an n+ precursor 240EP to source extension 240E of IGFET 100 and (b) an n+ precursor 320EP to source extension 320E of IGFET 104. Tilt angle $\alpha$ is approximately 7° for the n-type shallow source-extension implantation.

The n-type shallow source-extension dopant is normally arsenic which is of greater atomic weight than phosphorus normally used as the n-type deep S/D-extension dopant. Taking note that precursor source extension 240EP and precursor drain extension 242EP of asymmetric IGFET 100 are respectively defined with the n-type shallow source-extension implantation and the angled n-type deep S/D-extension implantation, the implantation parameters (including the tilt and azimuthal parameters of the n-type deep S/i-extension implantation) of the steps used to perform these two n-type implantations are chosen such that the maximum concentration of the n-type deep S/D-extension dopant in precursor drain extension 242EP is less than, normally no more than one half of, preferably no more than one fourth of, more preferably no more than one tenth of, even more preferably no more than one twentieth of, the maximum concentration of the n-type shallow source-extension dopant in precursor source extension 240EP. Alternatively stated, the maximum concentration of the n-type shallow source-extension dopant in precursor source extension 240EP is significantly greater than, normally at least two times, preferably at least four times, more preferably at least 10 times, even more preferably at least 20 times, the maximum concentration of the n-type deep S/D-extension dopant in precursor drain extension 242EP.

The maximum concentration of the n-type shallow source-extension dopant in precursor source extension 240EP of asymmetric IGFET 100 occurs normally along largely the same location as in final source extension 240E and thus normally along largely the same location as the maximum concentration of the total n-type dopant in source extension 240E. The maximum concentration of the n-type deep S/D-extension dopant in precursor drain extension 242EP of IGFET 100 similarly occurs normally along largely the same location as in final drain extension 242E and thus normally along largely the same location as the maximum concentration of the total n-type dopant in final drain extension 242E.

The energy and other implantation parameters of the n-type shallow source-extension implantation and the n-type deep S/D-extension implantation, including the tilt and azimuthal parameters of the angled n-type deep S/D-extension implantation, are controlled so that the location of the maximum concentration of the n-type deep S/D-extension dopant in precursor drain extension 242EP occurs significantly deeper than the location of the maximum concentration of the n-type shallow source-extension dopant in precursor source extension 240EP. In particular, the location of the maximum concentration of the n-type deep S/D-extension dopant in precursor drain extension 242EP normally occurs at least 10% deeper, preferably at least 20% deeper, more preferably at least 30% deeper, than the location of the maximum concentration of the n-type shallow source-extension dopant in precursor source extension 240EP.

The range needed for the n-type deep S/D-extension implantation is considerably greater than the range needed for the n-type shallow source-extension implantation because (a) the location of the maximum concentration of the n-type deep S/D-extension dopant in precursor drain extension 242EP is deeper than the location of the maximum concentration of the n-type shallow source-extension dopant in precursor source extension 240EP and (b) the n-type deep S/D-extension implantation is performed at a higher value of tilt angle α than the n-type shallow source-extension implantation. As a result, precursor drain extension 242EP extends deeper, normally at least 20% deeper, preferably at least 30% deeper, more preferably at least 50% deeper, even more preferably at least 100% deeper, than precursor source extension 240EP.

With the n-type shallow source-extension implantation being performed nearly perpendicular to a plane extending generally parallel to the upper semiconductor surface (typically at approximately 7° for tilt angle α), precursor source extension 240EP of asymmetric IGFET 100 normally does not extend significantly laterally under precursor gate electrode 262P. Inasmuch as the angled implantation of the n-type deep S/D-extension dopant used to form precursor drain extension 242EP causes it to extend significantly laterally under precursor gate electrode 262P, precursor drain extension 242EP extends significantly further laterally under precursor gate electrode 262P than does precursor source extension 240EP. The amount by which precursor gate electrode 262P overlaps precursor drain extension 242EP therefore significantly exceeds the amount by which precursor gate electrode 262P overlaps precursor source extension 240EP. The overlap of precursor gate electrode 262P on precursor drain extension 242EP is normally at least 10% greater, preferably at least 15% greater, more preferably at least 20% greater, than the overlap of precursor gate electrode 262P on precursor source extension 240EP.

The n-type shallow source-extension implantation is a four-quadrant implant with base azimuthal-angle value $\beta_0$ equal to 20°-25°. Subject to meeting the above conditions for the differences between precursor source extension 240EP and precursor drain extension 242EP of IGFET 100, the dosage of the n-type shallow source-extension dopant is normally $1\times10^{14}$-$1\times10^{15}$ ions/cm$^2$, typically $5\times10^{14}$ ions/cm$^2$. Approximately one fourth of the n-type shallow source-extension implant dosage is implanted at each azimuthal-angle value. For the typical case in which arsenic constitutes the n-type shallow source-extension dopant, the implantation energy is normally 3-15 keV, typically 10 keV.

With critical photoresist mask 954 still in place, the p-type source halo dopant is ion implanted in a significantly angled manner at a moderate dosage through the openings in photoresist 954, through the uncovered sections of surface dielectric layer 948, and into vertically corresponding portions of the underlying monosilicon to define (a) a p precursor 250P to halo pocket portion 250 of asymmetric IGFET 100 and (b) a p precursor 326P to halo pocket portion 326 of extended-drain IGFET 104. See FIG. 14*j*. Photoresist 954 is removed.

P precursor halo pocket portions 250P and 326P respectively extend deeper than n+ precursor source extensions 240EP and 320EP of IGFETs 100 and 104. Due to the angled implantation of the p-type source halo dopant, p precursor halo pocket 250P of IGFET 100 extends laterally partway under its precursor gate electrode 262P and beyond its n+ precursor source extension 240EP. P precursor halo pocket 326P of IGFET 104 similarly extends laterally partway under its precursor gate electrode 346P and beyond its n+ precursor source extension 320EP.

Tilt angle α for the angled p-type source halo implantation is at least 15°, normally 20°-45°, typically 30°. The angled p-type source halo implantation is a four-quadrant implant with base azimuthal-angle value $\beta_0$ equal to approximately 45°. The dosage of the p-type source halo dopant is normally $1\times10^{13}$-$5\times10^{13}$ ions/cm$^2$, typically $2.5\times10^{13}$ ions/cm$^2$. Approximately one fourth of the p-type source halo implant dosage is implanted at each azimuthal-angle value. The p-type source halo dopant normally consists of boron in the form of boron difluoride or in elemental form. For the typical case in which boron in the form of boron difluoride constitutes the p-type source halo dopant, the implantation energy is 50-100 keV, typically 75 keV. The p-type source halo implantation can be performed with photoresist 954 prior to the n-type shallow source extension implantation.

A photoresist mask 958 having an opening above the location for drain extension 282E of asymmetric p-channel IGFET 102 is formed on dielectric layers 946 and 948 as shown in FIG. 14*k*. Photoresist mask 958 is critically aligned to precursor gate electrode 302P of IGFET 102.

The p-type deep S/D-extension dopant is ion implanted in a slightly tilted manner at a high dosage through the opening in photoresist 958, through the uncovered section of surface dielectric 948, and into a vertically corresponding portion of the underlying monosilicon to define a p+ precursor 282EP to drain extension 282E of IGFET 102.

Tilt angle α for the p-type deep S/D-extension implantation is approximately 7°. Due to implantation of the p-type deep S/D-extension dopant at a small value of tilt angle α, precursor drain extension 282EP of asymmetric IGFET 102 extends slightly laterally under its precursor gate electrode 302P. Photoresist 958 is removed.

The p-type S/D-extension implantation can alternatively be performed in a significantly tilted manner, including at a tilt sufficient to constitute angled implantation. In light of this, the arrows representing the p-type S/D-extension implantation in FIG. 14*k* are illustrated as slanted to the vertical but not slanted as much as arrows representing an ion implantation performed in significantly tilted manner such as the n-type deep S/D-extension implantation of FIG. 14*h*.

The p-type deep S/D-extension implantation is a four-quadrant implant with base azimuthal-angle value $\beta_0$ equal to 20°-25°. The dosage of the p-type deep S/D-extension dopant is normally $2\times10^{13}$-$2\times10^{14}$ ions/cm$^2$, typically $8\times10^{13}$ ions/cm$^2$. Approximately one fourth of the p-type deep S/D-extension implant dosage is implanted at each azimuthal-angle value. The p-type deep S/D-extension dopant normally consists of boron in the form of boron difluoride or in elemental form. For the typical case in which boron in the form of boron difluoride constitutes the p-type deep S/D-extension dopant, the implantation energy is normally 5-20 keV, typically 10 keV.

A photoresist mask 960 having openings above the location for source extension 280E of asymmetric p-channel IGFET 102 and above the location for source extension 360E of extended-drain p-channel IGFET 106 is formed on dielectric layers 946 and 948. See FIG. 14*l*. Photoresist mask 960 is critically aligned to precursor gate electrodes 302P and 386P of IGFETs 102 and 106. The p-type shallow source-extension dopant is ion implanted at a high dosage through the openings in critical photoresist 960, through the uncovered sections of surface dielectric 948, and into vertically corresponding portions of the underlying monosilicon to define (a) a p+ precursor 280EP to source extension 280E of IGFET 102 and (b) a p+ precursor 360EP to source extension 360E of IGFET 106.

The p-type shallow source-extension implantation is normally performed with the same p-type dopant, boron, as the slightly tilted p-type deep S/D-extension implantation. These two p-type implantations are also normally performed with the same p-type dopant-containing particle species, either boron difluoride or elemental boron, at the same particle ionization charge state.

The p-type shallow source-extension implantation is a four-quadrant implant with tilt angle $\alpha$ equal to approximately 7° and with base azimuthal-angle value $\beta_0$ equal to 20°-25°. Because the p-type shallow source-extension implantation is thus performed nearly perpendicular to a plane extending generally parallel to the upper semiconductor surface, precursor source extension 280EP of asymmetric p-channel IGFET 102 only extends extend slightly laterally under precursor gate electrode 302P.

The dosage of the p-type shallow source-extension dopant is normally $2\times10^{13}$-$2\times10^{14}$ ions/cm$^2$, typically $8\times10^{13}$ ions/cm$^2$. Approximately one fourth of the p-type shallow source-extension implant dosage is implanted at each azimuthal-angle value. For the typical case in which boron in the form of boron difluoride constitutes the p-type shallow source-extension dopant, the implantation energy is normally 5-20 keV, typically 10 keV.

The p-type deep S/D-extension implantation is also a four-quadrant implant with tilt angle $\alpha$ equal to approximately 7° and with base azimuthal-angle value $\beta_0$ equal to 20°-25°. Examination of the foregoing implantation dosage and energy information indicates that the p-type shallow source-extension implantation and the p-type deep S/D-extension implantation employ the same typical values of implantation dosage and energy. Since these two p-type implantations are normally performed with the same atomic species of p-type semiconductor dopant and with the same p-type dopant-containing particle species at the same particle ionization charge state, the two p-type implantations are typically performed at the same conditions. Consequently, depth $y_{DEPK}$ of the maximum concentration of the p-type deep S/D-extension dopant in precursor drain extension 282EP of asymmetric p-channel IGFET 102 is typically the same as depth $y_{SEPK}$ of the maximum concentration of the p-type shallow source-extension dopant in precursor source extension 280EP.

The p-type implanted deep S/D-extension dopant and the p-type implanted shallow source-extension dopant undergo thermal diffusion during later steps performed at elevated temperature. Thermal diffusion of an ion-implanted semiconductor dopant causes it to spread out but normally does not significantly vertically affect the location of its maximum concentration. The maximum concentration of the p-type shallow source-extension dopant in precursor source extension 280EP of p-channel IGFET 102 thus normally vertically occurs along largely the same location as in final source extension 280E and thus normally vertically occurs along largely the same location as the maximum concentration of the total p-type dopant in source extension 280E. The maximum concentration of the p-type deep S/D-extension dopant in precursor drain extension 282EP of IGFET 102 similarly normally vertically occurs along largely the same location as in final drain extension 282E and thus normally vertically along largely the same location as the maximum concentration of the total p-type dopant in final drain extension 282E. For these reasons, depth $y_{DEPK}$ of the maximum concentration of the p-type deep S/D-extension dopant in final drain extension 282E of IGFET 102 is typically the same as depth $y_{SEPK}$ of the maximum concentration of the p-type shallow source-extension dopant in final source extension 280E.

With critical photoresist mask 960 still in place, the n-type source halo dopant is ion implanted in a significantly angled manner at a moderate dosage through the openings in photoresist 960, through the uncovered sections of surface dielectric layer 948, and into vertically corresponding portions of the underlying monosilicon to define (a) an n precursor 290P to halo pocket portion 290 of asymmetric IGFET 102 and (b) an n precursor 366P to halo pocket portion 366 of extended-drain IGFET 106. See FIG. 14*m*. Photoresist 960 is removed.

N precursor halo pocket portions 290P and 366P respectively extend deeper than p+ precursor source extensions 280EP and 360EP of IGFETs 102 and 106. Due to the angled implantation of the n-type source halo dopant, n precursor halo pocket 290P of IGFET 102 extends laterally partway under its precursor gate electrode 302P and beyond its p+ precursor source extension 280EP. N precursor halo pocket 366P of IGFET 106 similarly extends laterally partway under its precursor gate electrode 386P and beyond its p+ precursor source extension 360EP.

Tilt angle $\alpha$ for the angled n-type source halo implantation is at least 15°, normally 20°-45°, typically 30°. The angled n-type source halo implantation is a four-quadrant implant with base azimuthal-angle value $\beta_0$ equal to approximately 45°. The dosage of the n-type source halo dopant is normally $2\times10^{13}$-$8\times10^{13}$ ions/cm$^2$, typically approximately $4\times10^{13}$ ions/cm$^2$. Approximately one fourth of the n-type source halo implant dosage is implanted at each azimuthal-angle value. The n-type source halo dopant normally consists of arsenic or phosphorus. For the typical case in which arsenic constitutes the n-type source halo dopant, the implantation energy is 75-150 keV, typically 125 keV. The n-type source halo implant can be performed with photoresist 960 prior to the p-type shallow source-extension implant.

Photoresist masks 952, 954, 958, and 960 used for defining lateral S/D extensions and halo pocket portions can be employed in any order. If none of the lateral S/D extensions or halo pocket portions defined by a particular one of photoresist masks 952, 954, 958, and 960 is present in any IGFET made according to an implementation of the semiconductor fabrication process of FIG. 14, that mask and the associated implantation operation(s) can be deleted from the process implementation.

An additional RTA is performed on the resultant semiconductor structure to repair lattice damage caused by the implanted p-type and n-type S/D-extension and halo pocket dopants and to place the atoms of the S/D-extension and halo pocket dopants in energetically more stable states. The additional RTA is performed in a non-reactive environment at 900-1050° C., typically 950-1000° C., for 10-50 s, typically 25 s.

The additional RTA causes the S/D extension and halo pocket dopants to diffuse vertically and laterally. The well dopants, especially the empty main well dopants, diffuse further vertically and laterally during the additional RTA. The remainder of FIG. 14 only indicates the upward diffusion of the empty main well dopants. If precursor empty main well regions 180P, 182P, 184AP, 184BP, 186AP, and 186BP did not reach the upper semiconductor surface by the end of the thermal growth of dielectric layers 946 and 948, precursor empty main well regions 180P, 182P, 184AP, 184BP, 186AP, and 186BP normally reach the upper semiconductor surface by the end of the additional RTA. This situation is indicated in the remainder of FIG. 14.

Isolated p− epitaxial-layer portions 136P1-136P3, 136P5, and 136P6 shrink to zero and do not appear in the remainder of FIG. 14. P− epitaxial layer 136P substantially becomes p− substrate region 136. For extended-drain n-channel IGFET 104, surface-adjoining portion 136A of p− substrate region 136 laterally separates p precursor empty main well region 184AP and n precursor empty main well region 184BP. For extended-drain p-channel IGFET 106, surface-adjoining portion 136B of p− substrate region 136 is situated between n precursor empty main well region 186AP, p precursor empty main well region 186BP, and deep n well 212.

G5. Formation of Gate Sidewall Spacers and Main Portions of Source/Drain Zones

Curved triangular spacers are formed along the transverse sidewalls of precursor polysilicon gate electrodes 262P, 302P, 346P, and 386P. The gate sidewall spacer formation is initiated by depositing a dielectric liner layer of tetraethyl orthosilicate ("TEOS") on dielectric layers 946 and 948. The thickness of the TEOS liner layer is normally 12-18 nm, preferably 13.5-16.5 nm, typically 15 nm. The combination of gate-electrode sealing dielectric layer 946 and the overlying TEOS liner material form a sealing dielectric layer 962 that extends along precursor gate electrodes 262P, 302P, 346P, and 386P. See FIG. 14*n*. The combination of surface dielectric layer 948 and the overlying TEOS liner material form a surface dielectric layer 964 that extends along the upper semiconductor surface.

Referring to FIG. 14*o*, an intermediate dielectric layer 966 of different chemical composition than dielectric layers 962 and 964 is deposited on layers 962 and 964 to a thickness of 25-35 nm, typically 30 nm. Portions of intermediate dielectric layer 966 thereby extend vertically along the portions of sealing dielectric layer 962 extending vertically along the sidewalls of precursor gate electrodes 262P, 302P, 346P, and 386P. Intermediate dielectric layer 966 typically consists of silicon nitride deposited at 630-650° C., typically 640-645° C., for 15-35 min., typically 20-30 min.

An upper layer 968 of different chemical composition than intermediate dielectric layer 966 is deposited on dielectric layer 966 to a thickness of 80-120nm, typically 100 nm. Upper layer 968 is normally formed with dielectric material, typically TEOS deposited at 670-690° C., typically 680° C., for 20-40 min., typically 30 min.

An anisotropic etch is performed to remove all of upper layer 968 except for curved triangular portions extending along the vertically extending portions of intermediate dielectric layer 966. See FIG. 14*p*. Items SC in FIG. 14*p* are the remaining curved triangular portions of upper layer 968 extending (a) along the vertically extending portions of intermediate dielectric layer 966 that extend along the vertically extending portions of sealing dielectric layer 962 along the source-side and drain-side lateral sides of precursor gate electrodes 262P, 302P, 346P,and 386P and (b) along the laterally extending portions of intermediate dielectric layer 966 that extend along the laterally extending portions of surface dielectric layer 964. The anisotropic etch is conducted substantially perpendicular to the upper semiconductor surface with a plasma, typically tetrafluoromethane ($CF_4$) trifluoromethane ($CHF_3$), and argon when upper layer 968 consists of TEOS.

An etch is performed to remove the exposed portions of intermediate dielectric layer 966, i.e., the portion of layer 966 not covered with source-side/drain-side curved triangular upper-layer portions SC and the other remaining curved triangular portions (not shown) of upper layer 968. See FIG. 14*q*. As a result, a pair of curved triangular spacers 264T and 266T extend along the source-side and drain-side lateral sides of precursor gate electrode 262P of asymmetric n-channel IGFET 100. A pair of curved triangular spacers 304T and 306T similarly extend along the source-side and drain-side lateral sides of precursor gate electrode 302P of asymmetric p-channel IGFET 102. A pair of curved triangular spacers 348T and 350T extend along the source-side and drain-side lateral sides of precursor gate electrode 346P of extended-drain n-channel IGFET 104. A pair of curved triangular spacers 388T and 390T extend along the source-side and drain-side lateral sides of precursor gate electrode 386P of extended-drain p-channel IGFET 106.

L-shaped second spacer layers SB constitute the portions of intermediate dielectric layer 966 directly underlying curved triangular upper-layer portions SC. L-shaped first spacer layers SA constitute the portions of dielectric layers 962 and 964 underlying L-shaped second spacer layers SB. Each curved triangular spacer 264T, 266T, 304T, 306T, 348T, 350T, 388T, or 390T thereby consists of (a) one of curved triangular upper-layer portions SC, (b) second spacer dielectric layer SB underlying that curved triangular portion SC, and (c) first spacer dielectric layer SA underlying that second spacer layer SB. Each curved triangular upper-layer portion SC is thus a filler spacer portion which largely occupies the space between (i) a vertically extending dielectric spacer portion formed by vertically adjoining vertically extending segments of spacer layers SA and SB situated along one side of precursor gate electrode 262P, 302P, 346P, or 386P and (ii) a laterally extending dielectric spacer portion continuous with the vertically extending dielectric spacer portion and formed by laterally adjoining laterally extending segments of spacer layers SA and SB extending along the upper semiconductor surface.

A photoresist mask 970 having openings above islands 140, 144A, and 144B for n-channel IGFETs 100 and 104 is formed on dielectric layers 962 and 964 and curved triangular gate sidewall spacers 304T, 306T, 388T, and 390T as indicated in FIG. 14*r*. The n-type main S/D dopant is ion implanted at a very high dosage through the openings in photoresist 970, through the uncovered sections of surface dielectric layer 964, and into vertically corresponding portions of the underlying monosilicon to define (a) n++ main source portion 240M and n++ main drain portion 242M of asymmetric n-channel IGFET 100 and (b) n++ main source portion 320M and n++ drain contact portion 334 of extended-drain n-channel IGFET 104.

Precursor gate electrodes 262P and 346P and curved triangular spacers 264T, 266T, 348T, and 350T serve as a dopant-blocking shield during the n-type main S/D implantation for preventing the n-type main S/D dopant from entering underlying monosilicon material intended to be channel zones 244 and 322 of n-channel IGFETs 100 and 104. Importantly, the n-type main S/D implant is performed with curved triangular portions SC of spacers 264T, 266T, 348T, and 350T present in the dopant-blocking shield. This substantially reduces the amount of n-type main S/D dopant that would otherwise pass through the laterally extending portions of layers SB and SA of spacers 264T, 266T, 348T, and 350T and enter monosilicon material intended to be channel zones 244 and 322. The n-type main S/D dopant also enters precursor gate electrodes 262P and 346P of n-channel IGFETs 100 and 104, thereby converting precursor electrodes 262P and 346P respectively into n++ gate electrodes 262 and 346. Photoresist 970 is removed.

The dosage of the n-type main S/D dopant is normally $2\times10^{15}$-$2\times10^{16}$ ions/cm$^2$, typically $7\times10^{15}$ ions/cm$^2$. The n-type main S/D dopant normally consists of arsenic or phosphorus. For the typical case in which arsenic constitutes the n-type main S/D dopant, the implantation energy is normally 50-100 keV, typically 60-70 keV.

An initial spike anneal is normally performed on the resultant semiconductor structure at this point to repair lattice damage caused by the implanted n-type main S/D dopant and to place the atoms of the n-type main S/D dopant in energetically more stable states. The spike anneal is done by raising the temperature of the semiconductor structure to 1000-1200° C., typically 1100° C. Significant diffusion of the implanted p-type and n-type dopants normally occurs during the initial spike anneal because the spike-anneal temperature is quite high. The spike anneal also causes the n-type main S/D dopant in gate electrodes 262 and 346 of n-channel IGFETs 100 and 104 to spread out.

With the initial spike anneal completed, the portions of precursor regions 240EP, 242EP, and 250P outside n++ main S/D portions 240M and 242M of asymmetric n-channel IGFET 100 now respectively substantially constitute its n+source extension 240E, its n+ drain extension 242E, and its p source-side halo pocket portion 250. The portion of p precursor empty main well region 180P, now p-type empty-well body material 180, outside source 240, drain 242, and halo pocket portion 250 substantially constitutes p-type empty-well main body-material portion 254 of IGFET 100. Precursor dotted line 256P is now substantially dotted line 256 which demarcates generally where the p-type doping in main body-material portion 254 drops from moderate to light in moving upward.

The portions of precursor regions 320EP and 326P outside n++ main source portion 320M of extended-drain n-channel IGFET 104 respectively substantially constitute its n+ source extension 320E and its p source-side halo pocket portion 326. The portion of p precursor empty main well region 184AP, now p-type empty-well body material 184A, outside halo pocket portion 326 substantially constitutes p body-material portion 328 of IGFET 104. The portion of n precursor empty main well region 184BP, now drain 184B, outside n++ external drain contact portion 334 substantially constitutes n empty-well drain portion 336 of IGFET 104. Precursor dotted lines 332P and 340P are now substantially respective dotted lines 332 and 340 which respectively demarcate generally where the net dopings in body-material portion 328 and drain portion 336 drop from moderate to light in moving upward.

The source-body and drain-body junctions of n-channel IGFETs 100 and 104 can be vertically graded to reduce the junction capacitances by implanting n-type semiconductor dopant, referred to here as the n-type junction-grading dopant, through the openings in photoresist mask 970 while it is in place. The n-type junction-grading dopant is implanted at a greater range and a lower dosage that the n-type main S/D dopant. Either the n-type main or junction-grading S/D implantation can be performed first. In either case, the initial spike anneal also repairs lattice damage caused by the implanted n-type junction-grading S/D dopant and places the atoms of the n-type junction-grading S/D dopant in energetically more stable states.

A photoresist mask 972 having openings above islands 142, 146A, and 146B for p-channel IGFETs 102 and 106 is formed on dielectric layers 962 and 964 and gate sidewall spacers 264T, 266T, 348T, and 350T as indicated in FIG. 14*s*. The p-type main S/D dopant is ion implanted at a very high dosage through the openings in photoresist 972, through the uncovered sections of surface dielectric layer 964 and into vertically corresponding portions of the underlying monosilicon to define (a) p++ main source portion 280M and p++ main drain portion 282M of asymmetric p-channel IGFET 102 and (b) p++ main source portion 360M and p++ drain contact portion 374 of extended-drain p-channel IGFET 106.

Precursor gate electrodes 302P and 386P and curved triangular spacers 304T, 306T, 388T, and 390T serve as a dopant-blocking shield during the p-type main S/D implantation for preventing the p-type main S/D dopant from entering underlying monosilicon material intended to be channel zones 284 and 362 of p-channel IGFETs 102 and 106. The p-type main S/D implant is performed with curved triangular portions SC of spacers 304T, 306T, 388T, and 390T present in the dopant-blocking shield. This substantially reduces the amount of p-type main S/D dopant that would otherwise pass through the laterally extending portions of layers SB and SA of spacers 304T, 306T, 388T, and 390T and enter monosilicon material intended to be channel zones 284 and 362. The p-type main S/D dopant also enters precursor gate electrodes 302P and 386P of p-channel IGFETs 102 and 106. Precursor electrodes 302P and 386P are thereby respectively converted into p++ gate electrodes 302 and 386. Photoresist 972 is removed.

The dosage of the p-type main S/D dopant is normally $2\times10^{15}$-$2\times10^{16}$ ions/cm$^2$, typically approximately $7\times10^{15}$ ions/cm$^2$. The p-type main S/D dopant normally consists of boron in elemental form or in the form of boron difluoride. For the typical case in which the p-type main S/D dopant is elemental boron, the implantation energy is normally 2-10 keV, typically 5 keV.

Any portion of the gate-electrode polysilicon layer designated to be a polysilicon resistor is typically doped with n-type or p-type semiconductor dopant during one or more of the above-mentioned doping steps performed subsequent to deposition of the gate-electrode polysilicon layer. For instance, a polysilicon resistor portion can be doped with the n-type main S/D dopant or the p-type main S/D dopant.

A further spike anneal is now performed on the resultant semiconductor structure to repair lattice damage caused by the implanted p-type main S/D dopant and to place the atoms of the p-type main S/D dopant in energetically more stable states. The further spike anneal is done by raising the temperature of the semiconductor structure to 900-1200° C., typically 1100° C. Significant diffusion of the implanted p-type and n-type dopants normally occurs during the further spike anneal because the further spike-anneal temperature is quite high. The further spike anneal also causes the p-type main S/D dopant in gate electrodes 302 and 386 of p-channel IGFETs 102 and 106 to spread out.

The atoms of the element (arsenic or phosphorus) used as the n-type main S/D dopant are larger than the atoms of boron, the element used as the p-type main S/D dopant. Consequently, the n-type main S/D implant is likely to cause more lattice damage than the boron p-type main S/D implant. To the extent that the initial spike anneal performed directly after the n-type main S/D implantation does not repair all the lattice damage caused by the n-type main S/D implant, the further spike anneal repairs the reminder of the lattice damage caused by the n-type main S/D implant. Additionally, boron diffuses faster, and thus farther for a given amount of elevated-temperature diffusion impetus, than either element used as the n-type main S/D dopant. By performing the p-type main S/D implant and associated spike anneal after performing the n-type main S/D implant and associated spike anneal, undesired diffusion of the p-type main S/D dopant is avoided without incurring significant undesired diffusion of the n-type main S/D dopant.

Upon completion of the further spike anneal, the portions of precursor regions 280EP, 282EP, and 290P outside p++ main S/D portions 280M and 282M of asymmetric p-channel IGFET 102 respectively constitute its p+ source extension 280E, its p+ drain extension 282E, and its n source-side halo pocket portion 290. The portion of n precursor empty main well region 182P, now n-type empty-well body material 182, outside source 280, drain 282, and halo pocket portion 290 constitutes n-type empty-well main body-material portion 294 of IGFET 102. Precursor dotted line 296P is now dotted line 296 which demarcates generally where the n-type doping in main body-material portion 294 drops from moderate to light in moving upward.

The portions of precursor regions 360EP and 366P outside p++ main source portion 360M of extended-drain p-channel IGFET 106 respectively constitute its p+ source extension 360E and its n source-side halo pocket portion 366. The portion of n precursor empty main well region 186AP, now n-type empty-well body material 186A, outside halo pocket portion 366 constitutes n body-material portion 368 of IGFET 106. The portion of p precursor empty main well region 186BP, now empty well region 186B, outside p++ external drain contact portion 374 constitutes p empty-well drain portion 376 of IGFET 106. Precursor dotted lines 372P and 380P are now respective dotted lines 372 and 380 which respectively demarcate where the net dopings in body-material portion 368 and drain portion 376 drop from moderate to light in moving upward.

The source-body and drain-body junctions of p-channel IGFETs 102 and 106 can be vertically graded to reduce the junction capacitances by implanting p-type semiconductor dopant, referred to here as the p-type junction-grading dopant, through the openings in photoresist mask 972 while it is in place. The p-type junction-grading dopant is implanted at a greater range and a lower dosage that the p-type main S/D dopant. Either the p-type main or junction-grading S/D implantation can be performed first. In either case, the further spike anneal also repairs lattice damage caused by the implanted p-type junction-grading S/D dopant and places the atoms of the p-type junction-grading S/D dopant in energetically more stable states. FIG. 14*t* illustrates the semiconductor structure at this point with each of spacers 264T, 266T, 304T, 306T, 348T, 350T, 388T, and 390T being or curved triangular shape.

G6. Final Processing

An etch is performed to remove the exposed parts of dielectric layers 962 and 964, i.e., the parts not covered by curved triangular spacers 264T, 266T, 304T, 306T, 348T, 350T, 388T, and 390T. If the semiconductor structure includes one or more polysilicon resistors, a capping layer (not shown) of dielectric material, typically silicon oxide, is formed on top of the structure. In any event, a final anneal, typically an RTA, is now performed on the semiconductor structure to obtain the desired final dopant distributions and repair any residual lattice damage.

Using (as necessary) a suitable photoresist mask (not shown), the capping material is removed from selected areas of the structure. In particular, the capping material is removed from the areas above islands 180, 182, 184A, 184B, 186A, and 186B for IGFETs 100, 102, 104, and 106 to expose gate electrodes 262, 302, 346, and 386 and to expose main source portions 240M and 280M of asymmetric IGFETs 100 and 102, main drain portions 242M and 282M of IGFETs 100 and 102, main source portions 320M and 360M of extended-drain IGFETs 104 and 106, and drain contact portions 334 and 374 of IGFETs 104 and 106. The capping material is typically retained over most of any portion of the gate-electrode polysilicon layer designated to be a polysilicon resistor so as to prevent metal silicide from being formed along the so-capped part of the polysilicon portion during the next operation.

Curved triangular portions SC of gate sidewall spacers 264T, 266T, 304T, 306T, 348T, 350T, 388T, and 390T are removed, typically in the course of removing material of the capping layer. See FIG. 14*u*. Each curved triangular spacer 264T, 266T, 304T, 306T, 348T, 350T, 388T, or 390T is thereby converted into L-shaped gate sidewall dielectric spacer 264, 266, 304, 306, 348, 350, 388, or 390 consisting of a first dielectric layer SA and an overlying second dielectric layer SB.

Metal silicide layers 268, 270, 272, 308, 310, 312, 352, 354, 356, 392, 394, and 396 of IGFETs 100, 102, 104, and 106 are respectively formed along the upper surfaces of the underlying polysilicon and monosilicon regions as the first step in making electrical contacts to IGFETs 100, 102, 104, and 106. The metal silicide formation typically entails depositing a thin layer of suitable metal, typically cobalt, on the upper surface of the structure and performing a low-temperature step to react the metal with underlying silicon. The unreacted metal is removed. A second low-temperature step is performed to complete the reaction of the metal with the underlying silicon and thereby form metal silicide layers 268, 270, 272, 308, 310, 312, 352, 354, 356, 392, 394, and 396. Importantly, the absence of curved triangular spacer portions SC during the metal silicide formation facilitates the metal silicide formation.

The metal silicide formation completes the basic fabrication of IGFETs 100, 102, 104, and 106. The resultant CIGFET structure appears as shown in FIG. 11. The CIGFET structure is subsequently provided with further electrically conductive material (nor shown), typically metal, which contacts metal silicide layers 268, 270, 272, 308, 310, 312, 352, 354, 356, 392, 394, and 396 to complete the electrical contacts for IGFETs 100, 102, 104, and 106.

G7. Advantages of Spacer Shaping Sequence

As mentioned above, boron is typically the p-type main S/D dopant in the ion implantation for defining main source portions 280M and 360M of IGFETs 102 and 106 at the stage of FIG. 14*s* when final L-shaped gate sidewall spacers 304, 306, 388, and 390 are in their respective earlier curved triangular forms 304T, 306T, 388T, and 390T that contain curved triangular filler spacer portions SC. Arsenic is typically used as the n-type source halo dopant in the ion implantation for defining precursor halo pocket portions 290P and 366P of p-channel IGFETs 102 and 106 at the earlier stage of FIG. 14*m*.

Ion implantation of a semiconductor dopant into semiconductor material damages the semiconductor lattice and introduces crystal defects. Because arsenic is a larger atom than boron, arsenic implantation generally causes more lattice damage than boron implantation at the same implantation range. Also, boron generally diffuses relatively fast, especially compared to arsenic.

If spacers 304T, 306T, 388T, and 390T were in the L shapes of final spacers 304, 306, 388, and 390 during the p-type main S/D implantation with boron at the stage of FIG. 14*s*, some of the boron might pass through the laterally extending portions of spacer layers SA and SB and into monosilicon intended to be, and/or close to monosilicon intended to be, channel zones 284 and 362 of p-channel IGFETs 102 and 106. Due to the lattice damage caused by the arsenic implantation at the earlier n-type source halo implantation stage of FIG. 14*m*, some of the boron p-type main S/D dopant might penetrate undesirably far into semiconductor material intended to be channel zones 284 and 362 during later elevated-temperature steps. In other words, the lattice damage caused by the arsenic n-type source halo implantation could undesirably enhance diffusion of the boron p-type main S/D dopant. The enhanced boron diffusion would degrade the characteristics of IGFETs 102 and 106, e.g., by undesirably shortening their channel zones 284 and 362.

In the fabrication process of FIG. 14, the p-type main S/D implantation at the stage of FIG. 14*s* is performed while gate sidewall spacers 304, 306, 388, and 390 are in their respective earlier curved triangular forms 304T, 306T, 388T, and 390T. Filler spacer portions SC of curved triangular spacers 304T, 306T, 388T, and 390T act as implantation shields that block the boron p-type main S/D dopant from entering monosilicon intended to be, and/or from entering monosilicon close to the intended locations of, channel zones 284 and 362 of p-channel IGFETs 102 and 106. The amount of boron p-type main S/D dopant entering semiconductor material intended to be channel zones 284 and 362 is greatly reduced. IGFET degradation which could otherwise result from the boron p-type main S/D dopant in semiconductor material intended to be channel zones 284 and 362 and which would otherwise be increased due to ion implantation of the arsenic n-type source halo dopant is significantly reduced.

Filler spacer portions SC are, as described above, removed from curved triangular spacers 304T, 306T, 388T, and 390T subsequent to the p-type main S/D implantation but prior to forming electrical contacts to p-channel IGFETs 102 and 106. Because filler spacer portions SC are absent during the formation of the electrical contacts to IGFETs 102 and 106, filler spacer portions do not impede the formation of electrical contacts. Accordingly, it is easier to make the electrical contacts, especially metal silicide layers 310 and 312 along main source portion 280M and main drain portion 282M of IGFET 102 and metal silicide layers 394 and 396 along main source portion 360M and drain contact portion 374 of IGFET 106. This enables the IGFET packing density to be increased.

H. Variations

While the invention has been described with reference to particular embodiments, this description is solely for the purpose of illustration and is not to be construed as limiting the scope of the invention claimed below. For instance, silicon in the semiconductor body or/and in gate electrodes can be replaced with other semiconductor materials. Replacement candidates include germanium, a silicon-germanium alloy, and Group 3a-Group 5a alloys such as gallium arsenide. The composite gate electrodes formed with the doped polysilicon gate electrodes and the respectively overlying metal silicide layers can be replaced with gate electrodes consisting substantially fully of refractory metal or substantially fully of metal silicide, e.g., cobalt silicide, nickel silicide, or platinum silicide, with dopant provided in the silicide gate electrodes to control their work functions.

Polysilicon is a type of non-monocrystalline silicon ("non-monosilicon"). The gate electrodes have been described above as preferably consisting of doped polysilicon. Alternatively, the gate electrodes can consist of another type of doped non-monosilicon such as doped amorphous silicon or doped multicrystalline silicon. Even when the gate electrodes consist of doped polysilicon, the precursors to the gate electrodes can be deposited as amorphous silicon or another type of non-monosilicon other than polysilicon. The elevated temperatures during the elevated-temperature steps following the deposition of the precursor gate electrodes cause the silicon in the gate electrodes to be converted to polysilicon.

The gate dielectric layers of IGFETs 100, 102, 104, and 106 can alternatively be formed with materials, such as hafnium oxide, of high dielectric constant. In that event, the $t_{GdL}$ low and $t_{GdH}$ high values of gate dielectric thickness are typically somewhat higher.

In an alternative where the n-type deep S/D-extension dopant is the same n-type dopant as the n-type shallow source-extension dopant, an anneal may be optionally performed between (i) the stage of FIG. 14*h* for the n-type deep S/D-extension implantation and (ii) the stage of FIG. 14*i* for the n-type shallow source-extension implantation in order to cause the n-type deep S/D-extension dopant to diffuse without causing the n-type shallow source-extension dopant to diffuse because its implantation has not yet been performed.

Any of the variations described in U.S. patent application Ser. No. 12/382,973, cited above, for IGFETs 100, 102, 104, and 106 can be applied to the configuration and fabrication of the present CIGFET structure. Various modifications may thus be made by those skilled in the art without departing from the true scope of the invention as defined in the appended claims.

We claim:

1. A method of fabricating a structure comprising a field-effect transistor from a semiconductor body having body material of a first conductivity type, the method comprising:

defining a gate electrode above, and vertically separated by a gate dielectric layer from, a portion of the body material intended to be a channel zone such that the gate electrode has opposing first and second lateral sides;

introducing pocket semiconductor dopant of the first conductivity type into the body material to define a precursor pocket portion of the body material more heavily doped than laterally adjacent material of the body material and substantially extending below only the first of the gate electrode's lateral sides using the gate electrode and any material along its lateral sides as a dopant-blocking shield;

providing a first spacer along the gate electrode's first lateral side such that the first spacer comprises (i) a first vertically extending dielectric spacer portion situated along the gate electrode, (ii) a first laterally extending dielectric spacer portion continuous with the first vertically extending spacer portion and situated along the semiconductor body, and (iii) a first filler spacer portion largely occupying the space between the first vertically and laterally extending spacer portions;

subsequently introducing main source/drain ("S/D") semiconductor dopant of a second conductivity type opposite to the first conductivity type into the semiconductor body to define first and second main S/D portions of the second conductivity type using the gate electrode, the first spacer, and any other material along the gate electrode's lateral sides as a dopant-blocking shield such that (i) the channel zone is situated between the main S/D portions and (ii) a further pocket portion of the first conductivity type comprises material of at least part of the precursor pocket portion and extends to the first main S/D portion for causing the channel zone to be longitudinally asymmetric;

subsequently largely removing the first filler spacer portion; and forming a pair of electrical contacts respectively to the main S/D portions.

2. A method as in claim 1 further including, between the gate-electrode-defining and spacer-providing acts, introducing first S/D-extension semiconductor dopant of the second conductivity type into the semiconductor body to define a precursor first lateral S/D extension of the second conductivity type using the gate electrode and any material along its lateral sides as a dopant-blocking shield such that, upon completion of fabrication of the structure, (i) a first S/D zone of the second conductivity type comprises the first main S/D portion and a laterally adjoining further first lateral S/D extension more lightly doped than the first main S/D portion and comprised of material of at least part of the precursor first S/D extension and (ii) the further first S/D extension extends laterally partially below the gate electrode.

3. A method as in claim 2 wherein:

the method further includes, between the gate-electrode-defining and spacer-providing acts, introducing second S/D-extension semiconductor dopant of the second conductivity type into the semiconductor body to define a precursor second lateral S/D extension of the second conductivity type using the gate electrode and any material along its lateral sides as a dopant-blocking shield;

the spacer-providing act includes providing a second spacer along the gate electrode's second lateral side such that the second spacer comprises (i) a second vertically extending dielectric spacer portion situated along the gate electrode, (ii) a second laterally extending dielectric spacer portion continuous with the second vertically extending spacer portion and situated along the semiconductor body, and (iii) a second filler spacer portion largely occupying the space between the second vertically and laterally extending spacer portions; and the filler-spacer-portion-removing act includes removing the second filler spacer portion such that, upon completion of fabrication of the structure, (i) a second S/D zone of the second conductivity type comprises the second main S/D portion and a laterally adjoining further second lateral S/D extension more lightly doped than the second main S/D portion and comprised of material of at least part of the precursor second S/D extension, (ii) the further second S/D extension extends laterally partially below the gate electrode, and (iii) the channel zone is terminated by the further S/D extensions along the gate dielectric layer.

4. A method as in claim 2 further including, prior to the spacer-providing act, introducing first well semiconductor dopant of the first conductivity type and second well semiconductor dopant of the second conductivity type into the semiconductor body to respectively define first and second well regions respectively of the first and second conductivity types such the well dopants have respective concentrations which reach respective maximum concentrations respectively inside the well regions at a pair of respective laterally extending subsurface locations spaced laterally apart from each other such that, upon completion of fabrication of the structure, (i) the first S/D zone is situated above the subsurface location of the maximum concentration of the first well region, (ii) a second S/D zone of the second conductivity type comprises the second main S/D portion and adjoining material of the second well region outside the second main S/D portion, (iii) the channel zone laterally separates the S/D zones, and (iv) a well-separating portion of the semiconductor body separates the well regions and is more lightly doped than each well region.

5. A method of fabricating a structure comprising a field-effect transistor from a semiconductor body having body material of a first conductivity type, the method comprising:

defining a gate electrode above, and vertically separated by a gate dielectric layer from, a portion of the body material intended to be a channel zone such that the gate electrode has opposite source-side and drain-side lateral sides;

introducing pocket semiconductor dopant of the first conductivity type into the body material to define a precursor source-side pocket portion of the body material more heavily doped than laterally adjacent material of the body material and substantially extending below only the source-side one of the gate electrode's lateral sides using the gate electrode and any material along its lateral sides as a dopant-blocking shield;

providing a source-side spacer along the gate electrode's source-side lateral side such that the source-side spacer comprises (i) a source-side vertically extending dielectric spacer portion situated along the gate electrode, (ii) a source-side laterally extending dielectric spacer portion continuous with the source-side vertically extending spacer portion and situated along the semiconductor body, and (iii) a source-side filler spacer portion largely occupying the space between the source-side vertically and laterally extending spacer portions;

subsequently introducing main source/drain ("S/D") semiconductor dopant of a second conductivity type opposite to the first conductivity type into the semiconductor body to define main source and drain portions of the second conductivity type using the gate electrode, the source-side spacer, and any other material along the gate electrode's lateral sides as a dopant-blocking mask for largely preventing the main S/D dopant from entering the channel zone such that (i) the channel zone is situated between the main source and drain portions and (ii) a further source-side pocket portion of the first conductivity type comprises material of at least part of the precursor source-side pocket portion and extends to the main source portion for causing the channel zone to be longitudinally asymmetric;

subsequently largely removing the source-side filler spacer portion; and forming a pair of electrical contacts respectively to the main source and drain portions.

6. A method as in claim 5 further including, between the gate-electrode-defining and spacer-providing acts, introducing source-extension semiconductor dopant of the second conductivity type into the semiconductor body to define a precursor lateral source extension of the second conductivity type using the gate electrode and any material along its lateral sides as a dopant-blocking shield for largely preventing the source-extension dopant from passing through the gate dielectric layer such that, upon completion of fabrication of the structure, (i) a source of the first conductivity type comprises the main source portion and a laterally adjoining further lateral source extension more lightly doped than the main source portion and comprised of material of at least part of the precursor source extension and (ii) the further source extension extends laterally partially below the gate electrode.

7. A method as in claim 6 wherein:

the method further includes, between the gate-electrode-defining and spacer-providing acts, introducing drain-extension semiconductor dopant of the second conductivity type into the semiconductor body to define a precursor lateral drain extension of the second conductivity type using the gate electrode and any material along its lateral sides as a dopant-blocking shield for largely preventing the drain-extension dopant from passing through the gate dielectric layer;

the spacer-providing act includes providing a drain-side spacer along the gate electrode's drain-side lateral side such that the drain-side spacer comprises (i) a drain-side vertically extending dielectric spacer portion situated along the gate electrode, (ii) a drain-side laterally extending dielectric spacer portion continuous with the drain-side vertically extending spacer portion and situated along the semiconductor body, and (iii) a drain-side filler spacer portion largely occupying the space between the drain-side vertically and laterally extending spacer portions; and the filler-spacer-portion-removing act includes removing the drain-side filler spacer portion such that, upon completion of fabrication of the structure, (i) a drain of the second conductivity type comprises the main drain portion and a laterally adjoining further lateral drain extension more lightly doped than the main drain portion and comprised of material of at least part of the precursor drain extension, (ii) the further drain extension extends laterally partially below the gate electrode, and (iii) the channel zone is terminated by the further lateral extensions along the gate dielectric layer.

8. A method as in claim 7 wherein:

the source-extension and pocket dopants are both introduced into the semiconductor body through an opening in a first mask; and the drain-extension dopant is introduced into the semiconductor body through an opening in a second mask different from the first mask.

9. A method as in claim 7 wherein the drain-extension dopant is introduced into the semiconductor body so as to reach a maximum subsurface concentration at a greater average depth into the semiconductor body than the source-extension dopant.

10. A method as in claim 7 wherein the drain-extension-dopant-introducing act comprises implanting ions of a species of the drain-extension dopant at an average tilt angle of at least 15° relative to a direction generally perpendicular to the gate dielectric layer.

11. A method as in claim 7 wherein the pocket-dopant-introducing act comprises implanting ions of a species of the pocket dopant at an average tilt angle of at least 15° relative to a direction generally perpendicular to the gate dielectric layer.

12. A method as in claim 7 wherein:

the method further includes, prior to the gate-electrode-defining act, introducing primary semiconductor dopant of the first conductivity type into the body material; and, upon completion of fabrication of the structure, (i) the semiconductor body has an upper surface, (ii) the body material forms respective pn junctions with the source and drain and extends laterally below both the source and drain, (iii) part of the primary dopant of the first conductivity type is present in the source and drain, (iv) each pn junction reaches a maximum depth below the body's upper surface, (v) the primary dopant of the first conductivity type has a concentration which locally reaches a subsurface maximum concentration at a subsurface body-material location extending laterally below largely all of each of the channel zone, source, and drain and which decreases by at least a factor of 10 in moving upward from the subsurface body-material location along a selected vertical location through the drain to the body's upper surface, and (vi) the subsurface body-material location occurs no more than 10 times deeper below the body's upper surface than the maximum depth of the pn junction for the drain.

13. A method as in claim 7 wherein:

the main-S/D-dopant-introducing act comprises introducing the main S/D dopant into the semiconductor body at a first dosage and to a first average depth into the semiconductor body; and the method further includes, between the spacer-providing and filler-spacer-portion-removing acts, introducing lower-portion S/D semiconductor dopant of the second conductivity type into the semiconductor body at a second dosage and to a second average depth into the semiconductor body, the first dosage being greater than the second dosage, the second average depth being greater than the first average depth such that (i) the source includes a lower source portion of the second conductivity type underlying, continuous with, and more lightly doped than the main source portion and (ii) the drain includes a lower drain portion of the second conductivity type underlying, continuous with, and more lightly doped than the main drain portion.

14. A method as in claim 6 further including, prior to the spacer-providing act, introducing first well semiconductor dopant of the first conductivity type and second well semiconductor dopant of the second conductivity type into the semiconductor body to respectively define first and second well regions respectively of the first and second conductivity types such that, upon completion of fabrication of the structure, (i) the well dopants have respective concentrations which reach respective subsurface maximum concentrations respectively inside the well regions at a pair of respective laterally extending subsurface locations spaced laterally apart from each other, (ii) the source is situated above the subsurface location of the maximum concentration of the first well region, (iii) the channel zone comprises part of the first well region, (iv) a drain of the second conductivity type comprises the second main drain portion and adjoining material of the second well region outside the second main drain portion, (v) the channel zone laterally separates the source and drain, and (vi) a well-separating portion of the semiconductor body separates the well regions and is more lightly doped than each well region.

15. A method as in claim 14 further including, prior to the gate-electrode-defining act, forming an electrically insulating region recessed into the semiconductor body along its upper surface such that, upon completion of fabrication of the structure, the recessed insulating region extends into second well region to laterally surround the main drain portion and laterally separate it from material of the second well region continuous with the well-separating portion and such that the gate electrode extends over the recessed insulating region partway to the main drain portion.

16. A method as in claim 14 wherein the pocket-dopant-introducing act comprises implanting ions of a species of the pocket dopant at an average tilt angle of at least 15° relative to a direction generally perpendicular to the gate dielectric layer.

17. A method as in claim 14 wherein the well-separating portion is of the first conductivity type and extends to the gate dielectric layer such that the channel zone includes at least part of the well-separating portion.

18. A method as in claim 14 wherein the well-separating portion comprises a lower section of the first conductivity type and an upper section of the second conductivity type situated between the lower section and the gate dielectric layer such that the drain further includes at least part of the upper section of the well-separating portion.

19. A method as in claim 14 wherein, upon completion of fabrication of the structure, all semiconductor dopant of the second conductivity type in the second well region has a concentration which decreases by at least a factor of 10 in moving upward from the subsurface location of the maximum concentration of the second well region along a selected vertical location through the second well region to the gate dielectric layer, the subsurface location of the maximum concentration of the second well region occurring no more than 10 times deeper below a plane extending along the bottom of the gate dielectric layer than the maximum depth to which the source extends below that plane.

20. A method as in claim 19 wherein all semiconductor dopant of the first conductivity type in the first well region has a concentration which decreases by at least a factor of 10 in moving upward from the subsurface location of the maximum concentration of the first well region along a selected vertical location through the first well region to the gate dielectric layer, the subsurface location of the maximum concentration of the first well region occurring no more than 10 times deeper below the plane extending along the bottom of the gate dielectric layer than the maximum depth to which the source extends below that plane.

21. A method as in claim 6 wherein the transistor is a p-channel transistor.

22. A method as in claim 21 wherein:

the pocket-dopant-introducing act comprises ion implanting a species of the pocket dopant into the semiconductor body; and the pocket dopant comprises arsenic.

23. A method as in claim 6 wherein the contacts-forming act comprises reacting metal with semiconductor material of the source and drain to form a contact layer of a metal-semiconductor compound along remaining material of each of the source and drain.

24. A method as in claim 6 wherein the source-side filler spacer portion consists largely of dielectric material.

25. A method as in claim 6 wherein:

the vertically extending portion of the source-side spacer comprises a first vertically extending layer and a second vertically extending layer chemically different from the first vertically extending layer such that the first vertically extending layer is situated between the gate electrode and the second vertically extending layer; and the laterally extending portion of the source-side spacer comprises a first laterally extending layer and a second laterally extending layer chemically different from the first laterally extending layer such that the first laterally extending layer is situated between the semiconductor body and the second laterally extending layer.

26. A method as in claim 25 wherein:

the first layers of the source-side spacer comprise semiconductor oxide; and the second layers of the source-side spacer comprise semiconductor nitride.

27. A method of fabricating a structure comprising a field-effect transistor from a semiconductor body having body material of a first conductivity type, the transistor having first and second source/drain ("S/D") zones of a second conductivity type opposite to the first conductivity type, the first and second S/D zones respectively comprising first and second main S/D portions, the method comprising:

defining a gate electrode above, and vertically separated by a gate dielectric layer from, a portion of the body material intended to be a channel zone such that the gate electrode has opposing first and second lateral sides;

introducing pocket semiconductor dopant of the first conductivity type into the body material to define a precursor pocket portion of the body material more heavily doped than laterally adjacent material of the body material and substantially extending below only the first of the gate electrode's lateral sides using the gate electrode and any material along its lateral sides as a dopant-blocking shield;

providing a first spacer along the gate electrode's first lateral side such that the first spacer comprises (i) a first vertically extending dielectric spacer portion situated along the gate electrode, (ii) a first laterally extending dielectric spacer portion continuous with the first vertically extending spacer portion and situated along the semiconductor body, and (iii) a first filler spacer portion largely occupying the space between the first vertically and laterally extending spacer portions;

subsequently introducing main S/D semiconductor dopant of the second conductivity type into the semiconductor body to define the first and second main S/D portions using the gate electrode, the first spacer, and any other material along the gate electrode's lateral sides as a dopant-blocking shield such that (i) the channel zone is situated between the S/D zones and (ii) a further pocket portion of the first conductivity type comprises material of at least part of the precursor pocket portion and extends to the first S/D zone for causing the channel zone to be longitudinally asymmetric;

subsequently largely removing the first filler spacer portion; and forming a pair of electrical contacts respectively to the main S/D portions.

28. A method as in claim 27 further including, between the gate-electrode-defining and spacer-providing acts, introducing first S/D-extension semiconductor dopant of the second conductivity type into the semiconductor body to define a precursor first lateral S/D extension of the second conductivity type using the gate electrode and any material along its lateral sides as a dopant-blocking shield such that, upon completion of fabrication of the structure, (i) the first S/D zone includes a further first lateral S/D extension laterally adjoining, and more lightly doped than, the first main S/D portion and comprised of material of at least part of the precursor first S/D extension and (ii) the further first S/D extension extends laterally partially below the gate electrode.

29. A method as in claim 28 wherein:

the method further includes, between the gate-electrode-defining and spacer-providing acts, introducing second S/D-extension semiconductor dopant of the second conductivity type into the semiconductor body to define a precursor second lateral S/D extension of the second conductivity type using the gate electrode and any material along its lateral sides as a dopant-blocking shield;

the spacer-providing act includes providing a second spacer along the gate electrode's second lateral side such that the second spacer comprises (i) a second vertically extending dielectric spacer portion situated along the gate electrode, (ii) a second laterally extending dielectric spacer portion continuous with the second vertically extending spacer portion and situated along the semiconductor body, and (iii) a second filler spacer portion largely occupying the space between the second vertically and laterally extending spacer portions; and the filler-spacer-portion-removing act includes removing the second filler spacer portion such that, upon completion of fabrication of the structure, (i) the second S/D zone includes a further second lateral S/D extension laterally adjoining, and more lightly doped than, the second main S/D portion and comprised of material of at least part of the precursor second S/D extension, (ii) the further second S/D extension extends laterally partially below the gate electrode, and (iii) the channel zone is terminated by the further S/D extensions along the gate dielectric layer.

30. A method as in claim 28 further including, prior to the spacer-providing act, introducing first well semiconductor dopant of the first conductivity type and second well semiconductor dopant of the second conductivity type into the semiconductor body to respectively define first and second well regions respectively of the first and second conductivity types such the well dopants have respective concentrations which reach respective maximum concentrations respectively inside the well regions at a pair of respective laterally extending subsurface locations spaced laterally apart from each other such that, upon completion of fabrication of the structure, (i) the first S/D zone is situated above the subsurface location of the maximum concentration of the first well region, (ii) the second S/D zone includes material of the second well region outside the second main S/D portion, (iii) the channel zone laterally separates the S/D zones, and (iv) a well-separating portion of the semiconductor body separates the well regions and is more lightly doped than each well region.

31. A method of fabricating a structure comprising a field-effect transistor from a semiconductor body having body material of a first conductivity type, the transistor having a source and a drain of a second conductivity type opposite to the first conductivity type, the source and drain respectively comprising a main source portion and a main drain portion, the method comprising:

defining a gate electrode above, and vertically separated by a gate dielectric layer from, a portion of the body material intended to be a channel zone such that the gate electrode has opposite source-side and drain-side lateral sides;

introducing pocket semiconductor dopant of the first conductivity type into the body material to define a precursor source-side pocket portion of the body material more heavily doped than laterally adjacent material of the body material and substantially extending below only the source-side one of the gate electrode's lateral sides using the gate electrode and any material along its lateral sides as a dopant-blocking shield;

providing a source-side spacer along the gate electrode's source-side lateral side such that the source-side spacer comprises (i) a source-side vertically extending dielectric spacer portion situated along the gate electrode, (ii) a source-side laterally extending dielectric spacer portion continuous with the source-side vertically extending spacer portion and situated along the semiconductor body, and (iii) a source-side filler spacer portion largely occupying the space between the source-side vertically and laterally extending spacer portions;

subsequently introducing main source/drain ("S/D") semiconductor dopant of the second conductivity type into the semiconductor body to define the main source and drain portions using the gate electrode, the source-side spacer, and any other material along the gate electrode's lateral sides as a dopant-blocking mask for largely preventing the main S/D dopant from entering the channel zone such that (i) the channel zone is situated between the source and drain and (ii) a further source-side pocket portion of the first conductivity type comprises material of at least part of the precursor source-side pocket portion and extends to the source for causing the channel zone to be longitudinally asymmetric;

subsequently largely removing the source-side filler spacer portion; and forming a pair of electrical contacts respectively to the source and drain.

32. A method as in claim 31 further including, between the gate-electrode-defining and spacer-providing acts, introducing source-extension semiconductor dopant of the second conductivity type into the semiconductor body to define a precursor lateral source extension of the second conductivity type using the gate electrode and any material along its lateral sides as a dopant-blocking shield for largely preventing the source-extension dopant from passing through the gate dielectric layer such that, upon completion of fabrication of the structure, (i) the source includes a further lateral source extension laterally adjoining, and more lightly doped than, the main source portion and comprised of material of at least part of the precursor source extension and (ii) the further source extension extends laterally partially below the gate electrode.

33. A method as in claim 32 wherein:

the method further includes, between the gate-electrode-defining and spacer-providing acts, introducing drain-extension semiconductor dopant of the second conductivity type into the semiconductor body to define a precursor lateral drain extension of the second conductivity type using the gate electrode and any material along its lateral sides as a dopant-blocking shield for largely preventing the drain-extension dopant from passing through the gate dielectric layer;

the spacer-providing act includes providing a drain-side spacer along the gate electrode's drain-side lateral side such that the drain-side spacer comprises (i) a drain-side vertically extending dielectric spacer portion situated along the gate electrode, (ii) a drain-side laterally extending dielectric spacer portion continuous with the drain-side vertically extending spacer portion and situated along the semiconductor body, and (iii) a drain-side filler spacer portion largely occupying the space between the drain-side vertically and laterally extending spacer portions; and the filler-spacer-portion-removing act includes removing the drain-side filler spacer portion such that, upon completion of fabrication of the structure, (i) the drain includes a further lateral drain extension laterally adjoining, and more lightly doped than, the main drain portion and comprised of material of at least part of the precursor drain extension, (ii) the further drain extension extends laterally partially below the gate electrode, and (iii) the channel zone is terminated by the further lateral extensions along the gate dielectric layer.

34. A method as in claim 33 wherein:

the method further includes, prior to the gate-electrode-defining act, introducing primary semiconductor dopant of the first conductivity type into the body material; and, upon completion of fabrication of the structure, (i) the semiconductor body has an upper surface, (ii) the body material forms respective pn junctions with the source and drain and extends laterally below both the source and drain, (iii) part of the primary dopant of the first conductivity type is present in the source and drain, (iv) each pn junction reaches a maximum depth below the body's upper surface, (v) the primary dopant of the first conductivity type has a concentration which locally reaches a subsurface maximum concentration at a subsurface body-material location extending laterally below largely all of each of the channel zone, source, and drain and which decreases by at least a factor of 10 in moving upward from the subsurface body-material location along a selected vertical location through the drain to the body's upper surface, and (vi) the subsurface body-material location occurs no more than 10 times deeper below the body's upper surface than the maximum depth of the pn junction for the drain.

35. A method as in claim 32 further including, prior to the spacer-providing act, introducing first well semiconductor dopant of the first conductivity type and second well semiconductor dopant of the second conductivity type into the semiconductor body to respectively define first and second well regions respectively of the first and second conductivity types such that, upon completion of fabrication of the structure, (i) the well dopants have respective concentrations which reach respective subsurface maximum concentrations respectively inside the well regions at a pair of respective laterally extending subsurface locations spaced laterally apart from each other, (ii) the source is situated above the subsurface location of the maximum concentration of the first well region, (iii) the channel zone comprises part of the first well region, (iv) the drain includes material of the second well region outside the second main drain portion, (v) the channel zone laterally separates the source and drain, and (vi) a well-separating portion of the semiconductor body separates the well regions and is more lightly doped than each well region.

36. A method as in claim 35 further including, prior to the gate-electrode-defining act, forming an electrically insulating region recessed into the semiconductor body along its upper surface such that, upon completion of fabrication of the structure, the recessed insulating region extends into second well region to laterally surround the main drain portion and laterally separate it from material of the second well region continuous with the well-separating portion and such that the gate electrode extends over the recessed insulating region partway to the main drain portion.

37. A method as in claim 35 wherein the well-separating portion is of the first conductivity type and extends to the gate dielectric layer such that the channel zone includes at least part of the well-separating portion.

38. A method as in claim 35 wherein the well-separating portion comprises a lower section of the first conductivity type and an upper section of the second conductivity type situated between the lower section and the gate dielectric layer such that the drain further includes at least part of the upper section of the well-separating portion.

39. A method as in claim 35 wherein, upon completion of fabrication of the structure, all semiconductor dopant of the second conductivity type in the second well region has a concentration which decreases by at least a factor of 10 in moving upward from the subsurface location of the maximum concentration of the second well region along a selected vertical location through the second well region to the gate dielectric layer, the subsurface location of the maximum concentration of the second well region occurring no more than 10 times deeper below a plane extending along the bottom of the gate dielectric layer than the maximum depth to which the source extends below that plane.

40. A method as in claim 39 wherein all semiconductor dopant of the first conductivity type in the first well region has a concentration which decreases by at least a factor of 10 in moving upward from the subsurface location of the maximum concentration of the first well region along a selected vertical location through the first well region to the gate dielectric layer, the subsurface location of the maximum concentration of the first well region occurring no more than 10 times deeper below the plane extending along the bottom of the dielectric layer than the maximum depth to which the source extends below that plane.

41. A method as in claim 32 wherein the transistor is a p-channel transistor.

42. A method as in claim 32 wherein the contacts-forming act comprises reacting metal with semiconductor material of the source and drain to form a contact layer of a metal-semiconductor compound along remaining material of each of the source and drain.

43. A method as in claim 32 wherein:

the vertically extending portion of the source-side spacer comprises a first vertically extending layer and a second vertically extending layer chemically different from the first vertically extending layer such that the first vertically extending layer is situated between the gate electrode and the second vertically extending layer; and the laterally extending portion of the source-side spacer comprises a first laterally extending layer and a second laterally extending layer chemically different from the first laterally extending layer such that the first laterally extending layer is situated between the semiconductor body and the second laterally extending layer.

44. A method as in claim 43 wherein:

the first layers of the source-side spacer comprise semiconductor oxide; and the second layers of the source-side spacer comprise semiconductor nitride.

* * * * *